(12) United States Patent
Suzuki

(10) Patent No.: US 6,541,805 B1
(45) Date of Patent: Apr. 1, 2003

(54) SOLID-STATE IMAGE PICKUP DEVICE

(75) Inventor: Nobuo Suzuki, Kurokawa-gun (JP)

(73) Assignee: Fuji Photo Film Co., Ltd., Minami-Ashigara (JP)

( * ) Notice: Subject to any disclaimer, the term of this patent is extended or adjusted under 35 U.S.C. 154(b) by 263 days.

(21) Appl. No.: 09/680,964

(22) Filed: Oct. 6, 2000

(30) Foreign Application Priority Data

Oct. 7, 1999 (JP) .......................................... 11-287334

(51) Int. Cl.[7] ........................ H01L 27/148; H04N 5/335

(52) U.S. Cl. ...................... 257/232; 257/241; 257/249; 348/320; 348/322

(58) Field of Search ................................ 257/222, 223, 257/224, 232, 241, 243, 249; 348/302, 305, 311, 322, 320

(56) References Cited

U.S. PATENT DOCUMENTS

| | | | |
|---|---|---|---|
| 5,446,493 A | * | 8/1995 | Endo et al. .................. 348/320 |
| 6,388,278 B1 | * | 5/2002 | Suzuki et al. ............... 257/222 |

* cited by examiner

*Primary Examiner*—Minh Loan Tran
(74) *Attorney, Agent, or Firm*—Arent Fox Kintner Plotkin & Kahn, PLLC

(57) ABSTRACT

In the production of an IT-CCD including many photoelectric converters in columns and rows, vertical transfer CCDs for transferring signal charge accumulated in the photoelectric converters to a horizontal transfer CCD, and readout gate regions to control, for each photoelectric converter, readout operation of signal charge from the photoelectric converters to the vertical charge transfer CCDs; one joining channel is formed for each set of two vertical transfer CCDs to combine the CCDs with each other and hence a high-pixel-density solid-state image pickup device can be implemented using ordinary fine patterning technique.

13 Claims, 26 Drawing Sheets

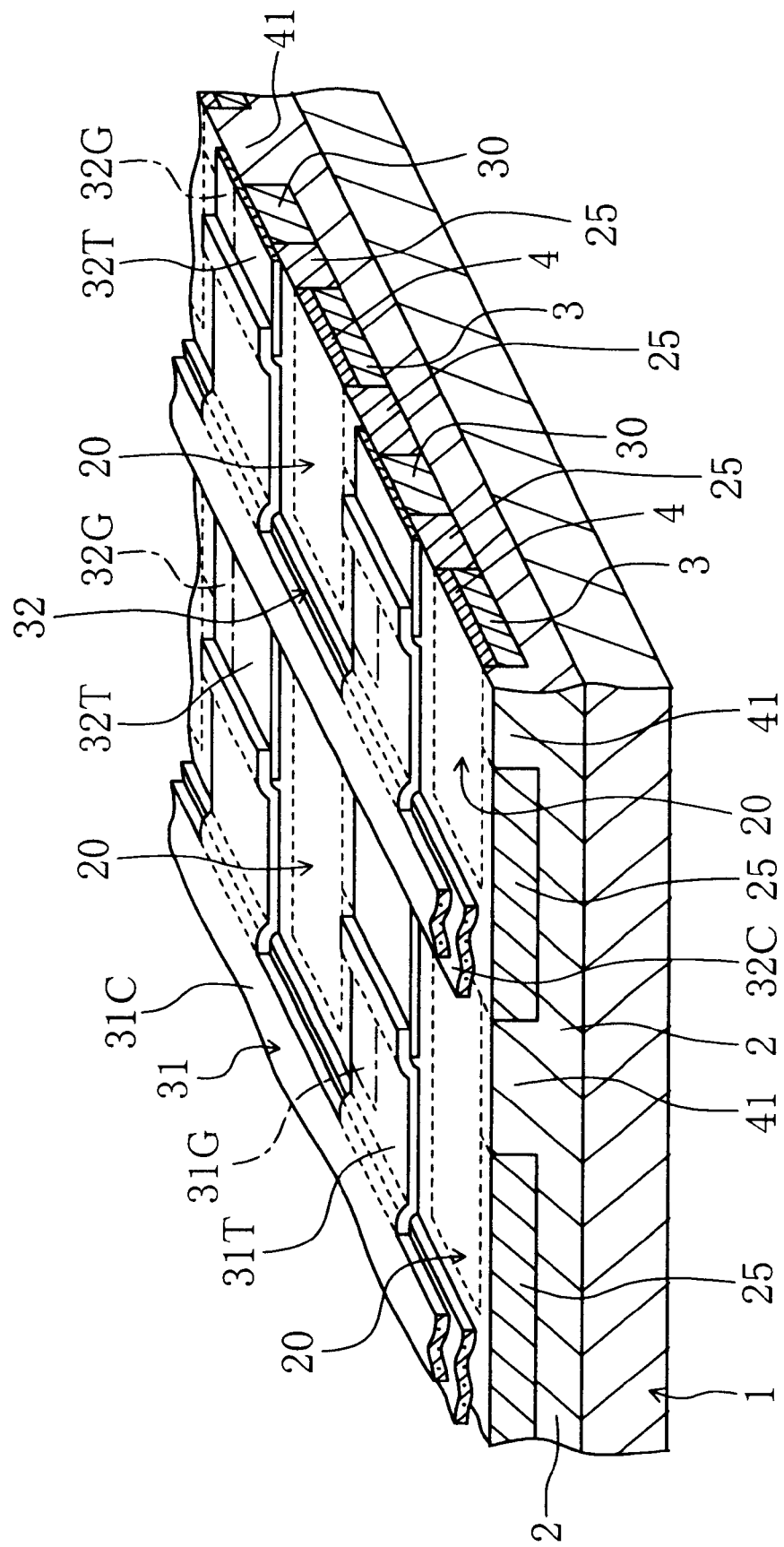

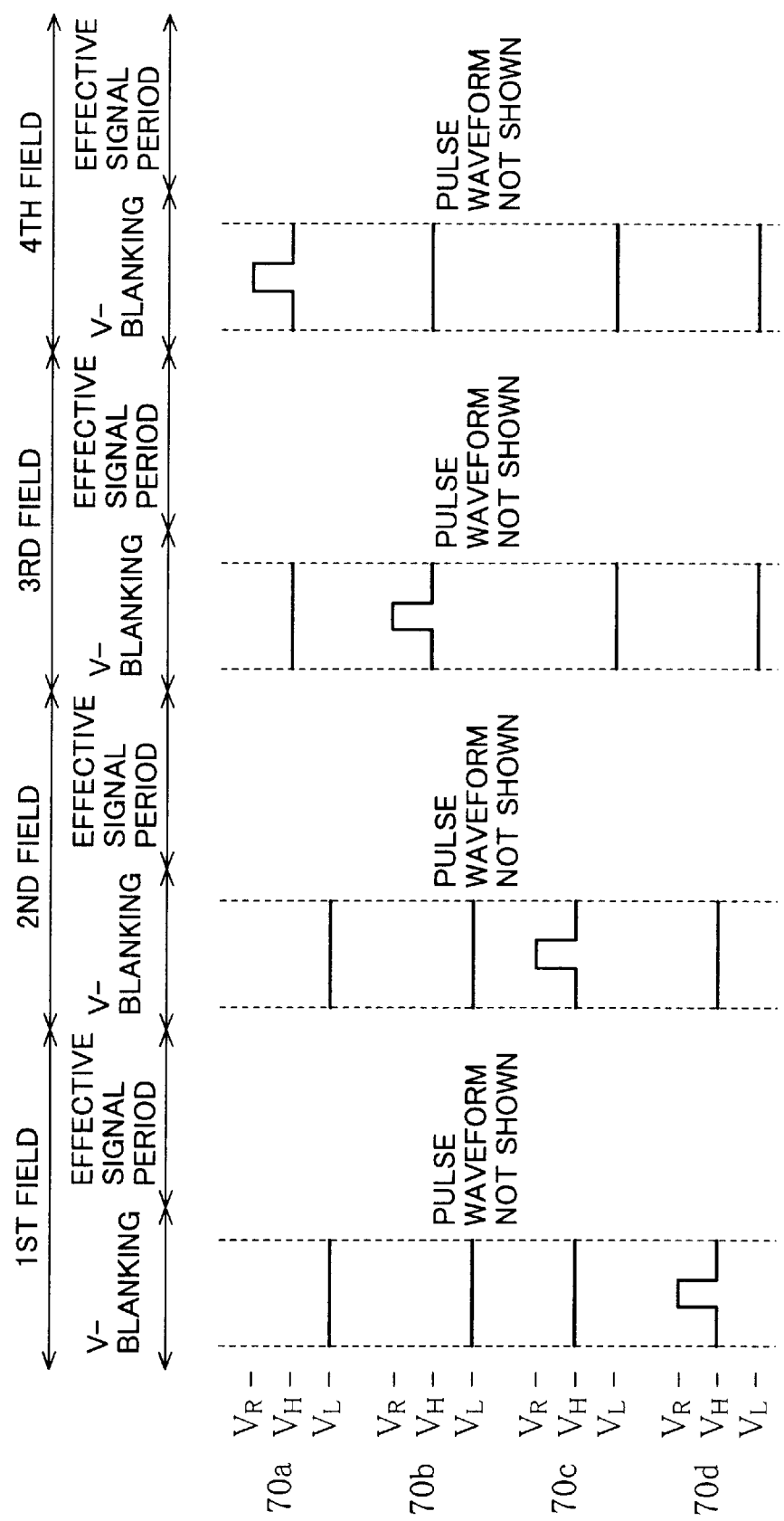

SOLID-STATE IMAGE PICKUP DEVICE

This application is based on Japanese Patent Application HEI 11-287334 filed on Oct. 7, 1999, the entire contents of which are incorporated herein by reference.

BACKGROUND OF THE INVENTION a) Field of the Invention

The present invention relates to a solid-state image pickup device serving as an area image sensor and a method of driving the same, and in particular, to a solid-state image pickup device of interline transfer type including a plurality of photoelectric converter columns and a plurality of vertical transfer charge-coupled devices (CCD) and a method of driving the same.

b) Description of the Related Art

After mass production techniques for CCD have been established, video cameras, electronic still cameras, and the like using a CCD-type solid-state image pickup device serving as an area image sensor are rapidly coming into wide use. The CCD-type solid-state image pickup devices are classified by structure into several kinds, for example, a solid-state image pickup device of interline transfer type (to be abbreviated as "IT-CCD" herebelow).

An IT-CCD includes a semiconductor substrate and a large number of photoelectric converter elements or simply photoelectric converters arranged on a surface of the substrate in columns and rows with a fixed pitch. Each of the photoelectric converter columns and rows includes a plurality of photoelectric converters. Each photoelectric converter ordinarily is a photodiode.

A photoelectric converter being composed of a pn photodiode is produced as follows. A p-type well is formed on a desired surface of, for example, a semiconductor substrate and then an n-type region having a desired contour is formed in the p-type well. When necessary, a $p^+$-type region is formed on the n-type region. Signal charge is stored or accumulated in the n-type region. That is, the n-type region functions as a signal charge storing or accumulating region.

In this specification, a term "photoelectric converter (element)" indicates only the signal charge storing region in some cases. Also, "adjacent to a photoelectric converter" means "adjacent to a signal charge storing region constituting a photoelectric converter", and "contiguous to a photoelectric converter" means "contiguous to a signal charge storing region constituting a photoelectric converter".

Adjacent to each photoelectric converter column, one charge transfer channel is formed. An IT-CCD therefore includes a plurality of charge transfer channels. Each charge transfer channel is used to transfer signal charge accumulated in each photoelectric converter of the photoelectric converter column adjacent to the charge transfer channel.

On the surface of the semiconductor substrate, a plurality of transfer electrodes is formed with an electrically insulating film therebetween. The electrodes intersect the charge transfer channels in a plan view. Each intersection between the transfer electrodes and the charge transfer channels in the plan view serves as one charge transfer stage. That is, one charge transfer channel and a plurality of charge electrodes constitute one vertical charge CCD.

In this specification, a region constituting the charge transfer stage in each transfer electrode of the vertical transfer CCD is called "transfer path forming section".

Each vertical transfer CCD of an IT-CCD of interlace drive type usually includes two charge transfer stages for one photoelectric converter. Each vertical transfer CCD of an IT-CCD of overall pixel readout type usually includes three or four charge transfer stages for one photoelectric converter. One IT-CCD includes vertical transfer CCDs as many as there are photoelectric converter columns formed in the IT-CCD.

Each photoelectric converter accumulates therein signal charge by achieving photoelectric conversion. The signal charge accumulated in the photoelectric converter is read out to an associated charge transfer channel at a predetermined point of time.

To control the operation to read signal charge from the photoelectric converter to the charge transfer channel, a readout gate region is formed for each photoelectric converter being contiguous thereto on the surface of the semiconductor substrate. The readout gate region is ordinarily constituted of a region of a conductivity type opposite to those of a photoelectric converter and a charge transfer channel. Each readout gate region is contiguous also to a predetermined section of a charge transfer channel corresponding to the photoelectric converter.

On each readout gate region, a readout gate electrode zone is formed. Each readout gate electrode zone is ordinarily constituted of part of a transfer path forming section of a predetermined transfer electrode constituting a vertical transfer CCD.

Signal charge read out to each charge transfer channel is transferred to an output transfer path by each vertical transfer CCD including the charge transfer channel. The output transfer path is ordinarily composed of a CCD (to be called "horizontal CCD" in some cases herebelow).

The output transfer path being composed of a horizontal transfer CCD includes of N charge transfer stages for one vertical transfer CCD. One charge transfer stage ordinarily includes one potential barrier region and one potential well region, and N is two. When each charge transfer stage has a uniform potential, N is three or more.

The output transfer path sequentially transfers the received signal charge in a longitudinal direction (to be referred to as "row direction" herebelow) of the photoelectric converter row to an output unit. Like the vertical transfer CCD, the output transfer path is formed also in the semiconductor substrate.

The vertical and horizontal transfer CCDs each have a function of photoelectric conversion like the photodiode. To prevent unnecessary photoelectric conversion in the vertical and horizontal transfer CCDs, a light shielding film is formed in an area ranging from a light sensing section with the photoelectric converters to the horizontal transfer CCD. The light shielding film has an opening of a predetermined contour on each photoelectric converter (photodiode). One opening is disposed for one photoelectric converter. The opening is ordinarily within a signal charge accumulating region of the photoelectric converter in a plan view.

One photoelectric converter, one readout gate region formed contiguous to the photoelectric converter, one readout gate electrode zone covering the readout gate region in a plan view, and two to four charge transfer stages (of the vertical transfer CCD) corresponding to the photoelectric converter constitute one pixel. In a surface of each photoelectric converter, an exposed section thereof in the opening in a plan view serves as a light receiving section of the pixel.

Therefore, in the IT-CCD, a contour in a plan view of each opening formed in the light shielding film and an area of the opening in a plan view substantially determine a contour and an area of the light receiving section of each pixel, respectively.

With development of use of the IT-CCD, improvement in performance such as resolution and sensitivity of the IT-CCD has been desired.

The resolution of the IT-CCD strongly depends on density of pixels in the IT-CCD. The resolution can be more easily increased when the pixel density becomes higher. The sensitivity of the IT-CCD strongly depends on an area of the light receiving section of each pixel. The resolution can be more easily increased when the area of each pixel becomes larger.

Japanese Patent Publication Ser. No. 2825702 describes an IT-CCD (referred to as "solid-state image pickup device" in the publication and as "IT-CCD" in this specification). As known, by the IT-CCD, the pixel density can be increased while suppressing the reduction in the area of the light receiving section of each pixel.

The IT-CCD includes a plurality of photoelectric converters formed with a fixed pitch in columns and rows. Each of the photoelectric converter columns and rows includes a plurality of photoelectric converters. Each photoelectric converter in even photoelectric converter columns is shifted in a direction of the column relative to associated ones of said photoelectric converters of the odd photoelectric converter columns by about one half of a pitch of the photoelectric converters of each photoelectric converter column. Similarly, each photoelectric converter in even photoelectric converter rows is shifted in a direction of the row relative to associated ones of said photoelectric converters of odd photoelectric converter columns by about one half of a pitch of the photoelectric converters of each photoelectric converter row. Each photoelectric converter column includes photoelectric converters of only odd or even photoelectric converter rows.

To transfer signal charge accumulated in each photoelectric converter, one vertical transfer CCD is disposed for each photoelectric converter column adjacent thereto. Each vertical transfer CCD includes a plurality of transfer electrodes which are formed in generally a honeycomb layout. For each of a hexagonal gap or region created by arranging a plurality of transfer electrodes in a honeycomb layout, one photoelectric converter is disposed in the hexagonal region in a plan view.

Each vertical transfer CCD is used to transfer signal charge accumulated in the photoelectric converters of one photoelectric converter column adjacent to the vertical transfer CCD. Each vertical transfer CCD transfers the signal charge in a predetermined (vertical) direction through a locally meandering path.

In the IT-CCD of the Japanese Patent Publication, by disposing a large number of photoelectric converters and a plurality of transfer electrodes (a plurality of transfer electrodes for the vertical transfer CCDs) in this way, the pixel density can be increased while preventing decrease in the area of the light receiving section of each pixel.

In this specification, the arrangement of the photoelectric converters will be referred to as "shifted-pixel layout" herebelow.

For example, when a 200-million-pixel IT-CCD of 1/2 type using the shifted-pixel layout is employed as an IT-CCD for an electronic still camera, the pixel pitch is about 2.8 micrometers ($\mu$m) in the row direction $D_H$. When a 200-million-pixel IT-CCD of 1/3 type using the shifted-pixel layout is used as an IT-CCD for an electronic still camera, the pixel pitch is about 2.1 $\mu$m in the row direction $D_H$.

In many cases, vertical transfer CCDs are driven by four-phase signals and horizontal transfer CCDs are driven by two-phase signals.

In an IT-CCD including vertical transfer CCDs using CCDs of four-phase drive type and a horizontal CCD using CCD of two-phase drive type, it is relatively easy to form pixels with 2.1-$\mu$m pitch in the row direction $D_H$. However, the horizontal transfer CCD of the IT-CCD includes four electrodes for each pixel column. That is, four transfer electrodes are formed in a 2.1-$\mu$m long region. Each transfer electrode has a width of about 0.5 $\mu$m in this case.

Therefore, to produce an IT-CCD having the horizontal transfer CCD, although the chip size can be minimized, highly sophisticated ultra fine patterning techniques are necessary.

Since the horizontal transfer CCD has four transfer electrodes for each pixel column, each pulse supply terminal to supply driving pulses to the horizontal transfer CCD has large load electrostatic capacity.

In a high-resolution IT-CCD with 200 million pixels or more, to increase the readout frame frequency, the horizontal transfer CCD is to be driven by high-speed driving pulses of about 20 MHz in ordinary cases.

This resultantly increases the consumption power of the horizontal transfer CCD to, for example, about several tens of mill watts (mW). Therefore, in an electronic still camera with batteries loaded thereon, the large power consumption shortens the life of batteries.

SUMMARY OF THE INVENTION

It is therefore an object of the present invention to provide an IT-CCD and a method of driving the same in which the pixel density can be easily increased using ordinary fine patterning technique and the increase in the consumption power can be readily suppressed.

According to one aspect of the present invention, there is provided a solid-state image pickup device, comprising: a semiconductor substrate; a light sensing section defined on a surface of said semiconductor substrate; a large number of photoelectric converter elements formed in said light sensing section in a plurality of rows and in a plurality of columns; a charge transfer channel formed for each said photoelectric converter element column adjacent thereto on the surface of said semiconductor substrate, said charge transfer channel intersecting said light sensing section in a predetermined direction in a plan view; a plurality of transfer electrodes formed on said light sensing section, each said transfer electrode including a plurality of transfer path forming sections equal in number to said charge transfer channels, each said transfer path forming section intersecting an associated one of said charge transfer channels in a plan view, each intersection thereof constituting one charge transfer stage together with said associated charge transfer channel; a plurality of joining channels, each said joining channel being formed in the surface of said semiconductor substrate for each set of a plurality of said charge transfer channels, each said joining channel combining the set of said charge transfer channels with each other in a region outside said light sensing section; and a joining channel transfer electrode formed on the surface of said semiconductor substrate in the region outside said light sensing section, said joining channel transfer electrode intersecting each said joining channel in a plan view, each said intersection thereof constituting one joining charge transfer stage together with said each joining channel.

According to another aspect of the present invention, there is provided a driving method of a solid-state image pickup device comprising: a semiconductor substrate; a light sensing section defined on a surface of said semiconductor substrate; a large number of photoelectric converter elements formed in said light sensing section in a plurality of rows and in a plurality of columns; a charge transfer channel formed for each said photoelectric converter element column adjacent thereto on the surface of said semiconductor substrate, said charge transfer channel intersecting said light sensing section in a predetermined direction in a plan view; a plurality of transfer electrodes formed on said light sensing section, each said transfer electrode including a plurality of transfer path forming sections equal in number to said charge transfer channels, each said transfer path forming section intersecting an associated one of said charge transfer channels in a plan view, each intersection thereof constituting one charge transfer stage together with said associated charge transfer channel; a plurality of joining channels, each said joining channel being formed in the surface of said semiconductor substrate for each set of a plurality of said charge transfer channels, each said joining channel combining the set of said charge transfer channels with each other in a region outside said light sensing section; and a joining channel transfer electrode formed on the surface of said semiconductor substrate in the region outside said light sensing section, said joining channel transfer electrode intersecting each said joining channel in a plan view, each said intersection thereof constituting one joining charge transfer stage together with said each joining channel, the driving method comprising the steps of: a signal charge readout step of reading out, during one vertical blanking period, signal charge accumulated in each photoelectric converter element constituting a predetermined photoelectric converter element row or column, via said readout gate contiguous to said photoelectric converter element and feeding the signal charge to said charge transfer channel contiguous to said readout gate; and an image signal output step of converting, during a period from said one vertical blanking period to a one vertical blanking period subsequent thereto, each said signal charge read out to said charge transfer channel into an image signal and outputting the image signal.

In the solid-state image pickup device, a plurality of transfer electrodes are disposed so as to form charge transfer stages each including the same one charge transfer channel, the charge transfer stages being contiguous to each other. This resultantly forms one vertical transfer CCD in the light sensing section. The vertical transfer CCDs are formed as many as there are photoelectric converter columns formed in the light sensing section. In the solid-state image pickup device, the number of vertical transfer CCDs necessary to read signal charge from the photoelectric converters for the transfer thereof is therefore equal to that of the vertical transfer CCDs in the solid-state image pickup device of the prior art.

However, the solid-state image pickup device includes the joining channels. When the horizontal transfer CCD is disposed at a downstream position of the joining channels, the number of transfer electrodes of the horizontal transfer CCD can be reduced to half or less that of the solid-state image pickup device of the prior art.

It is therefore possible to produce, for example, a two-million-pixel solid-state image pickup device without narrowing the width of the transfer electrode in each charge transfer stage of the horizontal transfer CCD. This is, a high pixel density solid-state image pickup device having two million pixels can be produced using ordinary fine patterning technique.

Since the number of transfer electrodes to be formed in the horizontal transfer CCD can be reduced to about half that of the prior art, the increase in the load electrostatic capacity of each pulse supply terminal to supply driving pulses to the horizontal transfer CCD can be suppressed. It is therefore easy to suppress increase in the consumption power.

In this specification, movement of signal charge in a transfer path is regarded as a flow and hence a relative position of a member in such a stream is expressed, for example, as "an upstream of the member A" or "a downstream of the member A" when necessary.

BRIEF DESCRIPTION OF THE DRAWINGS

The objects and features of the present invention will become more apparent from the consideration of the following detailed description taken in conjunction with the accompanying drawings in which:

FIG. 3 is a cross-sectional perspective view schematically showing part of the light sensing section of the first embodiment of an IT-CCD;

FIG. 7 is a graph showing pulse waveforms of an example of a reading pulse to conduct interlaced driving of the first embodiment of an IT-CCD;

DESCRIPTION OF THE PREFERRED EMBODIMENTS

Figure 1:
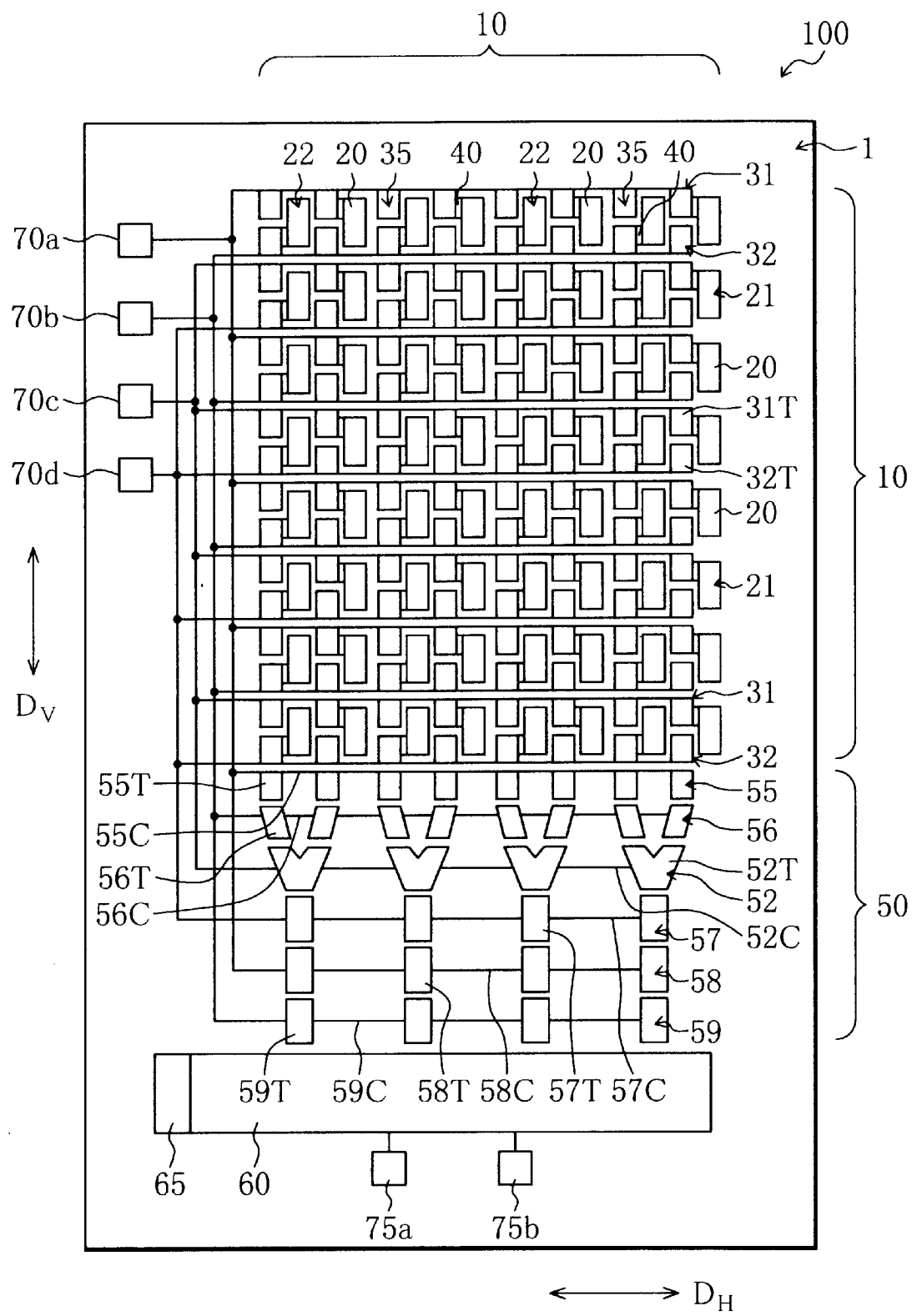
FIG. 1 is a plan view schematically showing a first embodiment of an IT-CCD.

FIG. 1 illustratively shows an IT-CCD 100 of interlaced drive type according to a first embodiment. The IT-CCD 100 includes a light sensing section 10 defined on a surface of a semiconductor substrate 1, a confluence section 50 formed outside the light sensing section 10, an output transfer path 60 formed outside the confluence section 50, and an output unit 65 connected to an end of the output transfer path 60.

FIG. 1 is a simplified diagram including only 64 photoelectric converters 20 for easy understanding of the configuration and for simplicity of explanation. An actual IT-CCD of interlaced drive type includes several hundreds of thousand of photoelectric converters to several million photoelectric converters.

Structure in the light sensing section 10 shown in FIG. 1 will be described by referring to FIGS. 1 to 3 and FIGS. 4A and 4B.

Figure 2:
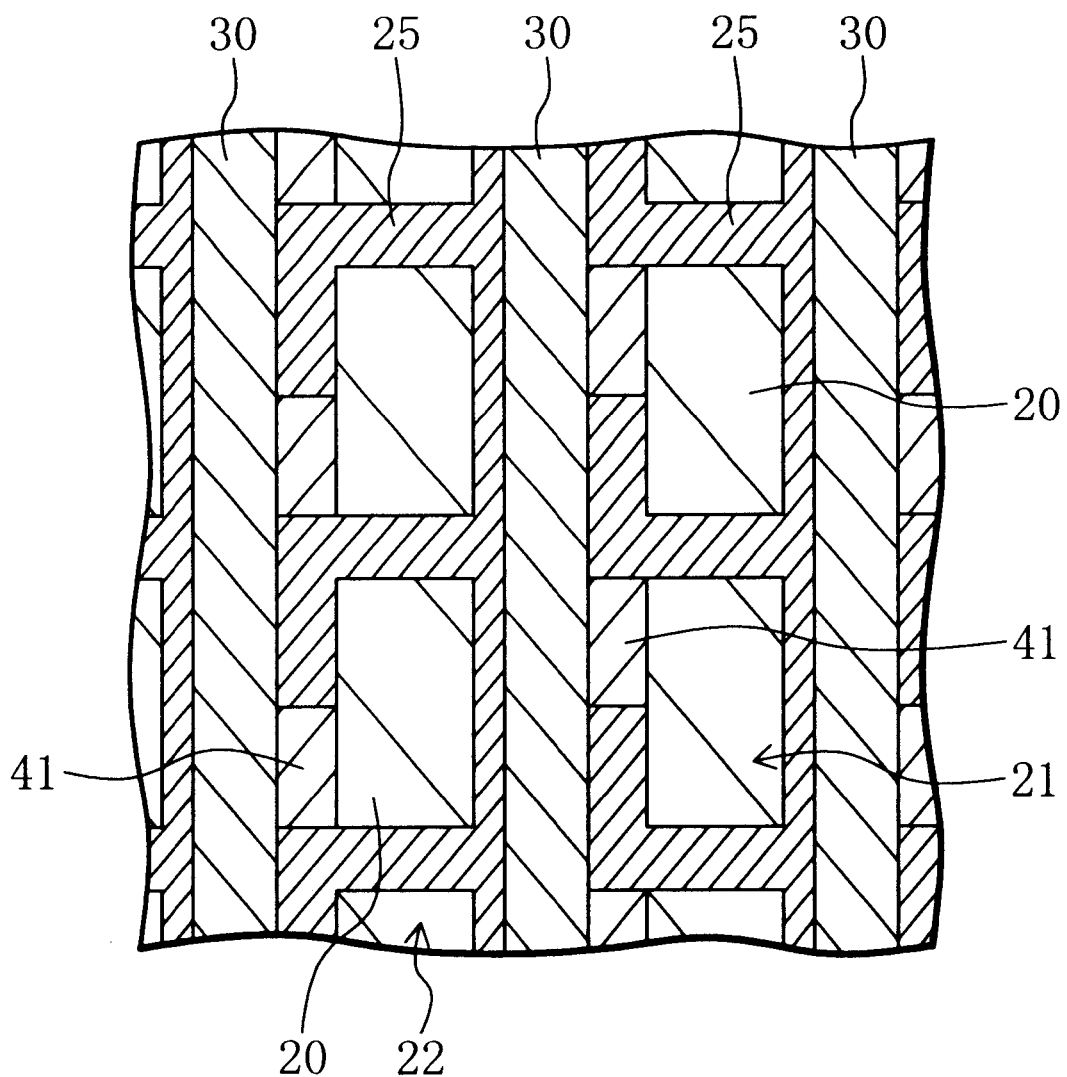
FIG. 2 is a schematic plan view showing a layout of photoelectric converters, channel stop regions, and charge transfer channels in a light sensing section of the first embodiment of an IT-CCD.

FIG. 2 shows a layout of photoelectric converters 20, channel stop regions 25, and charge transfer channels 30 in the light sensing section 10 in a schematic plan view.

FIG. 3 partly shows an outline of the light sensing section 10 in a cross-sectional perspective view.

Figure 4A:
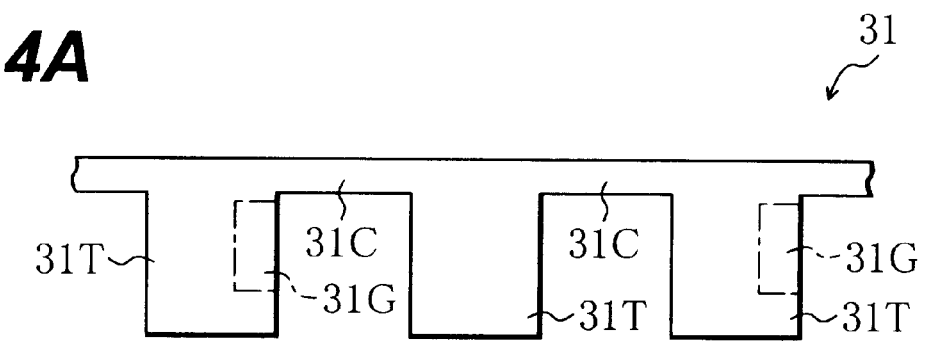
FIG. 4A is a plan view partly showing an outline of a transfer electrode formed on the light sensing section of the first embodiment of an IT-CCD.
Figure 4B:
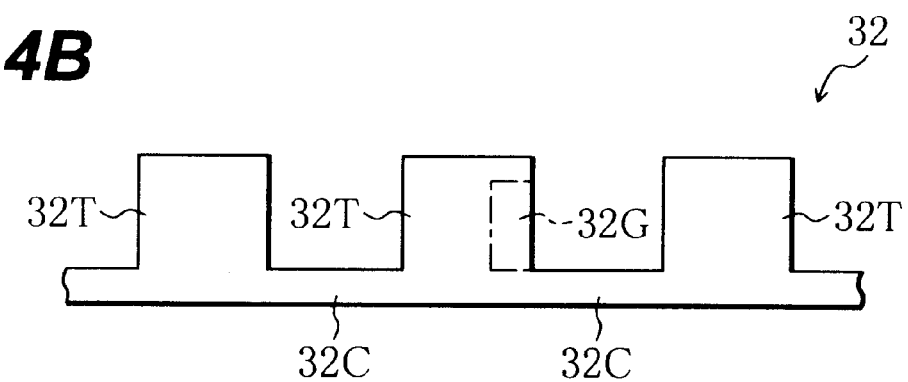
FIG. 4B is a plan view partly showing an outline of another transfer electrode formed on the light sensing section of the first embodiment of an IT-CCD.

FIG. 4A shows an outline of a transfer electrode 31 formed on the light sensing section 10 in a partial plan view, and FIG. 4B shows an outline of a transfer electrode 32 formed on the light sensing section 10 in a partial plan view.

In the following description, the semiconductor substrate 1 is an n-type silicon substrate having a p-type well. It is to be appreciated that an IT-CCD having similar functions can also be produced using other semiconductor substrates.

On a surface of the semiconductor substrate 1, 64 photoelectric converters 20 are formed in eight rows and in eight columns in the light sensing section 10. Eight photoelectric converter rows 21 and eight photoelectric converter columns 22 are formed on the surface of the semiconductor substrate 1 in the light sensing section 10. As shown in FIG. 1 or 2, each photoelectric converter 20 has a rectangular contour in a plan view.

For each photoelectric converter column, one charge transfer channel (not shown in FIG. 1) is formed on a left side (in FIG. 1) of the associated photoelectric converter column. Accordingly, eight charge transfer channels are formed in total. The charge transfer channels intersect the light sensing section 10 in a direction $D_V$ of the photoelectric converter column (to be referred to as "column direction $D_V$" herebelow) indicated by an arrow in FIG. 1. As shown in FIG. 2, each charge transfer channel 30 has a contour of a band in a plan view. As shown in FIG. 3, the charge transfer channel 30 is obtained by forming, for example, a band-shaped n-type region in a p-type well 2.

As shown in FIG. 2, a channel stop region 25 is formed in a region between the photoelectric converter 20 and the charge transfer channel 30 excepting each area of the region in which a readout gate region 41, which will be described later, is formed. The channel stop region 25 is formed also between two successive photoelectric converters 20 in one photoelectric converter column 22. As shown in FIG. 3, the channel stop region 25 is obtained by forming, for example, a $p^+$-type region with a predetermined shape in the p-type well 2.

As shown in FIG. 3, the photoelectric converter 20 consists of a photodiode of buried type including, for example, a predetermined region in the p-type well 2 formed in one surface of the semiconductor substrate 1, an n-type region 3 disposed in the predetermined region of the p-type well 2, and an burring $p^+$-type layer 4 disposed on the n-type region 3. The n-type region 3 has a function of a signal charge accumulating region. Disposed on the $p^+$-type layer 4 is an electrically insulating film (a silicon oxide film), not shown.

As shown in FIG. 1, two transfer electrodes 31 and 32 are alternately formed on the light sensing section 1 with an electric insulating film (not shown) between the electrodes 31 and 32 and the light sensing section 10. The total number of the transfer electrodes 31 and 32 is eight, respectively. As shown in FIG. 3, the transfer electrodes 31 and 32 intersect each charge transfer channel 30 in a plan view. Each transfer electrode 32 is formed by, for example, a first polycrystalline layer. Each transfer electrode 31 is formed by, for example, a second polycrystalline layer. The transfer electrodes 31 are insulated from the transfer electrodes 32 by an electrically insulating film, not shown.

Each transfer electrode 31 has eight rectangle-shaped transfer path forming sections 31T (FIG. 1). In one transfer electrode 31, two adjacent transfer path forming sections 31T are linked with each other by a band-shaped connecting section 31C as shown in FIG. 3 or FIGS. 4A and 4B. Each connecting section 31C extends in the row direction $D_H$ (FIG. 1).

Each transfer path forming section 31T of one transfer electrode 31 intersects an associated one of the charge transfer channels 30 in a plan view as shown in FIG. 3. An intersection between the transfer path forming section 31T and the associated one of the charge transfer channels 30 in a plan view serves as one charge transfer stage. In each transfer electrode 31, even transfer path forming sections 31T relative to a left end of FIG. 1 cover predetermined readout gate regions 41 formed in the light sensing section 10 in a plan view (FIG. 3). In the transfer path forming section 31T, the section covering the readout gate region 41 serves as a readout gate electrode zone 31G (FIG. 3 and FIGS. 4A and 4B) to read signal charge from the associated photoelectric converter 20.

Each transfer electrode 32 also has eight transfer path forming sections 32T with a rectangular contour in a plan view (FIG. 1). In each transfer electrode 32, two adjacent transfer path forming sections 32T are linked with each other by a band-shaped connecting section 32C as shown in FIG. 3 or FIGS. 4A and 4B. Each connecting section 32C extends in the row direction $D_H$(FIG. 1).

Each transfer path forming section 32T of one transfer electrode 31 intersects an associated one of the charge transfer channels 30 in a plan view as shown in FIG. 3. An intersection between the transfer path forming section 32T and the associated one of the charge transfer channels 30 in a plan view serves as one charge transfer stage. In each transfer electrode 32, odd transfer path forming sections 32T relative to a left end of FIG. 1 cover predetermined readout gate regions 41 formed in the light sensing section 10 in a plan view (FIG. 3). In the transfer path forming section 32T, the section covering the readout gate region 41 serves as a readout gate electrode zone 32G (FIG. 3 and FIGS. 4A and 4B) to read signal charge from the associated photoelectric converter 20.

A charge transfer stage including transfer path forming section 31T and a charge transfer stage including the transfer path forming section 32T are alternately disposed for one charge transfer channel 30 to form one vertical transfer CCD 35 (FIG. 1). For one photoelectric converter 20, two charge transfer stages, namely, one charge transfer stage including the transfer path forming section 31T and one charge transfer stage including the transfer path forming section 32T are formed in this order from an upstream side to a down stream side.

In FIG. 1, the transfer path forming sections 31T and 32 of each vertical transfer CCD 35 are separated from each other for easy understanding of the configuration. However, the transfer path forming section 31T in each vertical transfer CCD 35 and the transfer path forming section 32T formed adjacent thereto on the down stream side are actually partly overlapped with each other as shown in FIG. 3.

An edge section on the downstream side of the transfer path forming section 31T is over the upstream side of the transfer path forming section 32T with an electrically insulating film, not shown. The transfer path forming section 31T and the transfer path forming section 32T formed adjacent thereto on the downstream side constitute so-called overlapped transfer electrode structure.

Structure constituted with two mutually insulated transfer electrodes in which an edge section along one edge of one of the transfer electrodes overlaps with an edge section of one edge of the other one thereof will be simply referred to as "overlapped transfer electrode structure" herebelow. It is assumed that the "transfer electrode" includes, for example, a transfer path forming section, a subordinate transfer electrode, and a joining channel transfer electrode. The overlapped transfer electrode structure can also be constructed using three or more transfer electrodes.

In the overlapped section of the overlapped transfer electrode structure including two transfer electrodes, the transfer electrode disposed at a lower position is called "low-layer electrode" and the transfer electrode disposed at an upper position is called "high-layer electrode" in some cases. Similarly, in the overlapped section of the overlapped transfer electrode structure including three transfer electrodes, the transfer electrode disposed at a lowest position is called "low-layer electrode", the transfer electrode disposed at an uppermost position is called "high-layer electrode", and the transfer electrode disposed between the low-layer electrode and the high-layer electrode is called "middle-layer electrode" in some cases.

Each vertical CCD 35 receives, via a readout gate 40, signal charge accumulated in each photoelectric converter 20 constituting the photoelectric converter column 22 formed on the right side (on the right side in FIG. 1) of and adjacent to the vertical CCD 35 and then transfers the signal charge in the column direction $D_V$.

One readout gate 40 is formed for each photoelectric converter 20 (FIG. 1). In FIG. 1, the readout gate 40 is contiguous to the transfer path forming section 31T or 32T for easy understanding of the configuration. However, the readout gate 40 actually consists of a readout gate region 41 (FIG. 3) including a predetermined section of the p-type well 2 formed in the semiconductor substrate 1 and the readout gate electrode zone 31G or 32G covering the readout gate region 41 in a plan view (FIG. 3).

For each of the photoelectric converters 20 of the odd photoelectric converter columns 22 relative to the left end of FIG. 1, the readout gate region 41 is formed on the downstream side and on the left side of substantially a half section of the photoelectric converter 20. The region 41 is contiguous to the half section of the photoelectric converter 20 in a plan view (FIGS. 2 and 3). The readout gate region 41 is contiguous to the charge transfer stage including the transfer path forming section 32T of the two charge transfer stages corresponding to the photoelectric converter 20. The readout gate electrode zone 32G covers the readout gate region 41 in a plan view.

For each of the photoelectric converters 20 of the even-numbered photoelectric converter columns 22 relative to the left end of FIG. 1, the readout gate region 41 is formed on the upstream side and on the left side of substantially a half section of the photoelectric converter 20. The region 41 is contiguous to the half section of the photoelectric converter 20 in a plan view (FIGS. 2 and 3). The readout gate region 41 is contiguous to the charge transfer stage including the transfer path forming section 31T of the two charge transfer stages corresponding to the photoelectric converter 20. The readout gate electrode zone 31G covers the readout gate region 41 in a plan view.

The configuration of the confluence section 50 shown in FIG. 1 will be described by referring to FIGS. 1 and 5.

Figure 5:
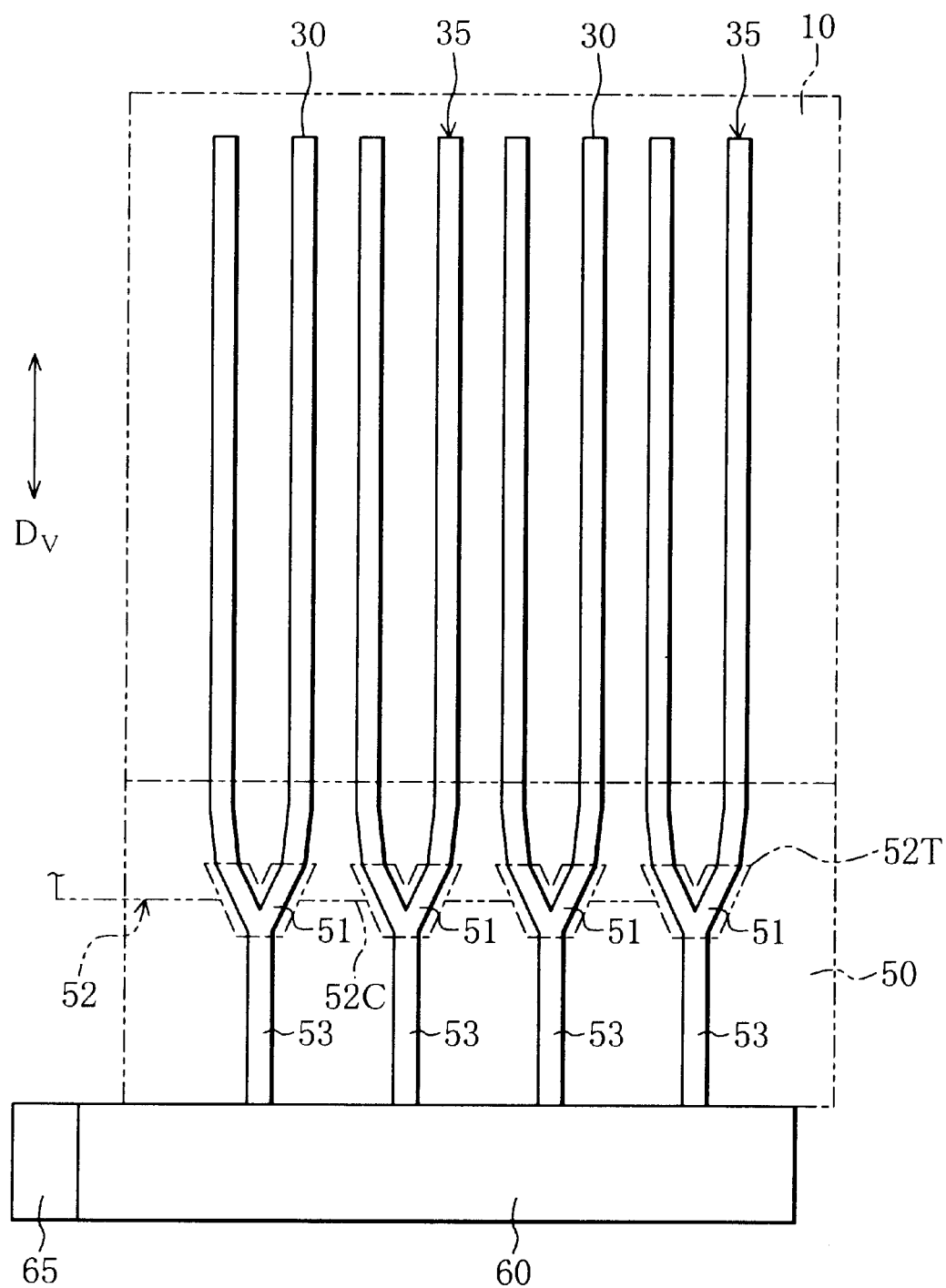
FIG. 5 is a plan view showing an outline of a layout of the light sensing section, charge transfer channels, joining channels, and an output transfer path in the first embodiment of an IT-CCD.

FIG. 5 shows an outline of a layout of the light sensing section 10, the charge transfer channels 30, the joining channels 51, and the output transfer path 60 in a schematic plan view.

Each charge transfer channel 30 intersects the light sensing section 10 in the column direction $D_V$(FIG. 1 or 5) and extends for two subordinate transfer electrode stages toward the output transfer path 60 (i.e., in the confluence section 50). The subordinate transfer electrode stage will be described later.

Two adjacent charge transfer channels 30 are isolated from each other also in the confluence section 50 by a channel stop region, not shown.

One joining channel 51 is connected to two charge transfer channels 30. Four joining channels 51 are disposed in the configuration of FIG. 5. The joining channel 51 has a contour of letter Y in a plan view. Each joining channel 51 is linked with a downstream end of each of two associated charge transfer channels 30 to combine the two charge transfer channels 30. Two adjacent joining channels 51 are isolated from each other by a channel stop region, not shown.

As shown in FIGS. 1 and 5, one joining channel transfer electrode 52 is disposed in the confluence section 50. The joining channel transfer electrode 52 is formed using, for example, polycrystalline silicon. The joining channel transfer electrode 52 is disposed on the semiconductor substrate 1 with an electrically insulating film (not shown) therebetween.

The joining channel transfer electrode 52 has four V-shaped joining transfer path forming sections 52T covering the joining channel 51 in a plan view. Two adjacent joining transfer path forming sections 52T are linked with each other by a band-shaped connecting section 52C. Each joining transfer path forming section 52T intersects an associated one of the joining channels 51 in a plan view as shown in FIG. 5. The intersection between the joining transfer path forming section 52T and the associated joining channel 51 has a function of one joining charge transfer stage.

A subordinate charge transfer channel 53 is linked with a downstream end of each joining channel 51 (FIG. 5). A downstream edge of each subordinate charge transfer channel 53 reaches the output transfer path 60. Two adjacent subordinate charge transfer channels 53 are isolated by a channel stop region, not shown.

A first subordinate transfer electrode 55 and a second subordinate transfer electrode 56 are formed in this order from an upstream side to an downstream side between each most downstream transfer electrode 32 on the light sensing section 10 and joining channels 51 in a plan view (FIG. 1). Third, fourth, and fifth subordinate transfer electrodes 57, 58, and 59 are formed in this order from an upstream side to a downstream side between joining channels 51 and the output transfer path 60 in a plan view.

The first subordinate transfer electrode 55 has eight subordinate transfer path forming sections 55T each of which has a rectangular contour in a plan view (FIG. 1). Two adjacent subordinate transfer path forming sections 55T are linked with each other by a band-shaped connecting section 55C. Each connecting section 55C extends in the row direction $D_H$. Each subordinate transfer path forming section 55T intersects an associated one of the charge transfer channels 30 in a plan view. The intersection between the subordinate transfer path forming section 55T and the associated one charge transfer channel 30 has a function of one subordinate charge transfer stage.

The second subordinate transfer electrode 56 also has eight subordinate transfer path forming sections 56T each of which has a rectangular contour in a plan view (FIG. 1). Two adjacent subordinate transfer path forming sections 56T are linked with each other by a band-shaped connecting section 56C. Each connecting section 56C extends in the row direction $D_H$. Each subordinate transfer path forming section 56T intersects an associated one of the charge transfer channels 30 in a plan view. The intersection between the subordinate transfer path forming section 56T and the associated one charge transfer channel 30 has a function of one subordinate charge transfer stage.

The third subordinate transfer electrode 57 has four subordinate transfer path forming sections 57T each of which has a rectangular contour in a plan view (FIG. 1). Two adjacent subordinate transfer path forming sections 57T are linked with each other by a band-shaped connecting section 57C. Each connecting section 57C extends in the row direction $D_H$. Each subordinate transfer path forming section 57T intersects an associated one of the subordinate charge transfer channels 53 in a plan view. The intersection between the subordinate transfer path forming section 57T and the associated one subordinate charge transfer channel 53 has a function of one subordinate charge transfer stage.

Each of the fourth and fifth subordinate transfer electrodes 58 and 59 is of the same contour and size as that of the third subordinate transfer electrode 57 and is arranged according to substantially the same specification as that of the third subordinate transfer electrode 57. In FIG. 1, the subordinate transfer path forming section of the fourth subordinate transfer electrode 58 is indicated by a reference numeral 58T and the connecting section of the fourth subordinate transfer electrode 58 is indicated by a reference numeral 58C. Similarly, in FIG. 1, the subordinate transfer path forming section of the fifth subordinate transfer electrode 59 is indicated by a reference numeral 59T and the connecting section of the fourth subordinate transfer electrode 59 is indicated by a reference numeral 59C.

In FIG. 1, adjacent ones selected from the most downstream transfer electrode 32 of the light sensing section 10, the joining channel transfer electrode 52, and the first to fifth subordinate transfer electrodes 55 to 59 are separated from each other for easy understanding of the configuration. However, the transfer path forming section 32T, the joining channel transfer path forming section 52T, and the subordinate transfer path forming sections 55T to 59T are in the overlapped transfer electrode structure.

Each of the subordinate transfer path forming section 55T, the joining transfer path forming section 52T, and the subordinate transfer electrode forming sections 58T corresponds to a high-layer electrode. Each of the transfer path forming section 32T of the most downstream transfer electrode 32 and the subordinate transfer path forming sections 56T, 57T, and 59T corresponds to a low-layer electrode.

Each of the first and second vertical transfer CCDs 35 relative to the left end of FIG. 1 intersects the light sensing section 10 in the column direction $D_V$ and extends for two subordinate charge transfer stages into the confluence section 50. The first and second vertical transfer CCDs 35 are combined with each other in a joining charge transfer stage constituted with the left-most joining channel 51 (FIG. 5) and the left-most joining transfer path forming section 52T. This is also the case with the third and fourth vertical transfer CCDs 35, with the fifth and sixth vertical transfer CCDs 35 and the seventh and eighth vertical transfer CCDs 35 relative to the left end of FIG. 1.

On the downstream side of each joining charge transfer stage, a subordinate vertical transfer CCD constituted with one subordinate charge transfer channel 53 (FIG. 5) and the subordinate transfer path forming sections 57T, 58T, and 59T follows. The subordinate vertical transfer CCDs reach the output transfer path 60.

Description will be given of the output transfer path 60 and the output unit 65 shown in FIG. 1.

The output transfer path 60 receives signal charge sent via the confluence section 50 from the light sensing section 10 and sequentially transfers the signal charge to the output unit 65. The output transfer path 60 is constituted with, for example, a two-phase drive CCD of two-layer electrode structure, a two-phase drive CCD of three-layer electrode structure, or a four-phase drive CCD of three-layer electrode structure.

A two-phase or four-phase drive CCD of two-layer electrode structure includes a two-phase drive CCD of two-layer polycrystalline silicon electrode structure consisting of a transfer electrode of a first polycrystalline silicon layer and a transfer electrode of a second polycrystalline silicon layer. A two-phase or four-phase drive CCD of three-layer electrode structure includes a two-phase drive CCD of three-layer polycrystalline silicon electrode structure consisting of a transfer electrode of a first polycrystalline silicon layer, a transfer electrode of a second polycrystalline silicon layer, and a transfer electrode of a third polycrystalline silicon layer.

The output unit 65 converts the signal charge sent via the output transfer path 60 into a signal voltage using floating capacitance (not shown) and amplifies the signal voltage, for example, by a source-follower circuit. Signal charge after the detection (conversion) is absorbed via a reset transistor, not shown, by a power source (not shown).

In the IT-CCD 100 shown in FIG. 1, four-pulse supply terminals 70a, 70b, 70c, and 70d are disposed to supply four-phase driving pulses to transfer electrodes 31, transfer electrodes 32, the first subordinate transfer electrode 55, the second subordinate transfer electrode 56, the joining channel transfer electrode 52, the third subordinate transfer electrode 57, the fourth subordinate transfer electrode 58, and the fifth subordinate transfer electrode 59.

Each transfer electrode 31, each transfer electrode 32, the first subordinate transfer electrode 55, the second subordinate transfer electrode 56, the joining channel transfer electrode 52, the third subordinate transfer electrode 57, the fourth subordinate transfer electrode 58, and the fifth subordinate transfer electrode 59 can be classified into four transfer-electrode groups as follows. Namely, by selecting every fourth ones from the components in a direction from the light sensing section 10 to the confluence section 50, the components are classified into four transfer-electrode groups.

Each of the pulse supply terminals 70a, 70b, 70c, and 70d is electrically connected to an associated one of the transfer electrode groups.

To supply a two-phase driving pulse to each transfer electrode of the output transfer path 60, two pulse supply terminals 75a and 75b are disposed.

In the IT-CCD 100, one pixel includes (a) one photoelectric converter 20, (b) two charge transfer stages formed adjacent to and on the left side (the left side in FIG. 1) of the photoelectric converter 20, namely, the charge transfer stage including the transfer path forming section 31T and the charge transfer stage including the charge transfer path forming section 32T, and (c) one readout gate 40 formed between the charge transfer stage including the charge transfer path forming section 31T or 32T and the photoelectric converter 20. In the IT-CCD 100, 64 pixels are formed in eight rows and in eight columns.

The IT-CCD 100 has the joining channels 51. Therefore, when the output transfer path 60 (FIG. 1) is constituted using a CCD, the number of charge transfer stages in the output transfer path 60 and hence the number of transfer electrodes can be reduced to half that required in the prior art.

Consequently, a high-pixel-density IT-CCD having, for example, two million pixels can be produced without narrowing the width of the transfer electrode in each charge transfer stage of the output transfer path 60. That is, a high-pixel-density IT-CCD having, for example, two million pixels can be produced with ordinary fine patterning technique.

Since the number of transfer electrodes to be formed in the output transfer path 60 is reduced to half that of the prior art, it is possible to suppress the increase in load electrostatic capacitance of the pulse supply terminals 75a and 75b (FIG. 1) to supply driving pulses to the output transfer path 60. Therefore, the increase in the consumption power can be easily suppressed.

The IT-CCD 100 according to the first embodiment has simple structure as an IT-CCD. In an actual IT-CCD, to prevent unnecessary photoelectric conversion in the vertical and horizontal transfer CCDs, a light shielding film is formed to cover in a plan view a predetermined area from the light sensing section to the output transfer path as described above. To increase photoelectric conversion efficiency of the photoelectric converters, a microlens array is disposed. For an IT-CCD to produce color images, a color filter array is disposed.

Figure 6A:
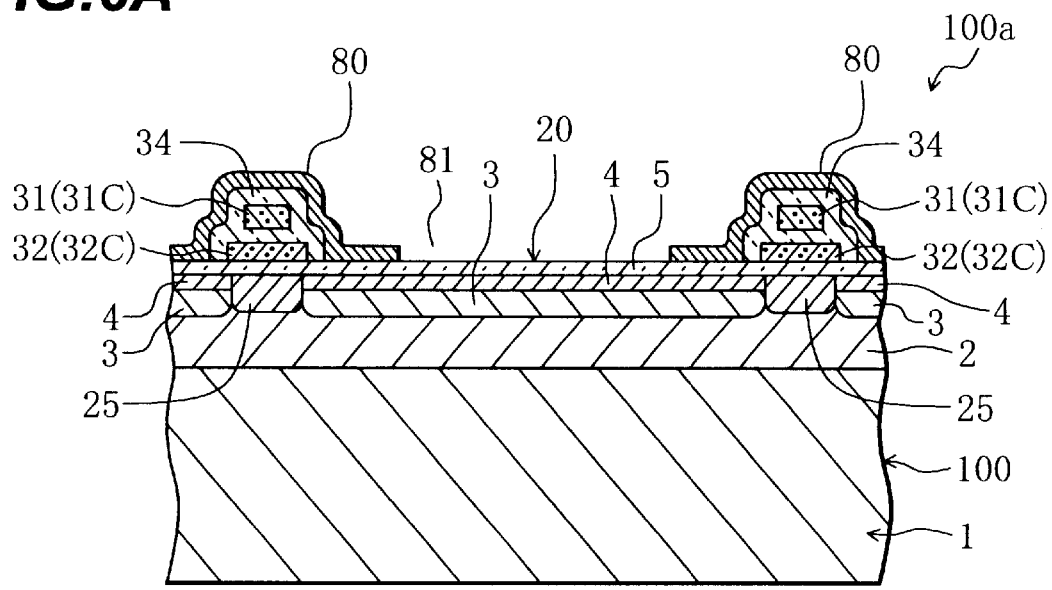
FIGS. 6A and 6B are cross-sectional views partly showing an example in which a light shielding film is disposed in the first embodiment of an IT-CCD.
Figure 6B:
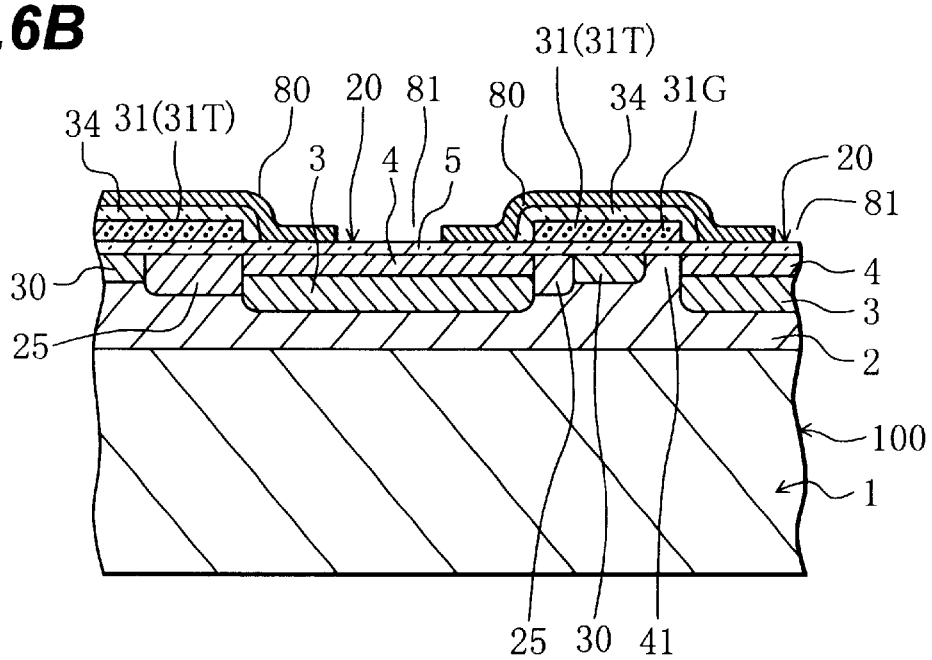

FIGS. 6A and 6B diagrammatically show an IT-CCD (to be referred to as "IT-CCD 100a" herebelow) obtained by disposing a light shielding film 80 in the IT-CCD 100 in a partial cross-sectional view. The light shielding film 80 has an opening 81 with a predetermined contour on each photoelectric converter 20. One opening 81 is formed for one photoelectric converter 20. Each opening 81 is disposed within the signal charge accumulating region (the n-type region 3) of the photoelectric converter 20 in a plan view. In one photoelectric converter 20, an exposed section thereof in the opening 81 in a plan view serves as a light receiving section (to be referred to as "light receiving section 81" in some cases herebelow) of each pixel.

The light shielding film 80 is a metallic thin film of, for example, aluminum, chromium, wolfram, titanium, or molybdenum; an alloy film of an alloy of at least two of these metals, or a multi-layer metallic thin film including a combination of the metallic thin films, a combination of the metallic thin film and the alloy thin film.

The opening (light receiving section) 81 has a rectangular contour in a plan view. The openings (light receiving sections) 81 are substantially equal in the contour, size, and direction to each other.

Light incident through the opening (light receiving section) 81 to the photoelectric converter 20 is photoelectrically converted into signal charge by the photoelectric converter 20. The signal charge is read from the n-type region 3 as the signal charge accumulating region of the photoelectric converter 20 and is fed via the readout gate 40 being contiguous to the photoelectric converter 20 to the vertical transfer CCD 35. Predetermined reading pulses are then applied to the transfer electrode 31 (the readout gate electrode zone 31G) or the transfer electrode 32 (the readout gate electrode zone 32G, not shown in FIGS. 6A and 6B).

FIGS. 6A and 6B show two members not shown in FIGS. 1 and 3. First, an electrically insulating film 5 is formed on a surface of the semiconductor substrate 1. The film 5 is made of, for example, silicon oxide. Second, an electrically insulating film 34 is formed to cover the transfer electrode 31. The film 34 in a section in which the transfer electrodes 31 and 32 overlap with each other in a plan view is constituted with an electrically insulating film (for example, a silicon oxide film) formed on a surface of the transfer electrode 32 and an electrically insulating film (for example, a silicon oxide film) formed on a surface of the transfer electrode 31.

To dispose the microlens array, a planarizing film is first formed on the light sensing section of the IT-CCD 100a (FIG. 6) with the light shielding film 80. The planarizing film is also used as a focus adjusting layer. In an IT-CCD to produce monochrome images, a microlens array including a predetermined number of microlenses is disposed on a surface of the planarizing film. In an IT-CCD to produce color images, a color filter array is disposed on the planarizing film. Therefore, after a second planarizing film is disposed on the color filter array, the microlens array is formed on a surface of the second planarizing film. In both of the monochrome and of color IT-CCDs, each microlens is formed to cover the light receiving section of one associated pixel.

The first planarizing film is disposed by forming a coating with desired thickness of, for example, photo resist in a spin coating process.

The color filter array includes a plurality of kinds of color filters with a predetermined pattern to produce color images. As the color filter array, a color filter array of three primary color type (red, green, and blue) or a color filter array of complementary color type may be used.

The color filter array of complementary color type can be constituted using, for example, (i) green (G), cyan (Cy), and yellow (Ye) filters; (ii) cyan (Cy), yellow (Ye), and white or colorless (W) filters; (iii) cyan (Cy), magenta (G), yellow (Ye), and green (G) filters; or (iv) cyan (Cy), yellow (Ye), green (G), and white or colorless (W) filters The color filter array can be produced by forming a layer of color resin including a desired pigment or dye at a desired location by, for example, photolithography.

The layout pattern of each color filter in the color filter array is selected, for example, as follows. In an IT-CCD with the color filter array, full-color information is obtained by additive or subtractive color mixture using signal charge accumulated in each photoelectric converter of two to three predetermined pixel rows or columns, for example, two or three adjacent pixel rows of the IT-CCD with the color filter array.

The second planarizing film on the color filter is disposed by forming a coating with desired thickness of, for example, transparent resin such as photo resist by a spin coating process.

Each microlens of the microlens array is formed to cover the light receiving section 81 (FIG. 6) of one pixel in a plan view. To dispose the microlenses, a layer of transparent resin (such as photo resist) having a refractive index of about 1.3 to 2.0 is divided into partitions of a predetermined contour. The transparent resin layer of each partition is molten by heat treatment and its corners are rounded by surface tension, and then the partition is cooled down.

To drive the IT-CCD 100 or 100a, a driving pulse supply unit is employed to supply predetermined driving pulses to each transfer electrode 31, each transfer electrode 32, the joining channel transfer electrode 52, the first to fifth subordinate transfer electrodes 55 to 59, and the output transfer path 60.

An example of the driving method will be described using an example of interlaced driving of the IT-CCD 100a shown in and FIGS. 6A and 6B. In the description below, eight pixel rows of the IT-CCD 100a are sequentially referred to as first to eighth pixel rows from an upstream side to a down stream side. Eight pixel columns are also sequentially referred to as first to eighth pixel columns from the left end to the right end of FIG. 1. The pixel rows and columns formed in other embodiments, which will be described later, will be identified also in this way.

In this embodiment and the other embodiments, a desired pixel is identified, for example, "(3 (row), 5 (column)) pixel", i.e., (3,5) pixel" in association with the pixel rows and columns described above.

FIG. 7 shows an example of reading pulses for the interlaced driving of the IT-CCD 100a when one frame is divided into four fields (i) to (iv) as follows.
(i) First field including pixels of second row in odd columns, fourth row in odd columns, six row in odd columns, and eighth row in odd columns.
(ii) Second field including pixels of second row in even columns, fourth row in even columns, six row in even columns, and eighth row in even columns.
(iii) Third field including pixels of first row in odd columns, third row in odd columns, fifth row in odd columns, and seventh row in odd columns.
(iv) Fourth field including pixels of first row in even columns, third row in even columns, fifth row in even columns, and seventh row in even columns.

Figure 8:
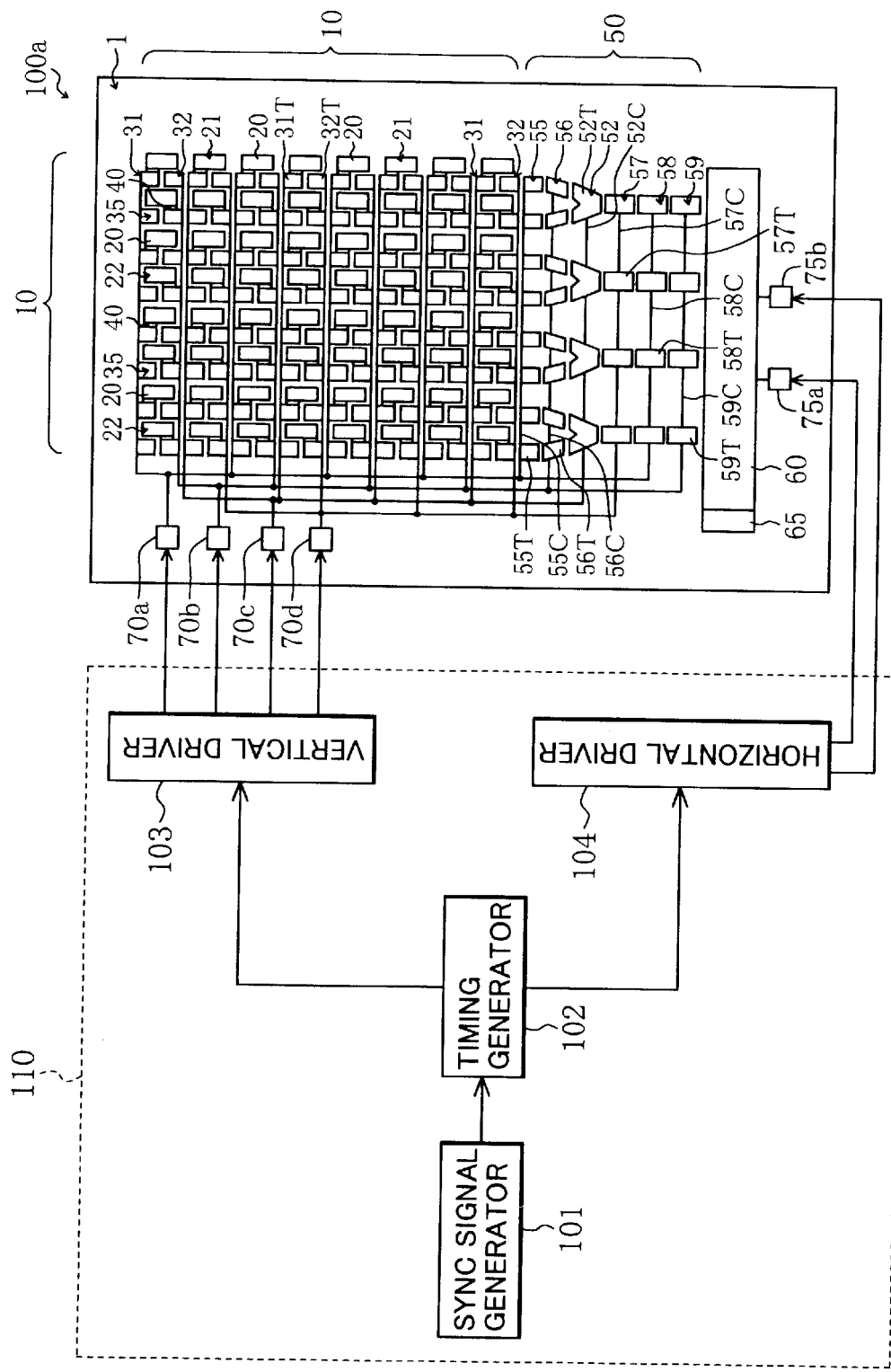
FIG. 8 is a diagram showing a relationship between the first embodiment of an IT-CCD and a driving pulse supply unit for the interlaced driving of the IT-CCD.

As shown in FIG. 8, a driving pulse supply unit 110 to achieve the interlaced driving of the IT-CCD 110a is constituted with, for example, a sync signal generator 101, a timing generator 102, a vertical driver circuit 103, and a horizontal driver circuit 104. In FIG. 8, the light shielding film 80 and associated members thereover are not shown.

The sync signal generator 101 generates various pulses necessary for signal processing such as a vertical sync pulse and a horizontal sync pulse. The timing generator 102 generates timing signals such as four-phase vertical pulse signals to drive the vertical transfers CCD 30, reading pulses to read signal charge from the photoelectric converters 20, and two-phase horizontal pulse signals to drive the output transfer path 60.

The vertical driver circuit 103 generates four kinds of vertical pulse signals in response to the timing signals. Each vertical pulse signal is applied via the pulse supply terminal 70a, 70b, 70c, or 70d to a predetermined one of the four transfer electrode groups. The horizontal driver circuit 104 generates two kinds of horizontal pulse signals in response to the timing signals. Each horizontal pulse signal is applied via the pulse supply terminal 75a or 75b to the output transfer path 60.

The vertical pulse signals respectively applied to the pulse supply terminals 70a to 70d are represented as Va, Vb, Vc, and Vd, respectively. The horizontal pulse signals respectively applied to the pulse supply terminals 75a and 75b are represented as Ha and Hb. The signals Ha and Hb are shifted by an angle of $\pi$ from each other.

At an appropriate point of time during a first vertical blanking period (a vertical blanking period will be referred to simply as "V blanking" herebelow) determined by a blanking pulse, a low-level vertical pulse $V_L$ is applied to the pulse supply terminals 70a and 70b and a high-level vertical pulse $V_H$ is applied to the pulse supply terminals 70c and 70d. While the vertical pulses $V_L$ and $V_H$ are being applied thereto, a reading pulse $V_R$ of a higher level is applied to the pulse supply terminals 70d.

By the reading pulse $V_R$, signal charge accumulated in each photoelectric converter 20 of the first field is read out to a vertical transfer CCD 35 associated therewith (signal charge readout process).

The signal charge read from each photoelectric converter 20 in the eighth row of each odd column is transferred to the output transfer path 60 during a first horizontal blanking period (a horizontal blanking period will be referred to simply as "H blanking" herebelow) following the first V blanking. The signal charge is sequentially outputted from the output unit 65 during a first horizontal effective signal period following the first H blanking (image signal output process).

Signal processing is thereafter similarly executed in a sequential way as follows. That is, the image signal output process is executed for the signal charge read from each photoelectric converter 20 in the sixth row of each odd column, for the signal charge read from each photoelectric converter 20 in the fourth row of each odd column, and for the signal charge read from each photoelectric converter 20 in the second row of each odd column.

To entirely output the signal charge accumulated in each photoelectric converter 20 of one field from the output unit 65, four image signal output processes are required. A period of time necessary to conduct the four image signal output processes will be referred to as "effective signal period" herebelow.

After the effective signal period of the first field is completed, at an appropriate point of time during a second V blanking determined by a blanking pulse, a low-level vertical pulse $V_L$ is applied to the pulse supply terminals 70a and 70b and a high-level vertical pulse $V_H$ is applied to the pulse supply terminals 70c and 70d. While the vertical pulses $V_L$ and $V_H$ are being applied thereto, a reading pulse $V_R$ is applied to the pulse supply terminals 70c.

By the reading pulse $V_R$, signal charge accumulated in each photoelectric converter 20 of the second field is read out to a vertical transfer CCD 35 associated therewith (signal charge readout process).

After the signal charge readout process, an effective signal period is set for the second field. During the effective signal period, four image signal output processes are sequentially executed as in the effective signal period of the first field. That is, the image signal output processes for the signal charge read from each photoelectric converter 20 in the eighth row of each even column, for the signal charge read from each photoelectric converter 20 in the sixth row of each odd column, for the signal charge read from each photoelectric converter 20 in the fourth row of each odd column, and for the signal charge read from each photoelectric converter 20 in the second row of each odd column are conducted.

Similarly, the signal charge readout process and four image signal output processes are sequentially executed for the third and fourth fields, respectively.

In a signal charge readout process for the third field, a high-level vertical pulse $V_H$ is applied to the pulse supply terminals 70a and 70b and a low-level vertical pulse $V_L$ is applied to the pulse supply terminals 70c and 70d. While the vertical pulses $V_L$ and $V_H$ are being applied thereto, a reading pulse $V_R$ is applied to the pulse supply terminals 70b.

In a signal charge readout process for the fourth field, a high-level vertical pulse $V_H$ is applied to the pulse supply terminals 70a and 70b and a low-level vertical pulse $V_L$ is applied to the pulse supply terminals 70c and 70d. While the vertical pulses $V_L$ and $V_H$ are being applied thereto, a reading pulse $V_R$ is applied to the pulse supply terminals 70a.

By repeating the operation from the first V blanking to the effective signal period for the fourth field, interlaced image output signals, namely, the image output signal of each field is sequentially outputted from the output unit 65.

The image output signal outputted from the output unit 65 in the interlaced operations are an image output signal including charge (to be referred to "addition signal" herebelow) obtained by adding (combining through confluence) charge separately transferred through two vertical transfer CCDs 35 (FIG. 1) to each other (with each other) by each associated one of the joining charge transfer stages. Each vertical transfer CCD 35 transfers (a) signal charge and (b) charge (noise signal charge) in which a dark current appearing in the vertical transfer CCD 35 is mixed with charge associated with smear.

For example, in the image signal output process of the first or third field, the odd vertical transfer CCDs 35 relative to the left end of FIG. 1 sequentially transfer the signal charge. In this situation, the even vertical transfer CCDs 35 relative to the left end of FIG. 1 sequentially transfer the noise signal charge.

In the image signal output process of the second or fourth field, the even vertical transfer CCDs 35 relative to the left end of FIG. 1 sequentially transfer the signal charge. In this situation, the odd vertical transfer CCDs 35 relative to the left end of FIG. 1 sequentially transfer the noise signal charge.

One addition signal includes charge obtained by adding the signal charge transferred through one of the two vertical transfer CCDs 35 to the noise signal charge transferred through the other one thereof.

The noise signal charge can be removed before the joining charge transfer stage by disposing a drain region and an exhaust gate, which will be described later.

In a camera requiring interlaced filed image data, image output signal of the first field and image output signal of second field which are outputted from the output unit 65 are once accumulated in a field memory, for example. Signal processing is then executed for the image output signal accumulated in the field memory to obtain image data. Or, image output signal of the third field and image output signal of fourth field which are outputted from the output unit 65 are once accumulated in a field memory. Signal processing is then executed for the image output signal accumulated in the field memory to obtain image data.

In the camera, to keep exposure time fixed for each of the first and second fields or for each of the third and fourth fields, a mechanical shutter is favorably used. During a period of time from when the first V blanking is completed to when the second V blanking is started, the mechanical shutter is kept closed so that no optical image enters any pixel. Or, from when the third V blanking is completed to when the fourth V blanking is started, the mechanical shutter is kept closed so that no optical image enters any pixel. Resultantly, field image output signals at the same point of time are obtained for the first and second fields or for the third and fourth fields.

In a camera requiring a frame image signal, image output signals respectively of the first to fourth fields are once stored in a frame memory. Color signal processing is then executed for the image output signals of one frame to obtain image data of the frame.

In a camera requiring only a frame image of one frame, to keep exposure time fixed for each field, a mechanical shutter is favorably used. From when the first V blanking is completed to when the fourth V blanking is started, the mechanical shutter is kept closed so that no optical image enters any pixel. Resultantly, field image output signals at the same point of time are obtained for each of the first to fourth fields. It is also possible to prevent smear in the field image of each of the first to fourth fields.

Figure 9:
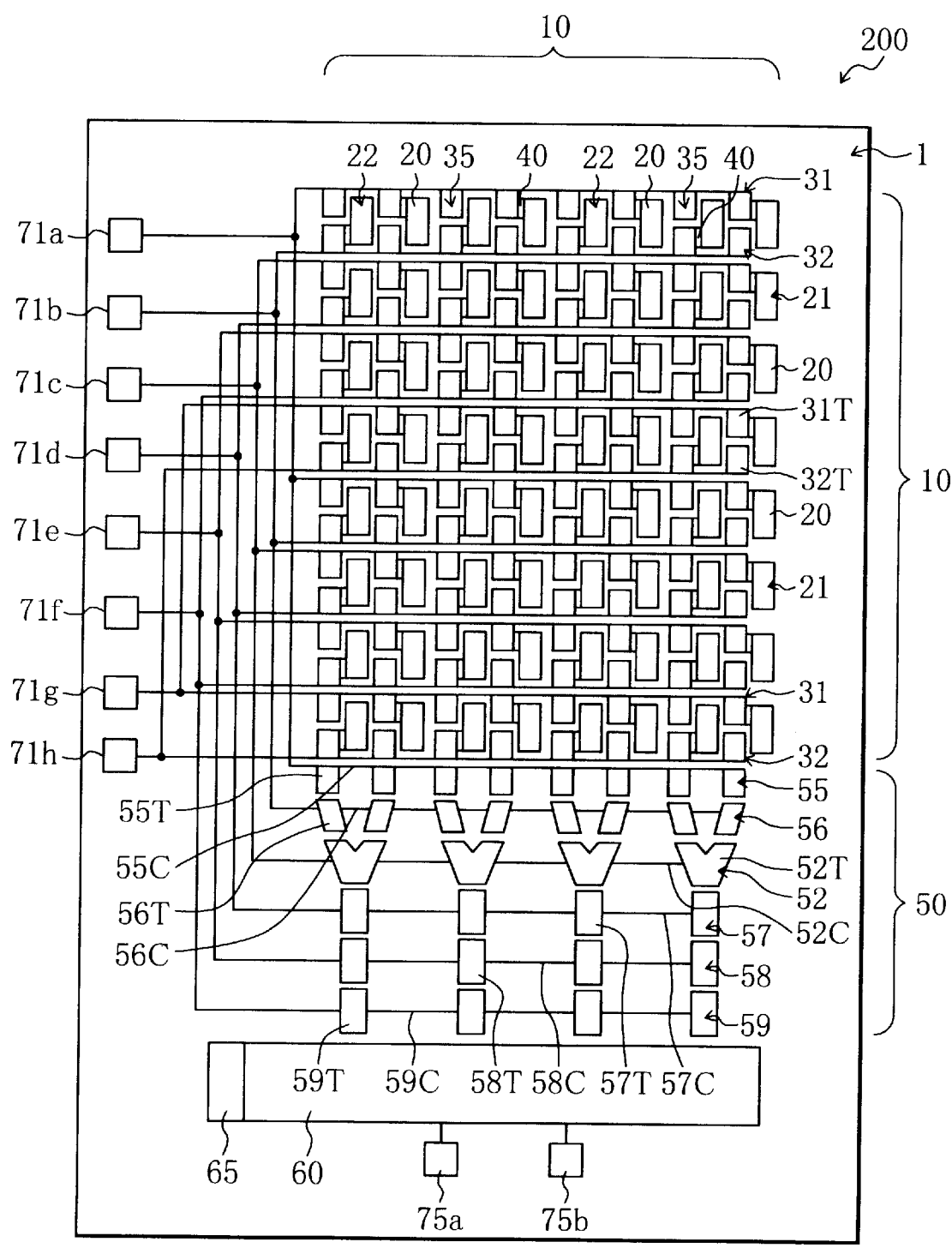
FIG. 9 is a plan view schematically showing a second embodiment of an IT-CCD.

Referring now to FIG. 9, description will be given of a second embodiment of an IT-CCD of the present invention.

FIG. 9 diagrammatically shows an IT-CCD 200 of the second embodiment in a plan view. The IT-CCD 200 is structurally equal to the IT-CCD 100 excepting (i) the number of pulse supply terminals to respectively supply predetermined driving pulses to each transfer electrode 31, each transfer electrode 32, the joining channel transfer electrode 52, and the first to fifth subordinate transfer electrodes 55 to 59 and (ii) specifications of wiring between the pulse supply terminals and the transfer electrodes 31, 32, and 55 to 59. In FIG. 9, the same constituent components as those of FIG. 1 are assigned with the same reference numerals and description thereof will be avoided.

In the IT-CCD 200, eight pulse supply terminals 71a to 71h are disposed as shown in FIG. 9 to respectively supply predetermined driving pulses to each transfer electrode 31, each transfer electrode 32, the joining channel transfer electrode 52, and the first to fifth subordinate transfer electrodes 55 to 59.

The pulse supply terminals 71a to 71h are electrically connected respectively to predetermined transfer electrodes 31, 32, 52, and 55 to 59.

The IT-CCD 200, like the IT-CCD 100, has the joining channels 51 shown in FIG. 5. Therefore, for the same reason as for the IT-CCD 100, a high-pixel-density IT-CCD with, for example, two million pixels can be produced using ordinary fine patterning technique. The increase in the consumption power can be easily suppressed.

By disposing a light shielding film in the IT-CCD 200, it is possible to prevent unnecessary photoelectric conversion in the vertical transfer CCDs 35 and the output transfer path 60.

By disposing a microlens array, photoelectric conversion efficiency of the photoelectric converters 20 can be increased. The microlens array can be formed in a procedure, for example, similar to the forming procedure of the microlens array described for the IT-CCD 100 as the first embodiment.

By disposing a color filter array, an IT-CCD for color images can be obtained. The color filter array can be formed in a procedure, for example, similar to the forming procedure of the color filter array described for the IT-CCD 100 as the first embodiment.

For the interlaced driving of the IT-CCD 200, predetermined vertical pulses are respectively applied to the pulse supply terminals 71a to 71h. The horizontal pulse signal Ha is applied to the pulse supply terminal 75a and the horizontal pulse signal Hb is supplied to the pulse supply terminal 75b. Since the transfer electrodes 31, 32, 52, and 55 to 59 are classified into eight transfer-electrode groups, eight kinds of readout operations are possible.

Figure 10:
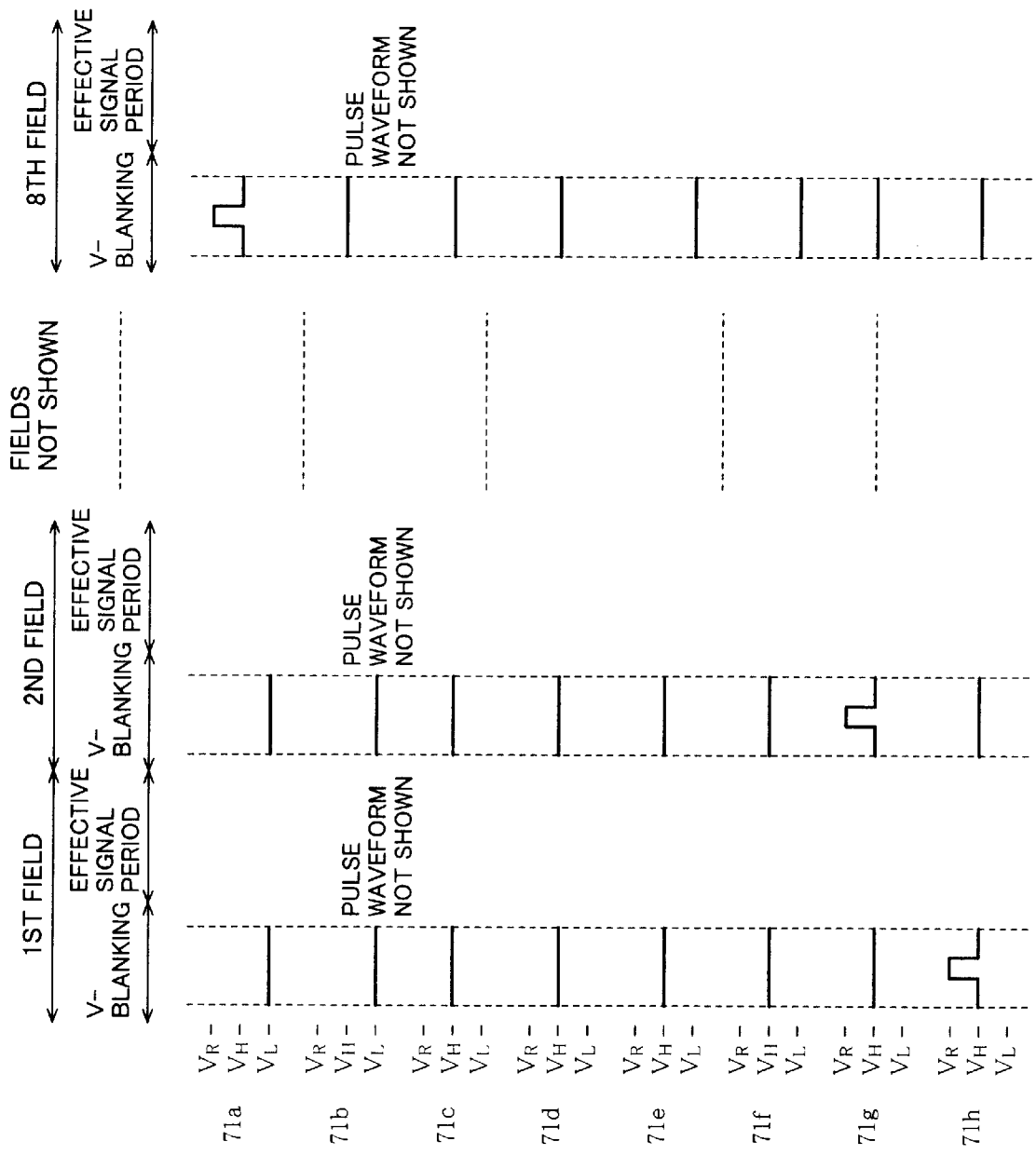
FIG. 10 is a graph showing pulse waveforms of an example of a reading pulse to conduct interlaced driving of the second embodiment of an IT-CCD.

FIG. 10 shows an example of reading pulses for the interlaced driving of the IT-CCD 200 when one frame is divided into eight fields (i) to (viii) as follows.
(i) First field including each pixel in fourth row of odd columns and in eighth row of odd columns.
(ii) Second field including each pixel in fourth row of even columns and in eighth row of even columns.
(iii) Third field including each pixel in third row of odd columns and in seventh row of odd columns.
(iv) Fourth field including each pixel in third row of even columns and in seventh row of even columns.
(v) Fifth field including each pixel in second row of odd columns and in sixth row of odd columns.
(vi) Sixth field including each pixel in second row of even columns and in sixth row of even columns.
(vii) Seventh field including each pixel in first row of odd columns and in fifth row of odd columns.
(viii) Eighth field including each pixel in first row of even columns and in fifth row of even columns.

The driving pulse supply unit for the interlaced driving of the IT-CCD 200 is configured in the same way as for the driving pulse supply unit 110 for the interlaced driving of the IT-CCD 100.

The image output signals respectively of the first to eighth fields can be obtained through operation similar to the operation (in the IT-CCD 100 of the first embodiment) to obtain an image output signal of one field for the interlaced driving when one frame is divided into four fields. For each field, one signal charge readout process and two image signal output processes are executed. By executing the operation from the first field to the eighth field, image output signals of one frame can be obtained.

In the IT-CCD 200, interlaced field image data can be also obtained through an operation similar to the operation to obtain the interlaced field image data in the IT-CCD 100. Frame image data is also obtained through an operation similar to the operation to obtain the frame image data in the IT-CCD 100.

In the IT-CCD 200, eight-phase driving is possible for each vertical transfer CCD 35. In a CCD of eight-phase drive type, it is possible to form one potential well throughout successive six to seven charge transfer stages to transfer signal charge accumulated therein. In a CCD of four-phase drive type, it is possible to form one potential well throughout successive two to three charge transfer stages to transfer signal charge accumulated therein.

Therefore, when each of the transfer electrodes 31 and 32 has an equal design pattern, the CCD of eight-phase drive type can transfer signal charge which is two to three times the signal charge which can be transferred by the CCD of four-phase drive type.

Resultantly, in the IT-CCD 200, by narrowing the channel width of the charge transfer channel of each vertical transfer CCD 35, an area of each photoelectric converter 20 and an area of the light receiving section of each pixel can be increased as much as the channel width is narrowed. Sensitivity, a saturation output level, and a dynamic range can be accordingly increased.

Figure 11:
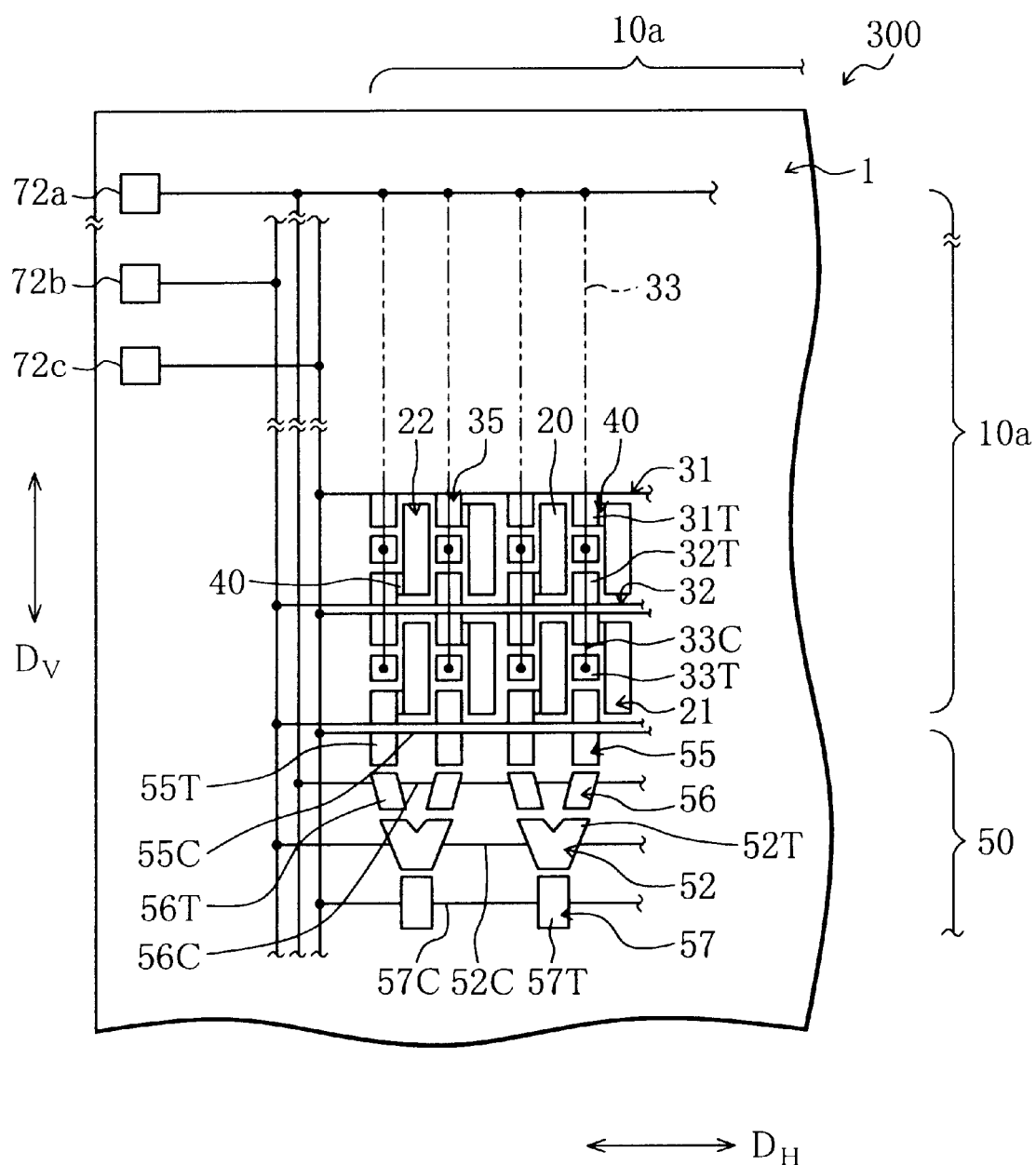
FIG. 11 is a partial plan view schematically showing part of a light sensing section and part of a confluence section in the second embodiment of an IT-CCD.

Referring now to FIG. 11, description will be given of a third embodiment of an IT-CCD of the present invention.

FIG. 11 diagrammatically shows part of a light sensing section 10a and part of the confluence section 50 of an IT-CCD 300 of the third embodiment in a partial plan view. FIG. 11 shows the (7,1) pixel, the (7,2) pixel, the (7,3) pixel, the (7,4) pixel, the (8,1) pixel, the (8,2) pixel, the (8,3) pixel, and the (8,4) pixel and part of downstream sections of these pixels.

Also shown in FIG. 11 are three pulse supply terminals 72a, 72b, and 72c to supply driving pulses to various transfer electrodes formed in the light sensing section 10a and the confluence section 50.

The IT-CCD 300 shown in FIG. 11 is structurally equal to the IT-CCD 100 excepting (i) the kinds and the number of transfer electrodes formed in the light sensing section and a relationship between the transfer electrodes, (ii) the number of pulse supply terminals to respectively supply predetermined driving pulses to each transfer electrode, each joining channel transfer electrode, and the first to fifth subordinate transfer electrodes, and (iii) specifications respectively of wiring between the pulse supply terminals and the transfer electrodes, the joining channel transfer electrodes, and the first to fifth subordinate transfer electrodes.

In FIG. 11, the same constituent components as those of FIG. 1 are assigned with the same reference numerals and description thereof will be avoided. However, the transfer electrodes 31 and 32 will be described again.

As shown in FIG. 11, three kinds of transfer electrodes 31, 32, and 33 are disposed in the light sensing section 10a. Eight transfer electrodes 31, eight transfer electrodes 32, and transfer electrodes 33 are disposed.

The transfer electrodes 31 and 32 are alternately formed from an upstream side to a downstream side. The transfer path forming section 31T is isolated from the transfer path forming section 32T formed adjacent thereto on a downstream side thereof.

Each transfer electrode 33 has eight transfer path forming sections 33T each of which has a rectangular contour in a plan view. Two adjacent transfer path forming sections 33T of one transfer electrode 33 are linked with each other by a band-shaped connecting section 33C extending in the column direction $D_V$. Each connecting section 33C is formed over the transfer path forming sections 31T and 32T with an electrically insulating film between the section 33C and the sections 31T and 32T.

The transfer path forming section 33T is disposed between the transfer path forming section 31T and the transfer path forming section 32T formed on the downstream side and adjacent to the transfer path forming section 31T. Each of the transfer path forming sections 33T disposed in the column direction $D_H$(FIG. 11) intersects an associated one of the charge transfer channels in a plan view. The intersection between the transfer path forming section 33T and the associated one charge transfer channel serves as one charge transfer stage.

The transfer path forming section 31T, the transfer path forming section 33T formed immediately on the downstream side of the transfer path forming section 31T, and the transfer path forming section 32T formed immediately on the downstream side of the transfer path forming section 33T are in the overlapped transfer electrode structure. The transfer path forming section 33T corresponds to a high-layer electrode, the transfer path forming section 31T corresponds to a middle-layer electrode, and the transfer path forming section 32T corresponds to a low-layer electrode.

In the IT-CCD 300, one pixel includes (a) one photoelectric converter 20, (b) three charge transfer stages formed adjacent to the photoelectric converter 20 on the left side (the left side in FIG. 11) of the photoelectric converter 20, namely, the charge transfer stage including the transfer path forming section 31T, the charge transfer stage including the transfer path forming section 33T, and the charge transfer stage including the charge transfer path forming section 32T, and (c) one readout gate 40 formed between the charge transfer stage including the charge transfer path forming section 31T or 32T and the photoelectric converter 20.

Three pulse supply terminals 72a, 72b, and 72c are disposed outside the light sensing section 10a.

The pulse supply terminal 72a is electrically connected to each transfer electrode 33, the second subordinate transfer electrode 56 and the fourth subordinate transfer electrode 58, not shown (FIG. 1). The pulse supply terminal 72b is electrically connected to each transfer electrode 32, the joining channel transfer electrodes 52, and the fifth subordinate transfer electrode 59, not shown (FIG. 1). The pulse supply terminal 72c is electrically connected to each transfer electrode 31, the first subordinate transfer electrode 55, and the third subordinate transfer electrode 57.

Like the IT-CCD 100, the IT-CCD 300 has the joining channels 51. Consequently, for the same reason as for the IT-CCD 100, a high-pixel-density IT-CCD having, for example, two million pixels can be produced using ordinary fine patterning technique. The increase in the consumption power can be easily suppressed.

By disposing a light shielding film in the IT-CCD 300, it is possible to prevent unnecessary photoelectric conversion in the vertical transfer CCDs 35 and the output transfer path 60.

By disposing a microlens array, photoelectric conversion efficiency of the photoelectric converters 20 can be increased. The microlens array can be formed in a procedure similar to, for example, the forming procedure of the microlens array described for the IT-CCD 100 as the first embodiment.

By disposing a color filter array, an IT-CCD for color images can be obtained. The color filter array can be formed in a procedure similar to, for example, the forming procedure of the color filter array described for the IT-CCD 100 as the first embodiment.

The IT-CCD 300 configured as shown in FIG. 11 is an IT-CCD for which the interlaced driving is possible. For the interlaced driving of the IT-CCD 300, predetermined vertical pulses are respectively applied to the pulse supply terminals 72a, 72b, or 72c. The horizontal pulse signal Ha is applied to the pulse supply terminal 75a not shown (FIG. 1) and the horizontal pulse signal Hb is supplied to the pulse supply terminal 75b not shown (FIG. 1).

Figure 12:
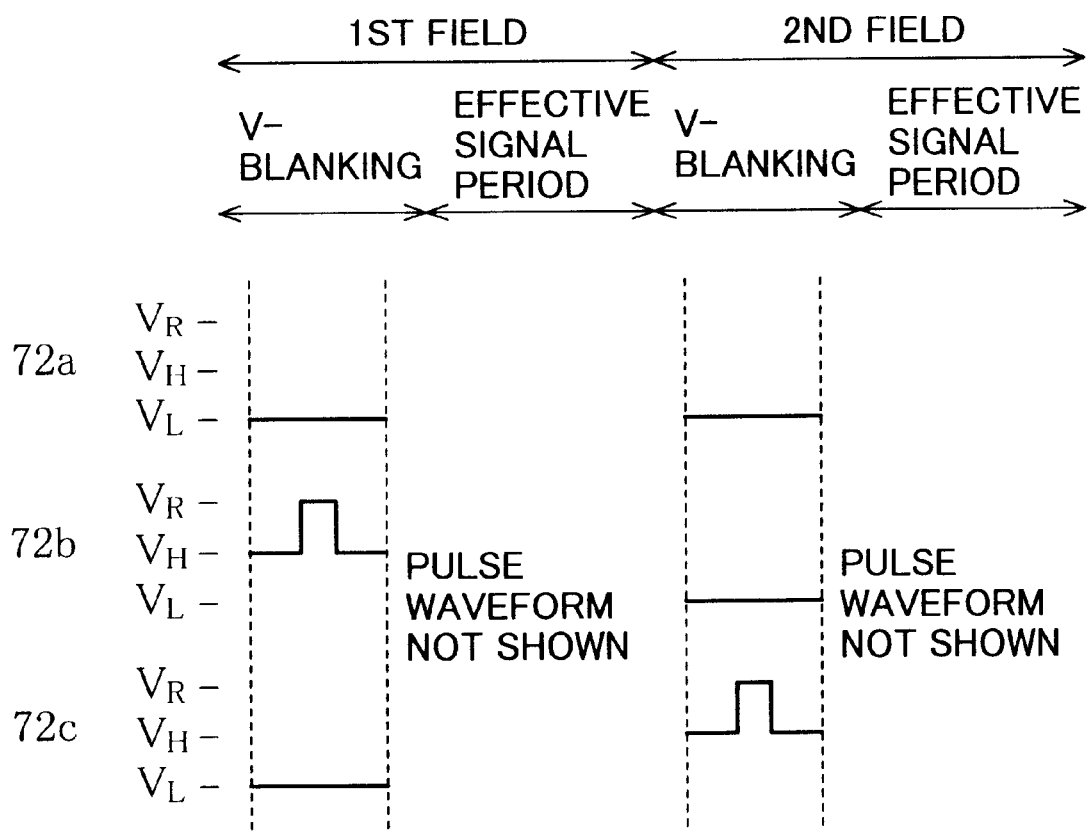
FIG. 12 is a graph showing pulse waveforms of an example of a reading pulse to conduct a progressive scan in a third embodiment of an IT-CCD.

FIG. 12 shows an example of reading pulses for the interlaced driving of the IT-CCD 300 when one frame is divided into two fields (i) and (ii) as follows.
(i) First field including each pixel of odd columns.
(ii) Second field including each pixel of even columns.

The driving pulse supply unit for the interlaced driving of the IT-CCD 300 is configured in the same way as for the driving pulse supply unit 110 for the interlaced driving of the IT-CCD 100 (FIG. 7). Each vertical transfer CCD 35 is operated by three-phase driving.

The image output signals respectively of the first and second fields can be obtained through operation similar to the operation (in the IT-CCD 100 of the first embodiment) to obtain an image output signal of one field for the interlaced driving when one frame is divided into four fields. For each field, one signal charge readout process and eight image signal output processes are executed. By executing the operation from the first field to the second field, image output signals of one frame can be obtained.

By repeating the operation executed during a period from the first V blanking to the effective signal period of the second field, an image output signal of each field is sequentially outputted from the output unit.

Frame image data can be obtained through an operation similar to the operation to obtain the frame image data in the IT-CCD 100 of the first embodiment.

Figure 13:
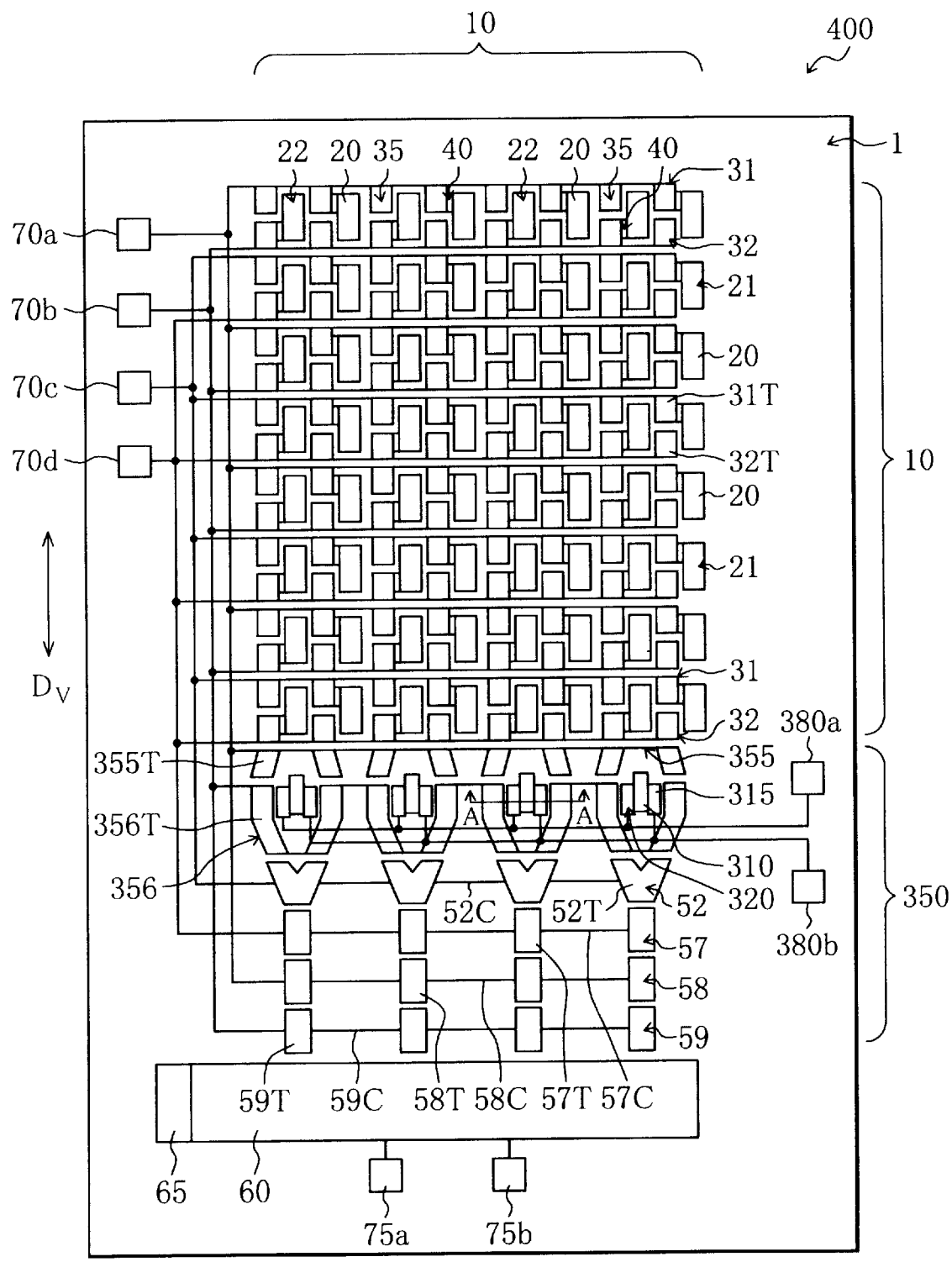
FIG. 13 is a plan view schematically showing a fourth embodiment of an IT-CCD.
Figure 14:
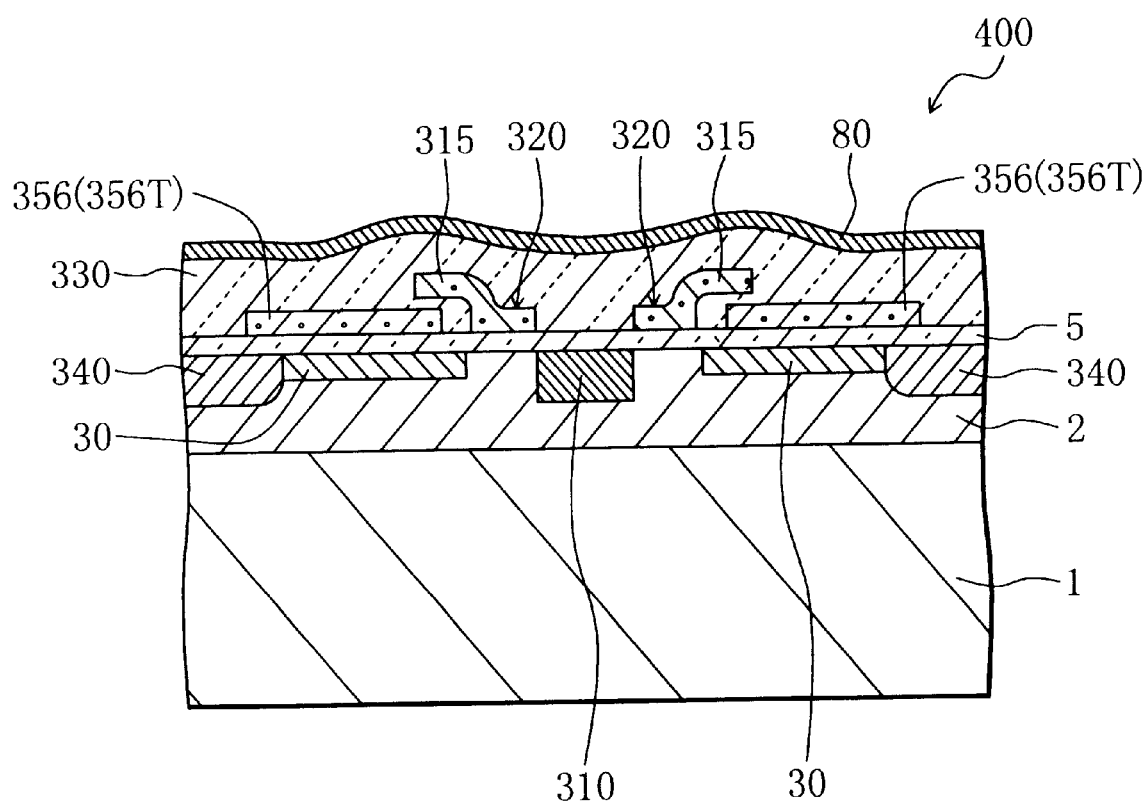
FIG. 14 is a cross-sectional view schematically showing a cross section along line A—A of FIG. 13.

Referring now to FIGS. 13 and 14, description will be given of a fourth embodiment of an IT-CCD of the present invention.

FIG. 13 diagrammatically shows an IT-CCD 400 in the fourth embodiment in a partial plan view.

FIG. 14 is a cross-sectional view showing a cross section of the configuration FIG. 13 taken along line A—A.

The IT-CCD 400 shown in FIGS. 13 and 14 is structurally equal to the IT-CCD 100 excepting (i) the contour of subordinate transfer path forming sections of the first subordinate transfer electrode, (ii) the contour of subordinate transfer path forming sections of the second subordinate transfer electrode, (iii) the contour of the charge transfer channels, (iv) presence or absence of drain regions in the confluence section, (v) presence or absence of exhaust gates in the confluence section, and (vi) the contour of a channel stop region formed in the confluence section.

In FIGS. 13 and 14, the same constituent components as those of FIG. 1 or 6 are assigned with the same reference numerals and description thereof will be avoided.

The contour of a subordinate transfer path forming section 355T of a first subordinate transfer electrode 355 differs from that of the subordinate transfer path forming section 55T in the IT-CCD 100 shown in FIG. 1. The contour of a subordinate transfer path forming section 356T of a second subordinate transfer electrode 356 also differs from that of the subordinate transfer path forming section 56T in the IT-CCD 100 shown in FIG. 1.

The contours of the subordinate transfer path forming sections 355T and 356T are selected to facilitate arrangement of a drain region and an exhaust gate, which will be described later, in the semiconductor substrate 1.

Each of odd-numbered subordinate transfer path forming sections 355T relative to the left end of FIG. 13 extends in a lower-left direction from an upstream side to a downstream side. Each of even-numbered subordinate transfer path forming sections 355T relative to the left end of FIG. 13 extends in a lower-right direction from an upstream side to a downstream side.

Each of odd subordinate transfer path forming sections 356T relative to the left end of FIG. 13 first extends directly from an upstream side to a downstream side and then changes its direction to extend in a lower-right direction from an upstream side to a downstream side. Each of even subordinate transfer path forming sections 356T relative to the left end of FIG. 13 first extends directly from an upstream side to a downstream side and then changes its direction to extend in a lower-left direction from an upstream side to a downstream side.

Each charge transfer channel of the IT-CCD 400 has a contour in the light sensing section 10 which is the same as that of each charge transfer channel 30 in the light sensing section 10 of the IT-CCD 100 shown in FIG. 1.

However, each transfer channel of the odd vertical transfer CCD 35 relative to the left end of FIG. 13 enters the confluence section 350 and then considerably changes its direction to reach the joining channel 51 (FIG. 5). That is, the transfer channel first extends in a lower-left direction from an upstream side to a downstream side, changes its direction to extend directly from an upstream side to a downstream side, and changes again its direction to extend in a lower-right direction from an upstream side to a downstream side to reach the joining channel 51 (FIG. 5).

Each transfer channel of the even vertical transfer CCD 35 relative to the left end of FIG. 13 also enters the confluence section 350 and then considerably changes its direction to reach the joining channel 51 (FIG. 5). That is, the transfer channel first extends in a lower-right direction from an upstream side to a downstream side, changes its direction to extend directly from an upstream side to a downstream side, and changes again its direction to extend in a lower-left direction from an upstream side to a downstream side to reach the joining channel 51 (FIG. 5).

Between the first and second subordinate transfer path forming sections 356T relative to the left end of FIG. 13 in a plan view, one drain region 310 is formed. Similarly, one drain region 310 is formed between the third and fourth subordinate transfer path forming sections 356T relative to the left end of FIG. 13 in a plan view, between the fifth and sixth subordinate transfer path forming sections 356T relative to the left end of FIG. 13 in a plan view, and between the seventh and eighth subordinate transfer path forming sections 356T relative to the left end of FIG. 13 in a plan view.

As shown in FIG. 14, each drain region 310 is disposed by forming an n$^+$-type region at a predetermined location in the p-type well 2 formed in the semiconductor substrate 1. Each drain region 310 has a rectangular contour elongated in the column direction $D_y$ in a plan view. Between the drain region 310 and the charge transfer channel 30 adjacent thereto, the p-type well 2 is disposed.

An exhaust gate electrode 315 is formed over the p-type well 2 between the drain region 310 and the charge transfer channel 30 adjacent thereto to cover the p-type well 2 in a plan view. The exhaust gate electrode 315 is formed on a surface of the electrically insulating film 5 formed on the surface of the semiconductor substrate 1.

One exhaust gate electrode 315 and the p-type well 2 below the exhaust gate electrode 315, i.e., the p-type well 2 between the drain region 310 and the charge transfer channel 30 adjacent thereto constitute one exhaust gate 320.

An edge section of the exhaust gate electrode 315 on the side of the subordinate transfer path forming section 356T overlaps with an edge section of the subordinate transfer path forming section 356T on the side of the drain region 310. However, the exhaust gate electrode 315 is insulated from the subordinate transfer path forming section 356T by an electrically insulating layer 330. The layer 330 is constituted with, for example, an electrically insulating layer formed on a surface of the subordinate transfer path forming section 356T and includes an electrically insulating layer formed on the exhaust gate electrode 315.

One exhaust gate 320, one charge transfer stage constituted with the transfer path forming section 356T, and one drain region 310 constitute one insulated-gate transistor.

In the IT-CCD 400 shown in FIG. 14, the light shielding film 80 (FIGS. 6A and 6B) is formed on the electrically insulating layer 330.

Two adjacent charge transfer channels 30 are isolated from each other by a channel stop region 340 (FIG. 14) excepting the area in which the exhaust gate 320 is formed.

Like the IT-CCD 100, the IT-CCD 400 has the joining channels 51. Consequently, for the same reason as for the IT-CCD 100, a high-pixel-density IT-CCD having, for example, two million pixels can be produced using ordinary fine patterning technique. The increase in the consumption power can be easily suppressed.

By disposing a light shielding film in the IT-CCD 400, it is possible to prevent unnecessary photoelectric conversion in the vertical transfer CCDs 35 and the output transfer path 60.

By disposing a microlens array, photoelectric conversion efficiency of the photoelectric converters 20 can be increased. The microlens array can be formed in a procedure similar to, for example, the forming procedure of the microlens array described for the IT-CCD 100 as the first embodiment.

By disposing a color filter array, an IT-CCD for color images can be obtained. The color filter array can be formed in a procedure similar to, for example, the forming procedure of the color filter array described for the IT-CCD 100 as the first embodiment.

The interlaced driving is possible for the IT-CCD 400 in the same way as for the IT-CCD 100 of the first embodiment.

As in the IT-CCD 100, each vertical transfer CCD 35 transfers the signal charge and the noise signal charge to the joining charge transfer stage. In the IT-CCD 400, the noise signal charge can be exhausted to the drain region 310.

To exhaust the noise signal charge to the drain region 310, each odd-numbered exhaust gate electrode 315 relative to the left end of FIG. 14 is electrically connected to one pulse supply terminal 380$a$. Each even-numbered exhaust gate electrode 315 relative to the left end of FIG. 14 is electrically connected to one pulse supply terminal 380$b$.

At a predetermined time, a control voltage $V_{ON}$ or $V_{OFF}$ is applied to the pulse supply terminals 380$a$ and 380$b$. The control voltage $V_{OFF}$ is a sufficiently low positive voltage, zero volt, or a sufficiently low negative voltage such that charge of the charge transfer channel 30 is not exhausted to the drain region 310. The control voltage $V_{ON}$ is a sufficiently high positive voltage such that the charge dispersed in the subordinate charge transfer stage consisting of the subordinate transfer path forming section 356T is entirely exhausted to the drain region 310.

Figure 15:
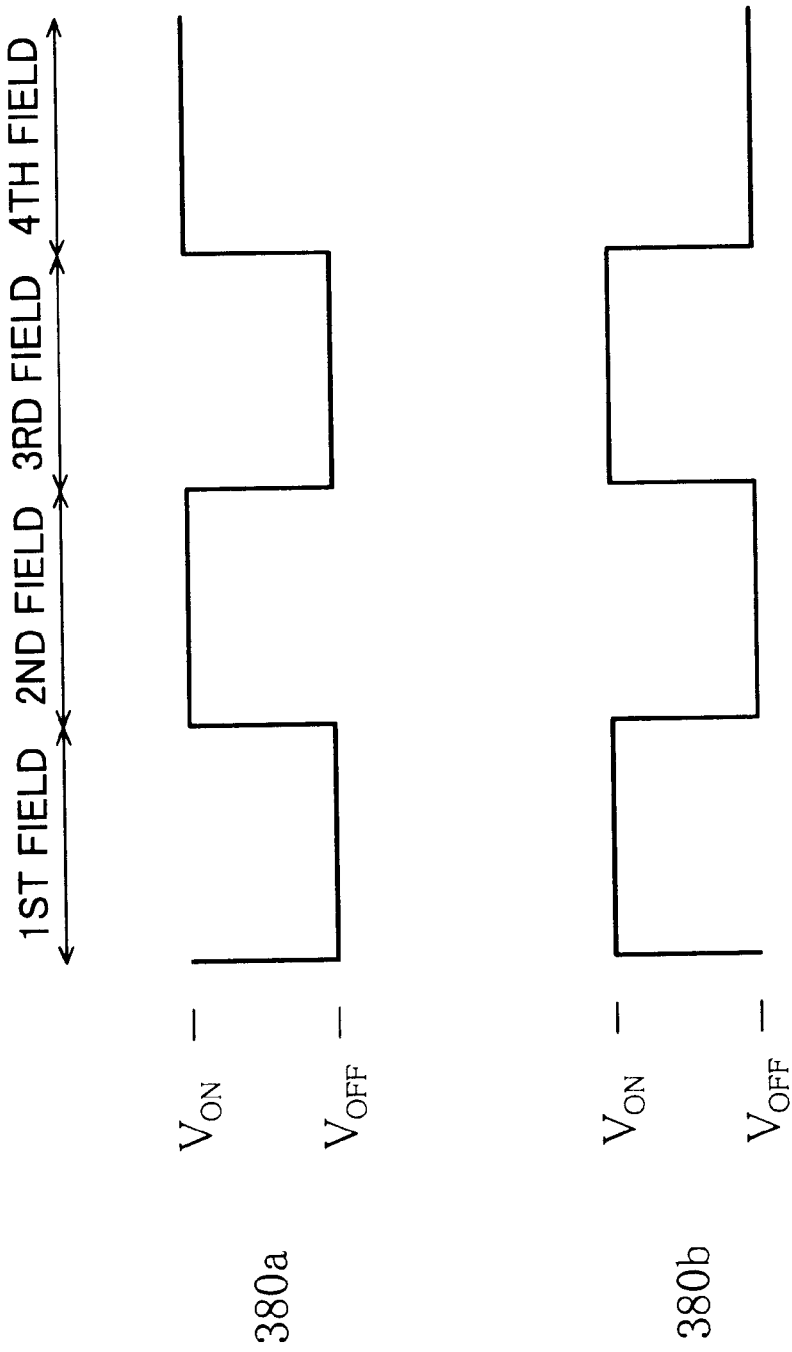
FIG. 15 is a graph showing pulse waveforms of an example of a control voltage for noise reduction in the fourth embodiment of an IT-CCD.

FIG. 15 shows an example of timing to apply the control voltages $V_{ON}$ and $V_{OFF}$.

From the V blanking of the first or third field to termination of the effective signal period, the control voltage $V_{OFF}$ is applied to the pulse supply terminal 380a, and a predetermined control voltage $V_{ON}$ is applied to the pulse supply terminal 380b. By the control voltage $V_{OFF}$, each odd exhaust gate 320 relative to the left end of FIG. 13 is closed. By the control voltage $V_{ON}$, each even exhaust gate 320 relative to the left end of FIG. 13 is opened.

In the state, when noise signal charge is transferred to each subordinate charge transfer stage including an even-numbered subordinate transfer path forming section 356T relative to the left end of FIG. 13, the noise signal charge is exhausted to the associated drain region 310 (noise reduction process).

From the V blanking of the second or fourth field to termination of the effective signal period, the control voltage $V_{ON}$ Is applied to the pulse supply terminal 380a, and the control voltages $V_{OFF}$ is applied to the pulse supply terminal 380b.

In the state, when noise signal charge is transferred to each subordinate charge transfer stage including an odd-numbered subordinate transfer path forming section 356T relative to the left end of FIG. 13, the noise signal charge is exhausted to the associated drain region 310 (noise reduction process).

A driving pulse supply unit for the interlaced driving of the IT-CCD 400 is configured, for example, by adding an exhaust gate control circuit to the driving pulse supply unit 110 shown in FIG. 7. The exhaust gate control circuit applies the control voltage $V_{ON}$ or $V_{OFF}$ to the pulse supply terminal 380a or 380b.

Description will now be given of an IT-CCD according to a fifth embodiment by referring to FIGS. 16, 17, 18A, 18B, 19A, and 19B.

Figure 16:
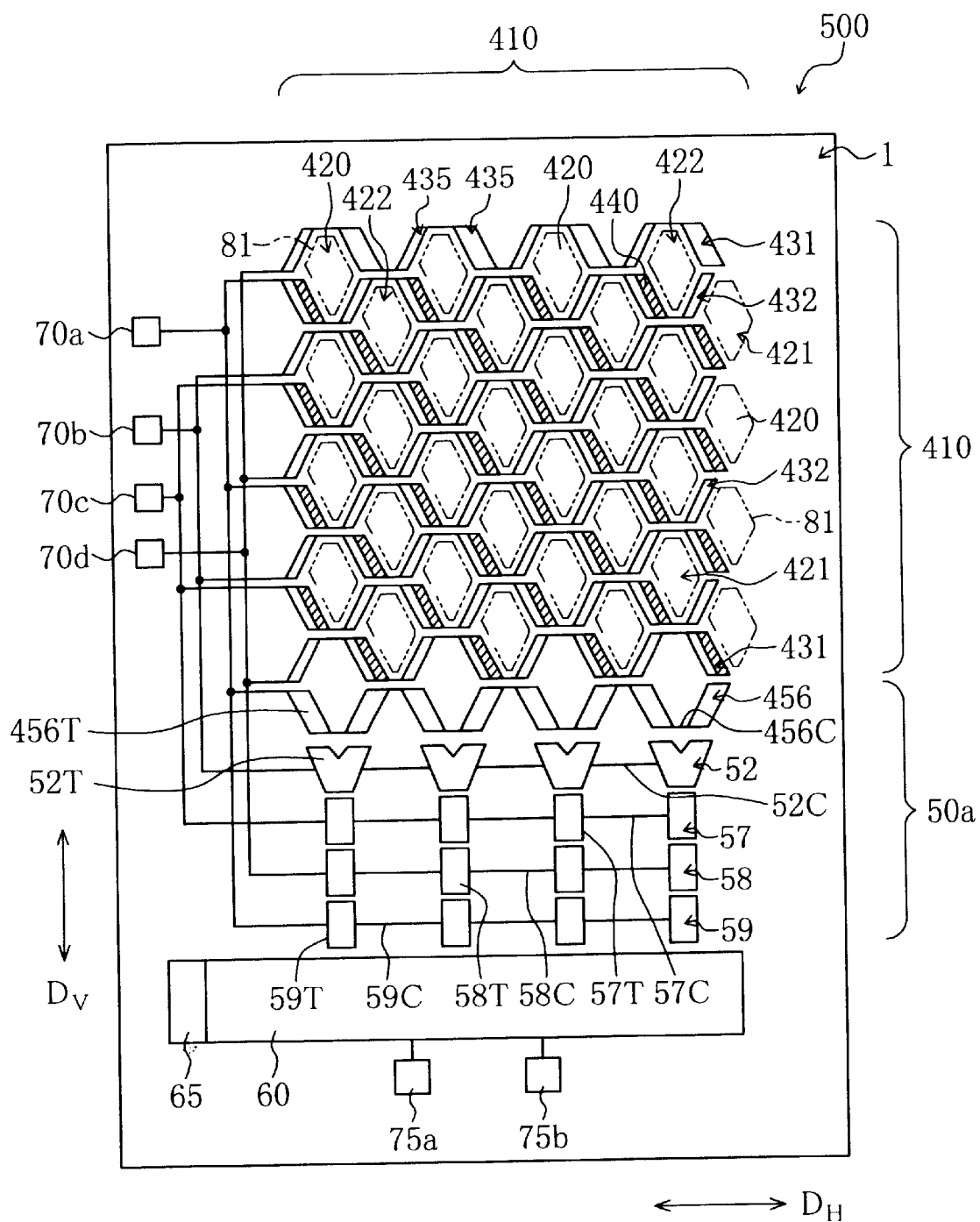
FIG. 16 is a plan view schematically showing a fifth embodiment of an IT-CCD.

FIG. 16 diagrammatically shows an IT-CCD of interlaced drive type 500 according to the fifth embodiment in a plan view.

Figure 17:
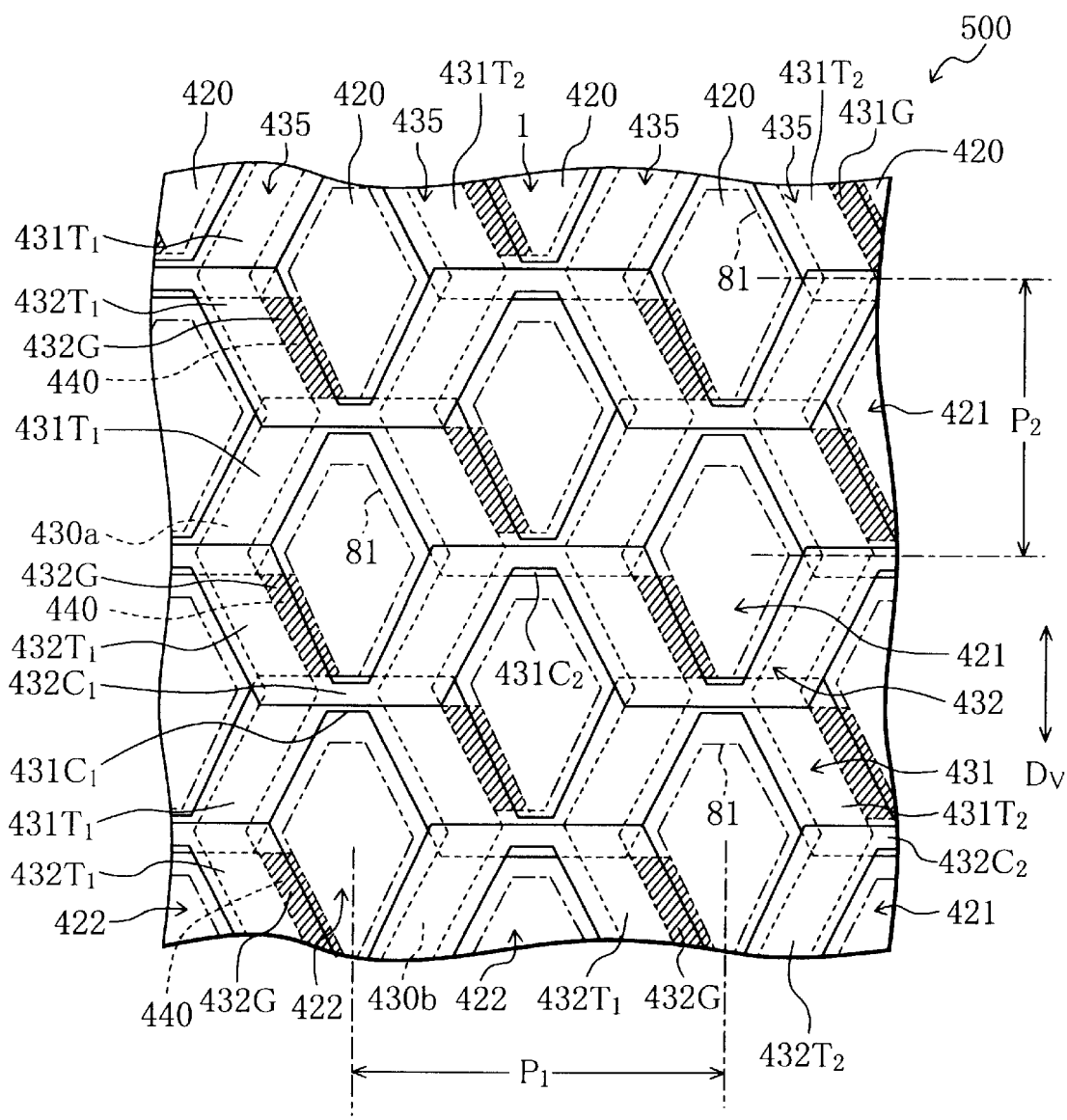
FIG. 17 is a magnified plan view showing part of the light sensing section in the fifth embodiment of an IT-CCD.

FIG. 17 shows a magnified view of part of a light sensing section 410 of the IT-CCD 500 in a plan view.

Figure 18A:
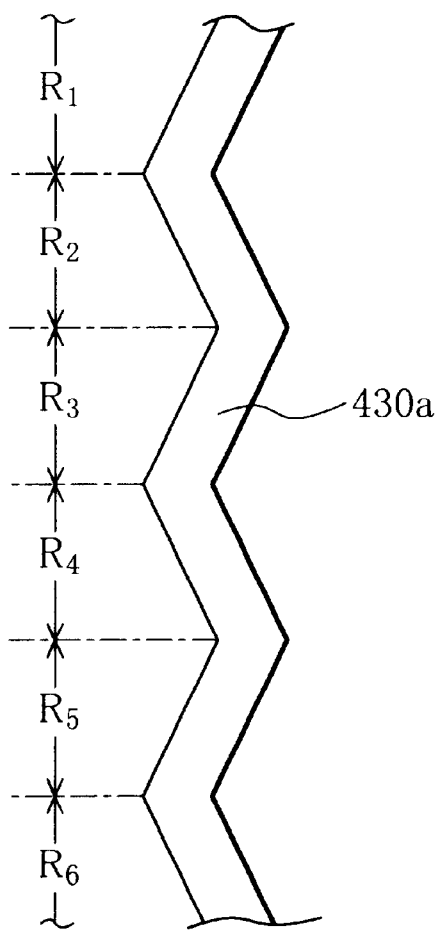
FIG. 18A is a plan view schematically showing a charge transfer channel of the fifth embodiment of an IT-CCD.
Figure 18B:
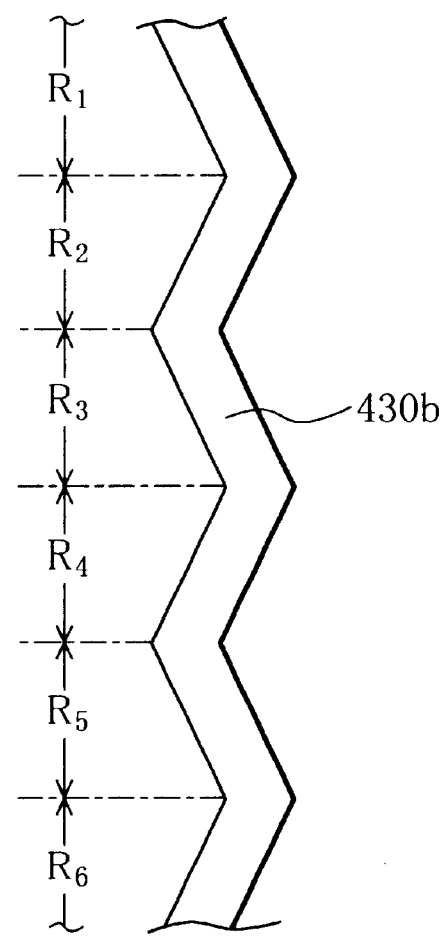
FIG. 18B is a plan view schematically showing another charge transfer channel of the fifth embodiment of an IT-CCD.

FIG. 18A is a plan view diagrammatically showing the charge transfer channel 430a of FIG. 17. FIG. 18B is a plan view diagrammatically showing the charge transfer channel 430b of FIG. 17.

Figure 19A:
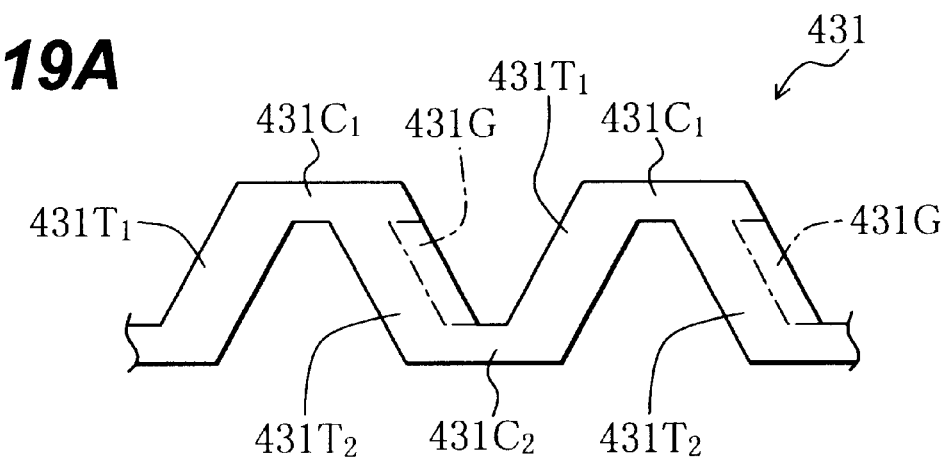
FIG. 19A is a plan view schematically showing a transfer electrode of the fifth embodiment of an IT-CCD.
Figure 19B:
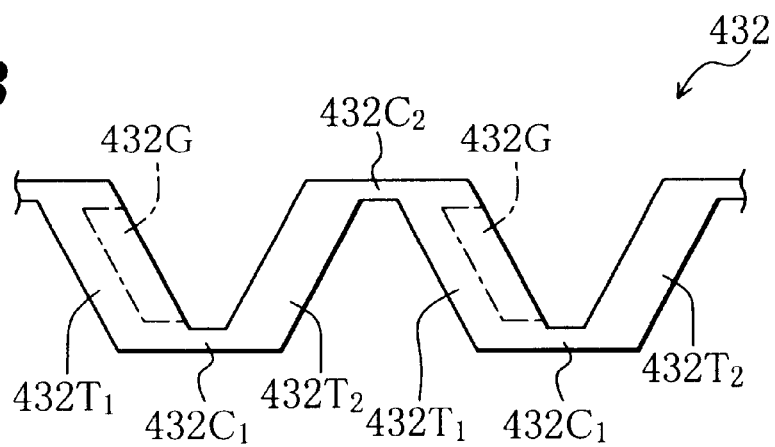
FIG. 19B is a plan view schematically showing another transfer electrode of the fifth embodiment of an IT-CCD.

FIG. 19A is a plan view diagrammatically showing the transfer electrode 431 of FIG. 17. FIG. 19B is a plan view diagrammatically showing the transfer electrode 432 of FIG. 17.

Figure 20:
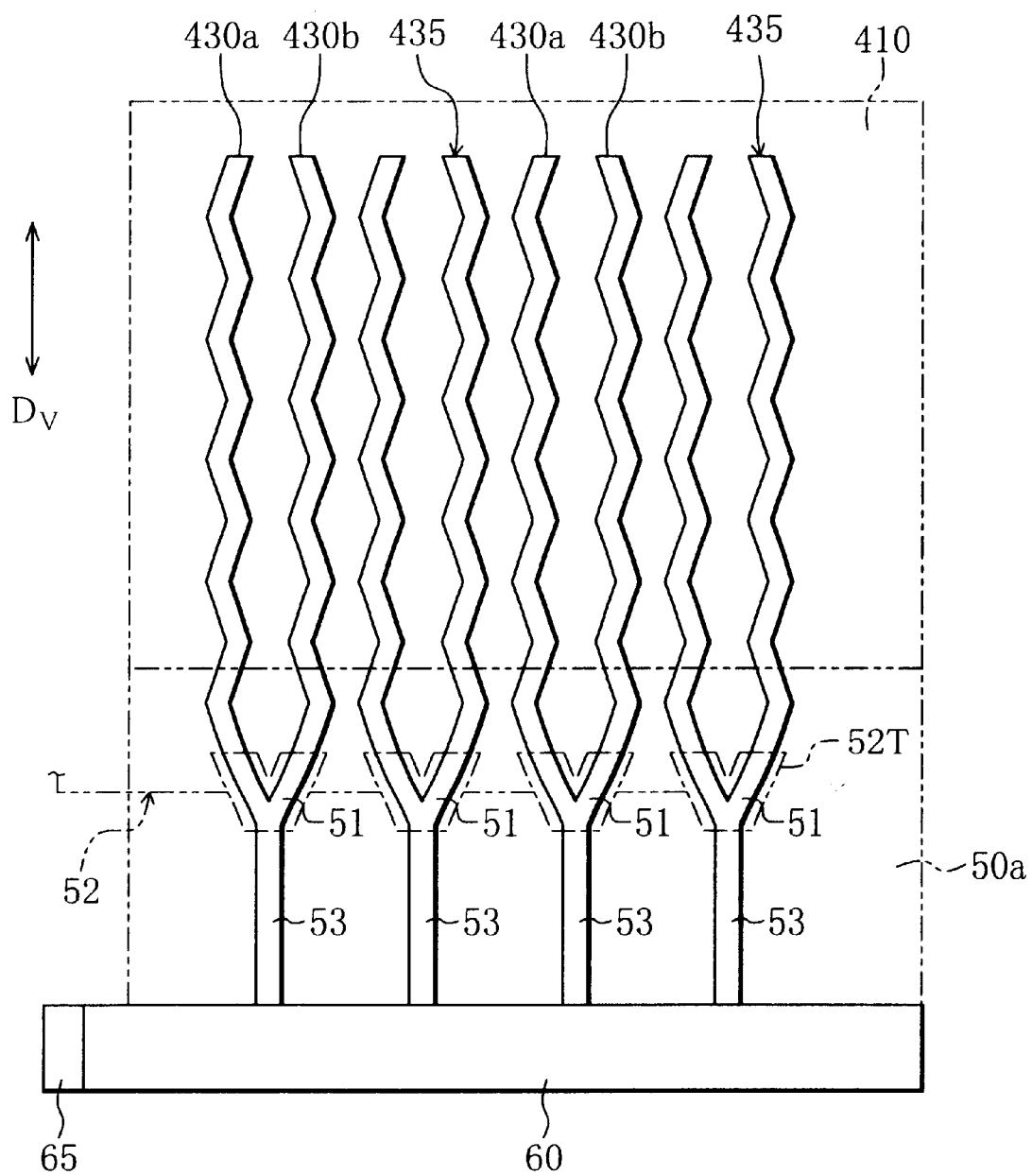
FIG. 20 is a plan view showing an outline of a layout of a light sensing section, charge transfer channels, joining channels, and an output transfer path in the fifth embodiment of an IT-CCD.

FIG. 20 diagrammatically shows a layout of the light sensing section 410, the charge transfer channels 430a and 430b, the joining channels 51, and the output transfer path 60 in a plan view.

The IT-CCD 500 of FIG. 16 is structurally similar to the IT-CCD 100 excepting (i) shifted-pixel layout of 32 pixels and (ii) reduction of the number of subordinate charge transfer stages formed between the light sensing section and one joining charge transfer stage from two to one. In FIGS. 16, 17, 18A, 18B, 19A, 19B, and 20, the same constituent elements as those of FIGS. 1, 3, and 5 and FIGS. 6A and 6B are assigned with the same reference numerals and description thereof will be avoided.

In the light sensing section 410 on a surface of the semiconductor substrate 1, 32 photoelectric converters 420 are disposed in eight rows and in eight columns in the shifted-pixel layout. Eight photoelectric converter rows 421 and eight photoelectric converter columns 422 are formed in the surface of the semiconductor substrate 1 for the light sensing section 410.

Each photoelectric converter (signal charge accumulating region) 420 in an even photoelectric converter row 421 is shifted in the row direction $D_H$ relative to an associated photoelectric converter (signal charge accumulating region) 420 of an odd photoelectric converter row 421 by about one half of a pitch $P_1$ of the photoelectric converters 420 of each photoelectric converter row (FIG. 17). Similarly, each photoelectric converter 420 in an even photoelectric converter column 422 is shifted in the column direction $D_v$ relative to an associated photoelectric converter (signal charge accumulating region) 420 of an odd photoelectric converter column 422 by about one half of a pitch $P_2$ of the photoelectric converters 420 of each photoelectric converter column (FIG. 17).

In this specification, "about one half of a pitch $P_1$" indicates, in addition to $P_1/2$, any value which differs from $P_1/2$ due to factors such as a manufacturing error, a rounding error of the pixel position in the design or the mask process and which however can be regarded substantially as equal to $P_1/2$ in consideration of performance of a pertinent IT-CCD and image quality of the IT-CCD. This also applies to "about one half of a pitch $P_2$" in this specification.

As shown in FIG. 17, each photoelectric converter 420 has substantially a hexagonal contour in a plan view. The photoelectric converters 420 are substantially equal in size and direction to each other in plan view.

Two kinds of charge transfer channels 430a and 430b are alternately formed in the row direction $D_H$ (FIG. 17). The total number of the charge transfer channels 430a and 430b is four, respectively. Contours of the charge transfer channels 430a and 430b are substantially axi-symmetric in a plan view.

As shown in FIGS. 17, 18A, and 18B, each of the charge transfer channels 430a and 430b including a plurality of constituent sections generally extends in the column direction $D_H$, locally meandering at boundaries between the constituent sections thereof. In FIGS. 18A and 18B, $R_1$ to $R_6$ respectively indicate constituent sections of the charge transfer channels 430a and 430b.

In each charge transfer channel 430a, a readout gate 440 is formed on the right of each even section of the channel 430a relative to an upper stream edge of the light sensing section 410. In each charge transfer channel 430b, a readout gate 440 is formed on the right of each odd section (excepting a first section) of the channel 430b relative to an upper stream edge of the light sensing section 410. Each readout gate 440 is also contiguous to an associated photoelectric converter 420.

The charge transfer channels 430a and 430b are isolated from each other by a channel stop region, not shown, excepting an area in which the readout gate 440 is formed. In one photoelectric converter column 422, two adjacent photoelectric converters 420 are also isolated from each other by a channel stop region, not shown.

Two kinds of transfer electrodes 431 and 432 are formed in generally a honeycomb contour to cross the charge transfer channels 430a and 430b in a plan view (FIG. 17).

As shown in FIG. 19A, each transfer electrode 431 includes a predetermined number of two kinds of connecting sections $431C_1$ and $431C_2$. A transfer path forming section 431T$_1$, continues to a left end of the connecting section 431C$_1$ (the left end of FIG. 19A), and a transfer path forming section 431T$_2$ continues to a right end of the connecting section 431C$_2$ (the right end of FIG. 19A). A transfer path forming section 431T$_2$ continues to a left end of the connecting section 431C$_2$ (the left ends of FIG. 17 and FIG. 19A), and a transfer path forming section 431T$_1$ continues to a right end of the connecting section 431C$_2$ (the right end of FIG. 19A).

In each transfer electrode 431, excepting the transfer electrode 431 formed at an upper-most stream position of the light sensing section 410, the connecting section 431C$_1$ is slightly longer than the connecting section 431C$_2$. In the transfer electrode 431 formed at the upper-most stream position of the light sensing section 410, the connecting section 431C$_1$ is substantially equal in length to the connecting section 431C$_2$.

The total number of transfer path forming sections 431T$_1$ and 431T$_2$ of each transfer electrode 431 is equal to that of charge transfer channels 430a and 430b formed in the light sensing section 410. As shown in FIG. 17, each of the transfer path forming sections 431T$_1$ and 431T$_2$ covers one constituent section of the charge transfer channel 430a or 430b in a plan view to constitute one charge transfer stage together with the constituent section. Each of the transfer path forming sections 431T$_2$, excepting each path forming section 431T$_2$ of the transfer electrode formed at an upper-most stream position of the light sensing section 410, covers one associated readout gate region in a plan view.

The readout gate region is contiguous to a lower-left end (a lower-left end in FIG. 16 or 17) of the photoelectric converter 420 and one constituent section (one constituent section of the charge transfer channel 430a or 430b) adjacent to the lower-left end of the photoelectric converter 420. The readout gate region consists of a predetermined section of a p-type well disposed in the semiconductor substrate 1.

The transfer path forming section 431T$_2$ has width larger than that of the path forming section 431T$_1$. In each transfer path forming section 431T$_2$, a part thereof covering the readout gate region in a plan view serves as a readout gate electrode zone 431G (FIGS. 17 and 19A) to read signal charge from the photoelectric converter 420.

For each photoelectric converter 420 in the even photoelectric converter columns 422 relative to the left end of FIG. 17, one readout gate 440 consist of one readout gate region and one readout gate electrode zone 431G.

As shown in FIG. 19B, each transfer electrode 432 has a predetermined number of two kinds of connecting sections 432C$_1$ and 432C$_2$. A transfer path forming section 432T$_1$ continues to a left end of the connecting section 432C$_1$ (the left end of FIG. 19B), and a transfer path forming section 432T$_2$ continues to a right end of the connecting section 432C$_2$ (the right end of FIG. 19B). A transfer path forming section 432T$_2$ continues to a left end of the connecting section 432C$_2$ (the left end of FIG. 19A), and a transfer path forming section 432T$_1$ continues to a right end of the connecting section 432C$_2$ (the right end of FIG. 19B).

The total number of transfer path forming sections 432T$_1$ and 432T$_2$ of each transfer electrode 432 is equal to that of charge transfer channels 430a and 430b formed in the light sensing section 410. As shown in FIG. 17, each of the transfer path forming sections 432T$_1$ and 432T$_2$ covers one constituent section of the charge transfer channel 430a or 430b in a plan view to constitute one charge transfer stage together with the constituent section. Each of the transfer path forming sections 432T$_1$ covers one associated readout gate region in a plan view. Therefore, the transfer path forming section 432T$_1$ has width larger than that of the path forming section 432T$_2$.

In each transfer path forming section 432T$_1$ part thereof covering the readout gate region in a plan view serves as a readout gate electrode zone 432G (FIGS. 17 and 19A) to read signal charge from the photoelectric converter 420.

For each photoelectric converter 420 in the odd photoelectric converter columns 422 relative to the left end of FIG. 17, one readout gate 440 is constituted with one readout gate region and one readout gate electrode zone 432G.

A charge transfer stage including the transfer path forming section 431T$_1$ and a charge transfer stage including the transfer path forming section 432T$_1$ are alternately disposed to form one vertical transfer CCD 435 (FIG. 17). The vertical transfer CCD 435 generally extends in the column direction D$_V$, locally meandering by changing its direction at boundaries between the charge transfer stages. The vertical transfer CCD 435 transfers, in the column direction D$_V$, signal charge accumulated in each photoelectric converter 420 of the photoelectric converter column 422 (an odd photoelectric converter column 422) formed on the right side (the right side in FIGS. 16 and 17) of and adjacent to the vertical transfer CCD 435.

A charge transfer stage including the transfer path forming section 431T$_2$ and a charge transfer stage including the transfer path forming section 432T$_2$ are alternately disposed to form one vertical transfer CCD 435 (FIG. 17). The vertical transfer CCD 435 generally extends in the column direction D$_V$, locally meandering by changing its direction at boundaries between the charge transfer stages. The vertical transfer CCD 435 transfers, in the column direction D$_V$, signal charge accumulated in each photoelectric converter 420 of the photoelectric converter column 422 (an even photoelectric converter column 422) formed on the right side (the right side in FIGS. 16 and 17) of the vertical transfer CCD 435.

When two adjacent transfer electrodes 431 and 432 intersect one photoelectric converter column 422, the adjacent transfer electrodes 431 and 432 overlap with each other. Specifically, the connecting sections 431C$_1$ and 432C$_1$ or the connecting sections 431C$_2$ and 432C$_2$ overlap with each other. When two adjacent transfer electrodes 431 and 432 intersect the photoelectric converter column 422 next to the photoelectric converter column 422 described above, the transfer electrodes 431 and 432 become apart from each other to surround one photoelectric converter 420 of the pertinent photoelectric converter column 422 in a plan view. The two adjacent transfer electrodes 431 and 432 generally extend in the row direction D$_H$, while changing distance between the electrodes 431 and 432 as above (FIG. 17).

In FIG. 16, when the two adjacent transfer electrodes are in an order of the transfer electrodes 431 and 432 from an upstream side to a downstream side, the transfer electrodes 431 and 432 surround each photoelectric converter 420 of the odd photoelectric converter columns in a plan view. When the two adjacent transfer electrodes are in an order of the transfer electrodes 432 and 431 from an upstream side to a downstream side, the transfer electrodes 432 and 431 surround each photoelectric converter 420 of the even photoelectric converter columns in a plan view.

The two adjacent transfer electrodes 431 and 432 surround one photoelectric converter 420 at each location in which the transfer electrodes 431 and 432 are apart from each other to determine one photoelectric converter region with a hexagonal contour or substantially a hexagonal contour.

Each photoelectric converter region of the odd photoelectric converter columns 422 relative to the left end of FIG. 16 is determined in a plan view by one connecting section $431C_1$ and two adjacent transfer path forming sections $431T_1$ and $431T_2$ with the connecting section $431C_1$ therebetween as well as one connecting section $432C_1$ and two adjacent transfer path forming sections $432T_1$ and $432T_2$ with the connecting section $432C_1$ therebetween.

Each photoelectric converter region of the even photoelectric converter columns 422 relative to the left end of FIG. 16 is determined in a plan view by one connecting section $431C_2$ and two adjacent transfer path forming sections $431T_2$ and $431T_1$ with the connecting section $431C_2$ therebetween as well as one connecting section $432C_2$ and two adjacent transfer path forming sections $432T_2$ and $432T_1$ with the connecting section $432C_2$ therebetween.

In FIG. 16, the transfer electrodes 431 and 432 are separated for easy discrimination therebetween. However, as shown in FIG. 17, the transfer electrodes 431 and 432 overlap with each other between the connecting sections $431C_1$ and $432C_1$ and the connecting sections $431C_2$ and $432C_2$ and between the transfer path forming sections $431T_1$ and $432T_1$ and the transfer path forming sections $431T_2$ and $432T_2$.

When the vertical transfer CCD 435 is absent on the left side of the photoelectric converter column 422 at the left end of the light sensing section 410 (the left end of FIG. 16), each photoelectric converter 420 of the left-most photoelectric converter column 422 need not be surrounded by two adjacent transfer electrodes 431 and 432 in a plan view. That is, left-most transfer path forming sections $431T_1$ and $432T_1$ necessary to surround each photoelectric converter 420 of the left-most photoelectric converter column 422 can be dispensed with. Left-most connecting sections $431C_1$ and $432C_1$ can also be dispensed with. This also applies to a case in which the vertical transfer CCD 435 is absent on the right side of the photoelectric converter column 422 at the right end of the light sensing section 410 (the right end of FIG. 16).

As shown in FIG. 20, each of the charge transfer channels 430a and 430b of the vertical transfer CCD 435 first intersects the light sensing section 410 in the column direction $D_v$ and then extends for one subordinate charge transfer stage toward the output transfer path 60. Two adjacent charge transfer channels 430 is isolated from each other also outside the light sensing section 410 by a channel stop region, not shown.

In the IT-CCD 500, confluence sections 50a (FIG. 16) are structurally equal to the confluence sections 50 of the IT-CCD 100 excepting that the number of subordinate charge transfer stages formed between the light sensing section 410 and one joining charge transfer stage is changed from two to one. To form the subordinate charge transfer stages, one subordinate transfer electrode 456 is disposed between the light sensing section 410 and the joining channel transfer electrode 52 in a plan view (FIG. 16). The subordinate transfer electrode 456 will be referred to as "second subordinate transfer electrode 456" herebelow.

The second subordinate transfer electrode 456 consists of eight subordinate transfer path forming sections 456T and seven connecting sections 456C to connect mutually different subordinate transfer path forming sections 456T to each other. The second subordinate transfer electrode 456 and the transfer electrode 431 formed in the most upstream position of the light sensing section 410 form substantially an axisymmetrical contour.

Like the IT-CCD 100, the IT-CCD 500 has the joining channels 51. Consequently, for the same reason as for the IT-CCD 100, a high-pixel-density IT-CCD having, for example, two million pixels can be produced using ordinary fine patterning technique. The increase in the consumption power can be easily suppressed.

By disposing a light shielding film in the IT-CCD 500, it is possible to prevent unnecessary photoelectric conversion in the vertical transfer CCDs 435 and the output transfer path 60.

By disposing a microlens array, photoelectric conversion efficiency of the photoelectric converters 420 can be increased. The microlens array can be formed in a procedure similar to, for example, the forming procedure of the microlens array described for the IT-CCD 100 as the first embodiment.

By disposing a color filter array, an IT-CCD for color images can be obtained. The color filter array can be formed in a procedure similar to, for example, the forming procedure of the color filter array described for the IT-CCD 100 as the first embodiment.

The IT-CCD 500 can be operated by interlaced driving in the same way as for the IT-CCD 100 by dividing one frame into four fields (i) to (iv) as follows.

(i) First field including each pixel of fourth and eighth pixel rows.
(ii) Second field including each pixel of third and seventh pixel rows.
(iii) Third field including each pixel of second and sixth pixel rows.
(iv) Fourth field including each pixel of first and fifth pixel rows.

In the IT-CCD 500, interlaced field image data can be also obtained through operation similar to the operation to obtain the interlaced field image data in the IT-CCD 100. Frame image data can be also obtained through operation similar to the operation to obtain the frame image data in the IT-CCD 100.

Description will now be given of an IT-CCD according to a sixth embodiment by referring to FIG. 21.

Figure 21:
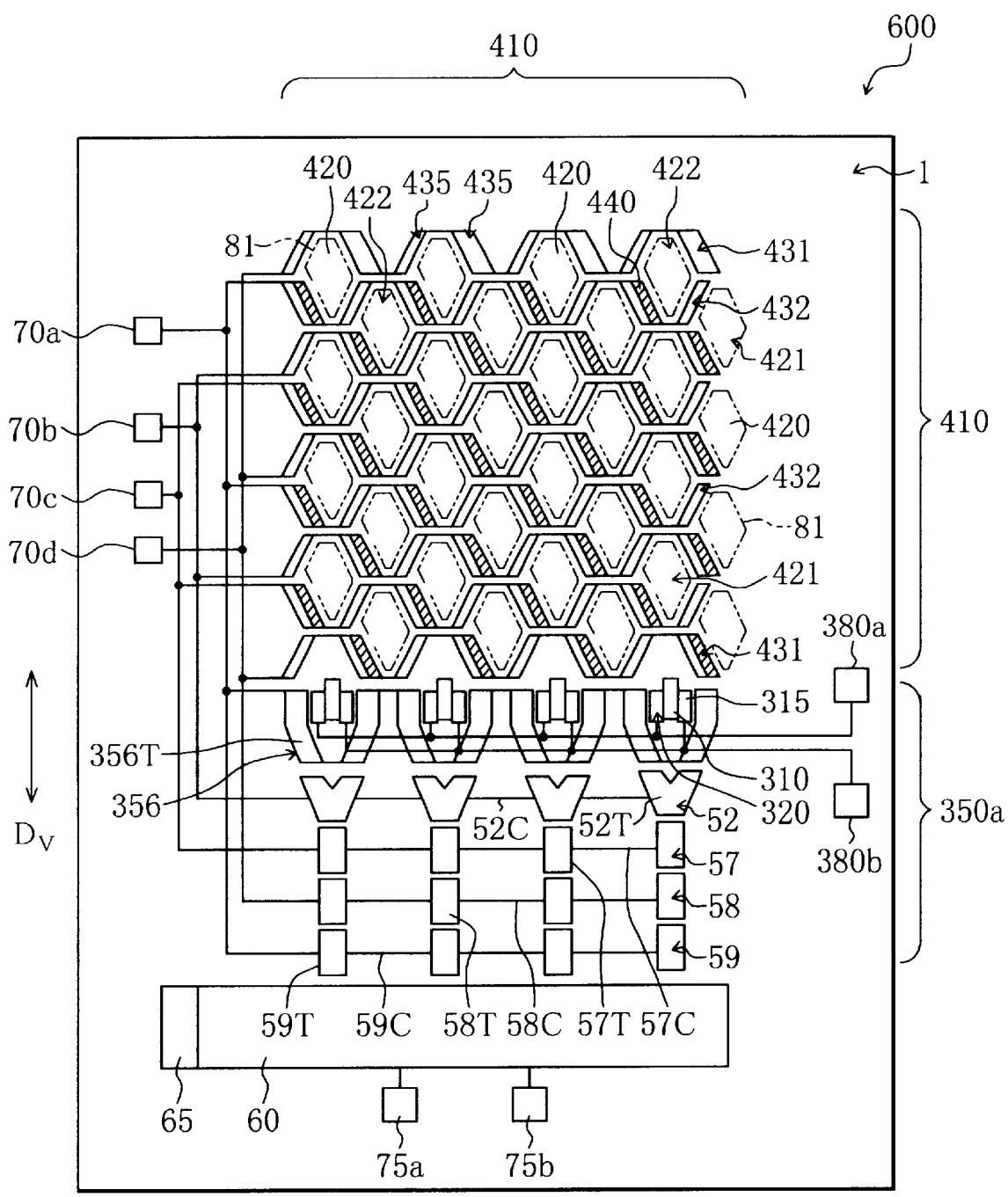
FIG. 21 is a plan view schematically showing a sixth embodiment of an IT-CCD.

FIG. 21 diagrammatically shows an IT-CCD 600 according to the sixth embodiment in a plan view. The IT-CCD 600 has a light sensing section configured in the same way as for the light sensing section 410 (FIG. 16) of the IT-CCD 500 of the fifth embodiment.

The IT-CCD 600 has a confluence section 350a substantially equal in constitution to the confluence section 350 (FIG. 13) of the IT-CCD 400 of the fourth embodiment. When compared with the confluence section 350 of the IT-CCD 400, the number of subordinate charge transfer stages formed between the light sensing section 410 and one joining charge transfer stage is changed from two to one. The subordinate charge transfer stage consisting of the first subordinate transfer electrode 355 and the subordinate transfer path forming section 355T thereof is dispensed with.

In FIG. 21, the same constituent components as those of FIG. 13 or 16 are assigned with the same reference numerals and description thereof will be avoided.

Like the IT-CCD 100, the IT-CCD 600 has the joining channels 51. Consequently, for the same reason as for the IT-CCD 100, a high-pixel-density IT-CCD having, for example, two million pixels can be produced using ordinary fine patterning technique. The increase in the consumption power can be easily suppressed. Occurrence of difference in light collecting efficiency and sensitivity of pixels between two adjacent pixel rows can be easily prevented.

By disposing a light shielding film in the IT-CCD 600, it is possible to prevent unnecessary photoelectric conversion in the vertical transfer CCDs 435 and the output transfer path 60.

By disposing a microlens array, photoelectric conversion efficiency of the photoelectric converters 420 can be increased. The microlens array can be formed in a procedure similar to, for example, the forming procedure of the microlens array described for the IT-CCD 100 as the first embodiment.

By disposing a color filter array, an IT-CCD for color images can be obtained. The color filter array can be formed in a procedure similar to, for example, the forming procedure of the color filter array described for the IT-CCD 100 as the first embodiment.

The IT-CCD 600 can be operated by interlaced driving in the same way as for the IT-CCD 100 by dividing one frame into four fields.

In the image signal output process of each of the first and third fields, each odd vertical transfer CCD 435 relative to the left end of FIG. 21 sequentially transfers noise signal charge. Each even vertical transfer CCD 435 relative to the left end of FIG. 21 sequentially transfers signal charge.

In the image signal output process of each of the second and fourth fields, each even vertical transfer CCD 435 relative to the left end of FIG. 21 sequentially transfers noise signal charge. Each odd vertical transfer CCD 435 relative to the left end of FIG. 21 sequentially transfers signal charge.

The noise signal charge can be exhausted to the drain region 310 by applying a control voltage $V_{ON}$ or $V_{OFF}$ to the pulse supply terminals 380a and 380b at a predetermined time.

Figure 22:
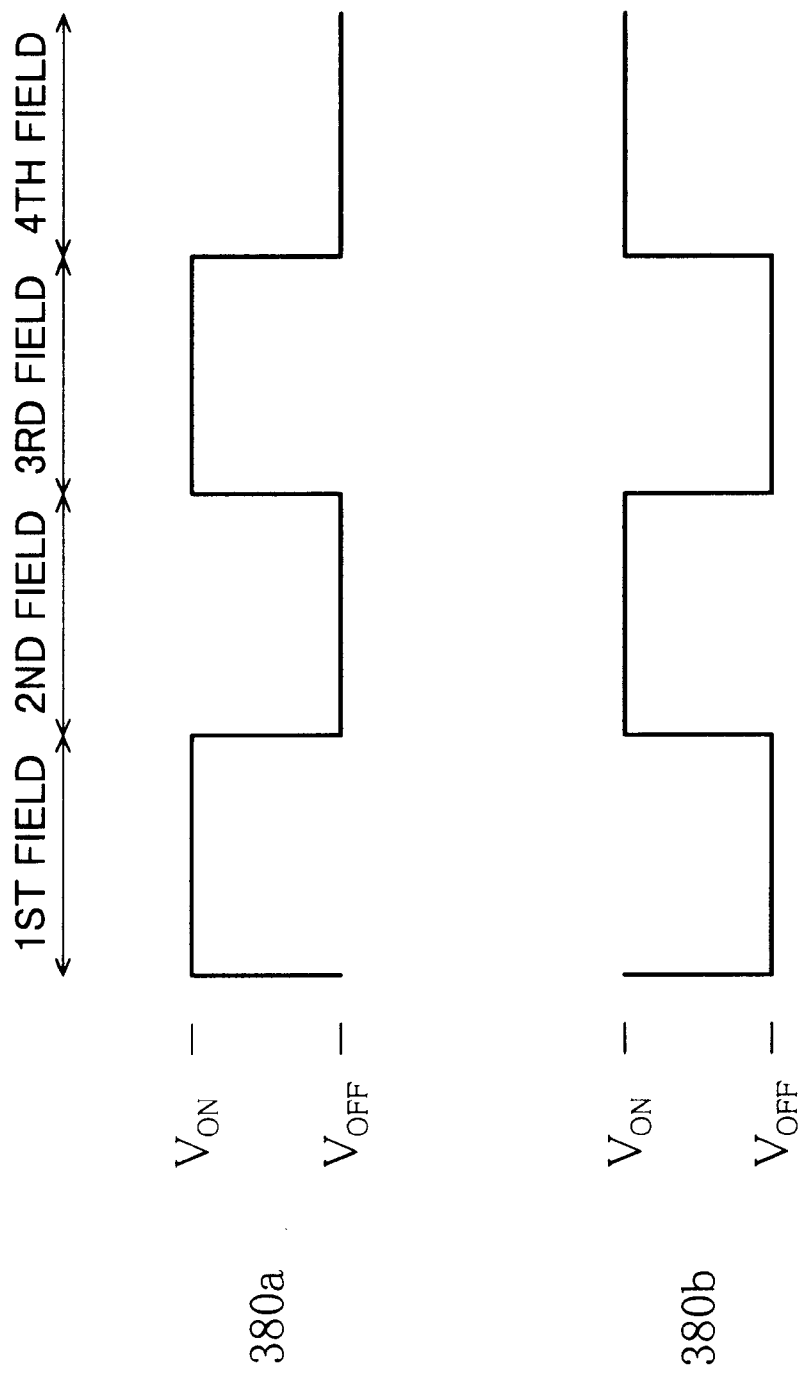
FIG. 22 is a graph showing pulse waveforms of an example of a control voltage for noise reduction in the sixth embodiment of an IT-CCD.

FIG. 22 shows an example of timing to apply the control voltages $V_{ON}$ and $V_{OFF}$.

From the V blanking of the first or third field to termination of the effective signal period, the control voltage $V_{ON}$ is applied to the pulse supply terminal 380a, and the control voltage $V_{OFF}$ is applied to the pulse supply terminal 380b. By this operation, noise signal charge transferred to each subordinate charge transfer stage including an odd-numbered subordinate transfer path forming section 356T relative to the left end of FIG. 21 is exhausted therefrom to a predetermined drain region 310 (noise reduction process).

From the V blanking of the second or fourth field to termination of the effective signal period, the control voltage $V_{OFF}$ is applied to the pulse supply terminal 380a, and the control voltages $V_{ON}$ is applied to the pulse supply terminal 380b. By this operation, noise signal charge transferred to each subordinate charge transfer stage including an even subordinate transfer path forming section 356T relative to the left end of FIG. 21 is exhausted therefrom to a predetermined drain region 310 (noise reduction process).

Figure 23:
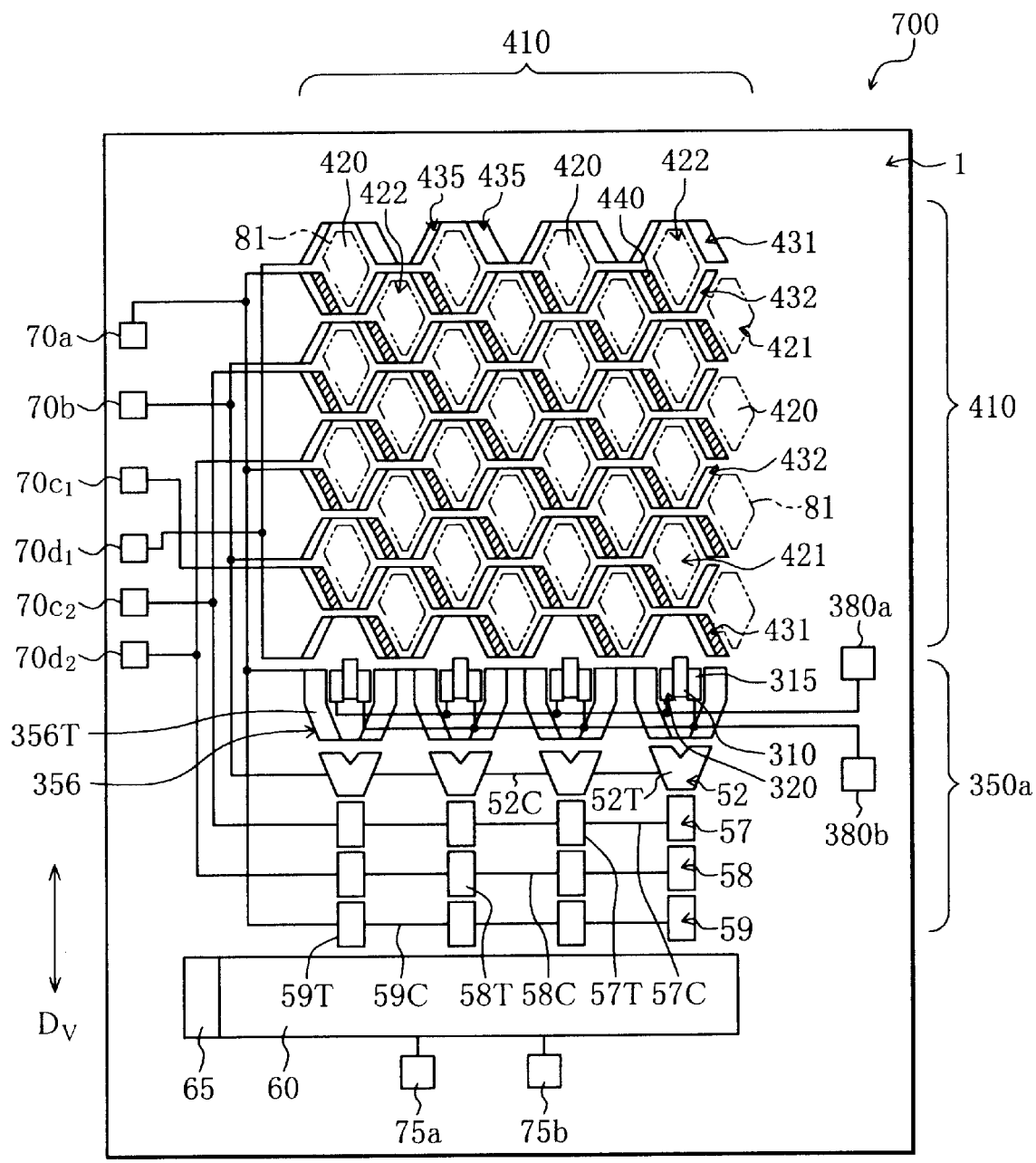
FIG. 23 is a plan view schematically showing a seventh embodiment of an IT-CCD.

Referring now to FIG. 23, description will be given of a seventh embodiment of an IT-CCD of the present invention.

FIG. 23 diagrammatically shows an IT-CCD 700 of the seventh embodiment in a plan view. The IT-CCD 700 is structurally equal to the IT-CCD 600 excepting (i) the number of pulse supply terminals to respectively supply predetermined driving pulses to the transfer electrodes 431 and 432, the joining channel transfer electrodes 52, and the second to fifth subordinate transfer electrodes 356, 57, 58, and 59 and (ii) specifications of wiring between the pulse supply terminals and the transfer electrodes of (i) above. In FIG. 23, the same constituent components as those of FIG. 21 are assigned with the same reference numerals and description thereof will be avoided.

As shown in FIG. 23, the IT-CCD 700 has six pulse supply terminals 70a, 70b, 70c$_1$, 70d$_1$, 70c$_2$, and 70d$_2$ to respectively supply predetermined driving pulses to the transfer electrodes 431 and 432, the joining channel transfer electrodes 52, and the second to fifth subordinate transfer electrodes 356, 57, 58, and 59.

The pulse supply terminals 70c$_1$ and 70c$_2$ are obtained by dividing the pulse supply terminal 70c shown in FIG. 21. The pulse supply terminals 70d$_1$ and 70d$_2$ are obtained by dividing the pulse supply terminal 70c shown in FIG. 21.

The IT-CCD 700, like the IT-CCD 100, has the joining channels 51. Therefore, for the same reason as for the IT-CCD 100, a high-pixel-density IT-CCD with, for example, two million pixels can be produced using ordinary fine patterning technique. The increase in the consumption power can be easily suppressed. Occurrence of difference in light collecting efficiency and sensitivity of pixels between two adjacent pixel rows can be easily prevented.

By disposing a light shielding film in the IT-CCD 700, it is possible to prevent unnecessary photoelectric conversion in the vertical transfer CCDs 35 and the output transfer path 60.

By disposing a microlens array, photoelectric conversion efficiency of the photoelectric converters 420 can be increased. The microlens array can be formed in a procedure, for example, similar to the forming procedure of the microlens array described for the IT-CCD 100 as the first embodiment.

By disposing a color filter array, an IT-CCD for color images can be obtained. The color filter array can be formed in a procedure, for example, similar to the forming procedure of the color filter array described for the IT-CCD 100 as the first embodiment.

The IT-CCD 700 can be operated by interlaced driving by dividing one frame into four fields. A vertical pulse signal Va is applied to the pulse supply terminal 70a and a vertical pulse signal Vb is applied to the pulse supply terminal 70b. A vertical pulse signal Vc is applied to the pulse supply terminals 70c$_1$ and 70c$_2$ and a vertical pulse signal Vd is applied to the pulse supply terminals 70d$_1$ and 70d$_2$. By this operation, as in the IT-CCD 600 of the sixth embodiment, one frame is divided into four fields, i.e., first to fourth fields.

A horizontal pulse signal Ha is applied to the pulse supply terminal 75a and a horizontal pulse signal Hb is applied to the pulse supply terminal 75b. When necessary, the control signals $V_{ON}$ and $V_{OFF}$ are applied to the pulse supply terminals 380a and 380b.

An image output signal of each field can be obtained through operation similar to that of the sixth embodiment. Image output signals of one frame can be obtained by conducting the operation for the first to fourth fields.

The IT-CCD 700 can be driven to thin out the number of pixel rows from which signal charge is to be read to a quarter of the total pixel rows. In the thin-out driving, a signal Va is applied to the pulse supply terminal 70a and a signal Vb is applied to the pulse supply terminal 70b. A signal Vc is applied to the pulse supply terminals 70c$_1$ and 70c$_2$ and a signal Vd is applied to the pulse supply terminals 70d$_1$ and 70d$_2$.

At an appropriate time during the V blanking determined by a blanking pulse, a low-level vertical pulse $V_L$ is applied to the pulse supply terminals 70a and 70b and a high-level vertical pulse $V_H$ is applied to the pulse supply terminals 70c$_1$, 70c$_2$, 70d$_1$ and 70d$_2$. While the vertical pulses $V_L$ and $V_H$ are being applied, a reading pulse $V_R$ is applied to the pulse supply terminal 70d$_1$. By the reading pulse $V_R$, signal charge accumulated in each photoelectric converter 420 of the eighth pixel row is read out to an associated vertical transfer CCD 435 (signal charge readout process). The signal charge is read out to the even vertical transfer CCDs 435 relative to the left end of FIG. 23.

The vertical pulse signals Va, Vb, Vc, and Vd of one period are applied to the pulse supply terminals 70a, 70b, $70c_1$, $70c_2$, $70d_1$ and $70d_2$. The signal charge read out to the vertical transfer CCDs 435 is transferred by one charge transfer stage toward the output transfer path 60.

A low-level vertical pulse $V_L$ is then applied to the pulse supply terminals 70a and 70b and a high-level vertical pulse $V_H$ is applied to the pulse supply terminals $70c_1$, $70c_2$, $70d_1$ and $70d_2$. While the vertical pulses $V_L$ and $V_H$ are being applied, a reading pulse $V_R$ is applied to the pulse supply terminal $70c_1$. By the reading pulse $V_R$, signal charge accumulated in each photoelectric converter 420 of the seventh pixel row is read out to an associated vertical transfer CCD 435 (signal charge readout process). The signal charge is read out to the odd vertical transfer CCDs 435 relative to the left end of FIG. 23.

The signal charge of the eighth pixel row read out to the even vertical transfer CCDs 435 is transferred to the output transfer path 60 during the first H blanking subsequent to the V blanking. The signal charge is sequentially outputted from the output unit 65 during the first horizontal effective signal period subsequent to the first H blanking (image signal output process).

The signal charge of the seventh pixel row read out to the odd vertical transfer CCDs 435 is transferred to the output transfer path 60 during the second H blanking subsequent to the first horizontal effective signal period. The signal charge is sequentially outputted from the output unit 65 during the second horizontal effective signal period subsequent to the second H blanking (image signal output process).

By processing the readout signal charge in a similar way as for the processing of signal charge by ordinary interlaced driving, quarter thin-out field image data can be obtained or frame image data thinned out to a quarter of the original data can be obtained.

The quarter thin-out operation can be conducted for any two pixel rows through a procedure similar to that of the thin-out operation above. The objective two pixel rows can be freely selected. According to the selected two pixel rows, specifications of wiring can be determined between the pulse supply terminals 70a, 70b, $70c_1$, $70c_2$, $70d_1$ and $70d_2$ and transfer electrodes 431, transfer electrodes 432, the second subordinate transfer electrode 356, the joining channel transfer electrode 52, and third to fifth subordinate transfer electrodes 57 to 59. When the IT-CCD 700 is modified to an IT-CCD to produce color images, the pixel rows are selected for the thin-out operation also in consideration of a layout pattern of each color filter in a color filter array disposed in the IT-CCD.

The thin-out operation is not used to read out signal charge from all pixels, but is employed to obtain image signals from the pixel rows thinned out to a quarter of all pixel rows in any situation. Since the IT-CCD 700 has only eight pixel rows, the quarter thin-out reading is completed by two horizontal readout operations. However, an actual IT-CCD has, for example, 600 pixel rows or more.

If the light sensing section of IT-CCD has a structure of n-stages in the direction $D_V$ each light sensing section has the same structure as that of the light sensing section 410 shown in FIG. 23, the thin-out operation is conducted from the first stage to the n-th stage to obtain quarter thin-out frame image date. The readout operation of signal charge from each photoelectric converter 420 of a desired pixel row to associated vertical transfers CCD 435 is simultaneously conducted in each stage. Signal charge read from each stage is sequentially transferred by the associated vertical transfer CCDs 435 to the output transfer path 60. The signal charge is transferred through the output transfer path 60 and is sequentially outputted from the output unit 65.

In the quarter thin-out operation, image signals can be obtained from two pixel rows during one field period. When the IT-CCD 700 is an IT-CCD to produce color images, all color signals necessary to produce a color image by the additive color matching or the subtractive process can be obtained during one field period. The memory required for the color signal processing may be a memory to store image output signals of one or two pixel rows. The field memory and the mechanical shutter can be therefore dispensed with.

Although high resolution is not obtained through the quarter thin-out operation, the image signals can be advantageously obtained at a frame (field) frequency four times that of an ordinary interlaced driving operation. The IT-CCD 700 is consequently an IT-CCD with a favorable configuration to obtain image signals with a high frame frequency.

A 1/2 thin-out operation, a 1/3 thin-out operation, . . . , and 1/n thin-out operation (n is a positive integer) can be conducted for a plurality of pixel rows through a procedure similar to that of the quarter thin-out operation. A desired thin-out operation can be freely selected for desired objective pixel rows.

When necessary, the control voltage $V_{ON}$ or $V_{OFF}$ is applied to the pulse supply terminal 380a or 380b.

Figure 24:
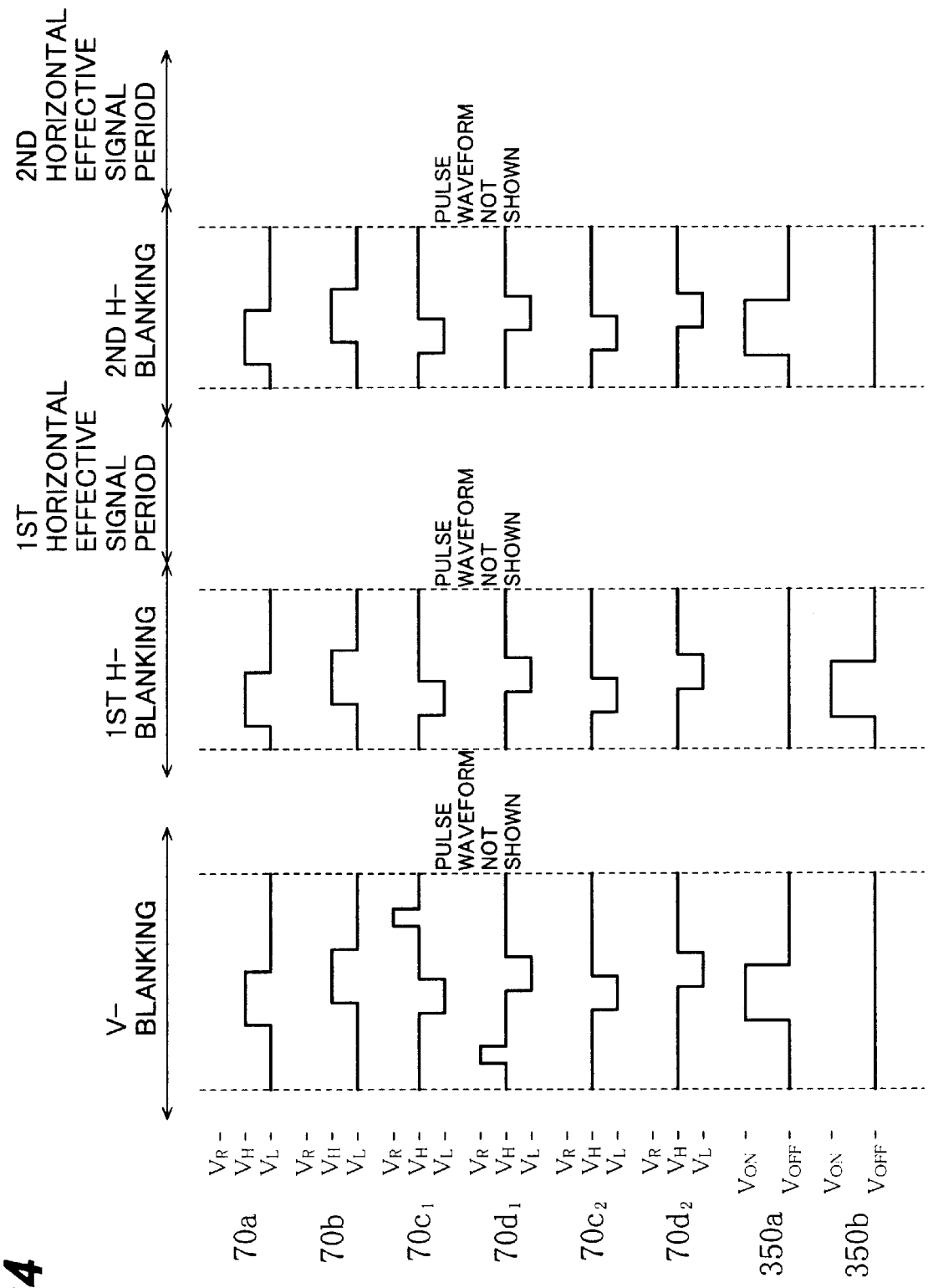
FIG. 24 is a graph showing waveforms of an example of a reading pulse for quarter thin-out drive of the seventh embodiment of an IT-CCD and waveforms of an example of a control voltage for noise reduction in the seventh embodiment of an IT-CCD.

FIG. 24 shows an example of the reading pulses and the control voltages $V_{ON}$ and $V_{OFF}$ for the quarter thin-out operation.

Signal charge and noise signal charge are alternately transferred to each subordinate charge transfer stage including a subordinate transfer path forming section 356T. When noise signal charge is transferred to each subordinate charge transfer stage including an odd subordinate transfer path forming section 356T relative to the left end of FIG. 23, the control voltage $V_{ON}$ is applied to the pulse supply terminal 380a and the control voltage $V_{OFF}$ is applied to the pulse supply terminal 380b. By the signals $V_{ON}$ and $V_{OFF}$, the noise signal charge is exhausted to the drain region 310 (noise reduction process).

This also applies to the case in which noise signal charge is transferred to each subordinate charge transfer stage including an even subordinate transfer path forming section 356T relative to the left end of FIG. 23.

Figure 25:
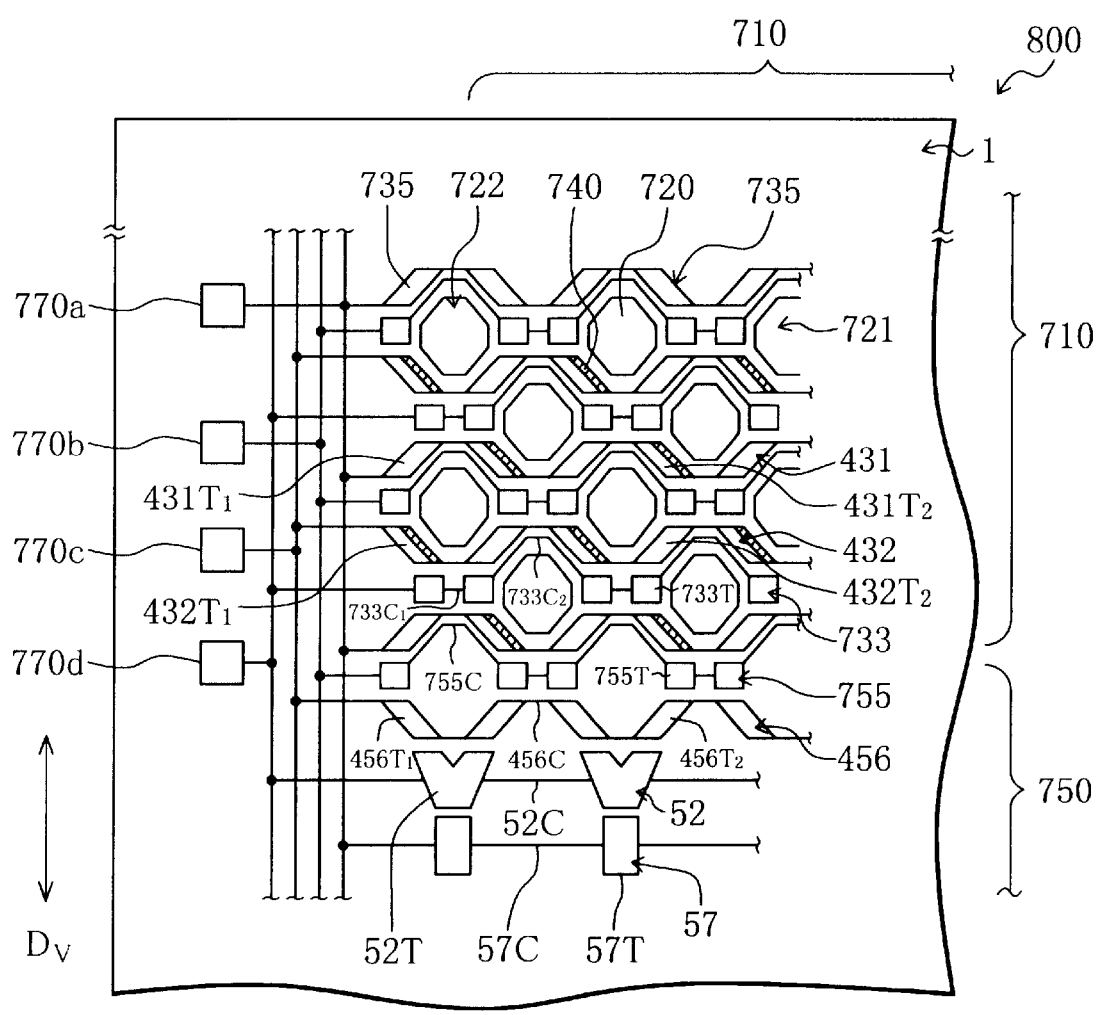
FIG. 25 is a partial plan view schematically showing part of a light sensing section and part of a confluence section in an eighth embodiment of an IT-CCD.

Referring now to FIG. 25, description will be given of an eighth embodiment of an IT-CCD of the present invention.

FIG. 25 diagrammatically shows part of a light sensing section 710 and part of a confluence section 750 of an IT-CCD 800 of the eighth embodiment in a plan view. The IT-CCD 700 is structurally equal to the IT-CCD 500 excepting (i) the contour of the photoelectric converter in a plan view, (ii) kinds and layout specifications of transfer electrodes formed on the light sensing section, (iii) the contour of the charge transfer channel, (iv) then umber of subordinate transfer electrodes formed between the light sensing section and the joining channel transfer electrode, (v) the number of pulse supply terminals to supply predetermined driving pulses to transfer electrodes formed on the light sensing section and subordinate transfer electrodes formed in the confluence section, and (vi) specifications of wiring between each of the pulse supply terminals and each transfer electrode formed on the light sensing section and each of the pulse supply terminals and between each subordinate transfer electrode formed in the confluence section.

In FIG. 25, the same constituent components as those of FIG. 16 or 17 are assigned with the same reference numerals and description thereof will be avoided.

As shown in FIG. 25, each photoelectric converter 720 formed in the light sensing section 710 has an octagonal contour in a plan view. 32 photoelectric converters 720 are arranged in eight rows and in eight columns in the pixel-shifted layout. FIG. 25 shows the pixels at positions (5,1), (5,3), (5,5), (6,2), (6,4), (7,1), (7,3), (7,5), (8,2), and (8,4) of the matrix and part of downstream sections of the pixels.

A predetermined number of three kinds of transfer electrodes 431, 432, and 733 are formed on the light sensing section 710. Each transfer electrode 431 and each transfer electrode 432 are disposed according to the same specification as for the transfer electrodes 431 and 432 of the IT-CCD 500 of the fifth embodiment excepting that two adjacent ones thereof are separated by a predetermined gap from each other.

Each transfer electrode 733 is disposed between two adjacent transfer electrodes 431 and 432 in a plan view. Each transfer electrode 733 has eight transfer path forming sections 733T each of which has a rectangular contour in a plan view. Each transfer path forming sections 733T of one transfer electrode 733 intersect an associated one of the charge transfer channels (not shown) in a plan view. The charge transfer channel intersects the transfer path forming section 733T in the column direction $D_V$. The intersection between the charge transfer channel and the transfer path forming section 733T serves as one charge transfer stage.

In one transfer electrode 733, two transfer path forming sections 733T adjacent to each other via one photoelectric converter 720 are linked with each other by a connecting section 733$C_1$ extending along a periphery of the photoelectric converter 720 in a plan view. In one transfer electrode 733, two transfer path forming sections 733T directly adjacent to each other, i.e. without any photoelectric converter 720 therebetween, are linked with each other by a connecting section 733$C_2$ having a linear contour.

An odd transfer path forming section 733T relative to the left end of FIG. 25, a transfer path forming section 431$T_1$ formed at a position immediately upstream the section 733T, and a transfer path forming section 432$T_1$ formed at a position immediately downstream the section 733T are in the overlapped transfer electrode structure.

An even transfer path forming section 733T relative to the left end of FIG. 25, a transfer path forming section 431$T_2$ formed at a position immediately upstream the section 733T, and a transfer path forming section 432$T_2$ formed at a position immediately downstream the section 733T are also in the overlapped transfer electrode structure.

The transfer path forming section 733T corresponds to a low-layer electrode and the transfer path forming sections 431$T_1$, 432$T_1$, 431$T_2$, and 432$T_2$ correspond to a high-layer electrode.

A first subordinate transfer electrode 755 having the same contour and the same size as the second transfer electrode 733 relative to a most downstream position of the light sensing section 710 is formed at a most upstream position of the confluence section 750. Each subordinate transfer path forming section 755T of the first subordinate transfer electrode 755 intersects an associated charge transfer channel (not shown) in a plan view. The charge transfer channel intersects the subordinate transfer path forming section 755T in the column direction $D_V$ in a plan view. The intersection between the subordinate transfer path forming section 755T and the charge transfer channel in a plan view serves as one subordinate charge transfer stage.

An odd subordinate transfer path forming section 755T relative to the left end of FIG. 25 and a transfer path forming section 431$T_1$ formed adjacent to and upstream the section 755T are in the overlapped transfer electrode structure. An even subordinate transfer path forming section 755T relative to the left end of FIG. 25 and a transfer path forming section 431$T_2$ formed adjacent to and upstream the section 755T are also in the overlapped transfer electrode structure. The subordinate transfer path forming section 755T corresponds to a low-layer electrode and the transfer path forming section 431$T_1$ and the transfer path forming section 431$T_2$ correspond to a high-layer electrode.

Structure downstream the first subordinate transfer electrode 755 in the confluence section 750 is similar to that of the confluence section 50a of the IT-CCD 500 of the fifth embodiment. The second subordinate transfer electrode 456, the joining channel transfer electrode 52, the third subordinate transfer electrode 57, the fourth subordinate transfer electrode (not shown), and the fifth subordinate transfer electrode (not shown) are formed in this order at downstream positions of the first subordinate transfer electrode 755.

The first subordinate transfer electrode 755, the joining channel transfer electrode 52, and the fourth subordinate transfer electrode correspond to a high-layer electrode in the overlapped transfer electrode structure.

In the light sensing section 710, the charge transfer stage consisting of the transfer path forming section 431$T_1$, the charge transfer stage consisting of the transfer path forming section 733T, and the charge transfer stage consisting of the transfer path forming section 432$T_2$ are repeatedly disposed in this order from an upstream side to a downstream side to form one vertical transfer CCD 735. The vertical transfer CCD 735 is an odd vertical transfer CCD 735 relative to the left end of FIG. 25.

Each odd vertical transfer CCD 735 extends from the light sensing section 710 for two subordinate charge transfer stages into the confluence section 750. The two subordinate charge transfer stages are the subordinate charge transfer stage consisting of an odd subordinate transfer path forming section 755T relative to the left end of FIG. 25 and the subordinate charge transfer stage consisting of a subordinate transfer path forming section 456$T_1$ on a downstream side of the subordinate charge transfer stage.

Similarly, the charge transfer stage consisting of the transfer path forming section 431$T_2$, the charge transfer stage consisting of the transfer path forming section 733T, and the charge transfer stage consisting of the transfer path forming section 432$T_2$ are sequentially and repeatedly disposed from an upstream side to a downstream side to form one vertical transfer CCD 735. The vertical transfer CCD 735 is an even vertical transfer CCD 735 relative to the left end of FIG. 25.

Each even vertical transfer CCD 735 also extends from the light sensing section 710 for two subordinate charge transfer stages into the confluence section 750. The two subordinate charge transfer stages are the subordinate charge transfer stage consisting of an even subordinate transfer path forming section 755T relative to the left end of FIG. 25 and the subordinate charge transfer stage consisting of a subordinate transfer path forming section 456$T_2$ on a downstream side of the subordinate charge transfer stage.

In the IT-CCD 800, one pixel is constituted with (a) one photoelectric converter 720, (b) four charge transfer stages formed adjacent to and on the left side (the left side of FIG. 25) of the photoelectric converter 720, namely, one charge transfer stage including the transfer path forming section 431$T_1$ or 431$T_2$, two charge transfer stages each of which including the transfer path forming section 733, and one charge transfer stage including the transfer path forming section 431$T_1$ or 431$T_2$, and (c) one readout gate 740 formed between the photoelectric converter 720 and the charge transfer stage including the transfer path forming section 431T$_2$ or 431T$_1$. The readout gate 740 is structurally equal to the readout gate 440 of the IT-CCD 500 of the fifth embodiment excepting that the contour of the gate 740 slightly differs from that of the gate 440.

Four pulse supply terminals 770a, 770b, 770c, and 770d are disposed outside the light sensing section 710.

The pulse supply terminal 770a is electrically connected to each transfer electrode 431 and the third subordinate transfer electrode 57. The pulse supply terminal 770b is electrically connected to each transfer electrode 733 at an odd position relative to the most upstream side of the light sensing section 710 and the first subordinate transfer electrode 755. The pulse supply terminal 770c is electrically connected to each transfer electrode 432, the second subordinate transfer electrode 456, and the fifth subordinate transfer electrode (not shown). The pulse supply terminal 770d is electrically connected to each transfer electrode 733 at an even position relative to the most upstream side of the light sensing section 710 and the joining channel transfer electrode 52.

Like the IT-CCD 100, the IT-CCD 800 has the joining channels 51. Consequently, for the same reason as for the IT-CCD 100, a high-pixel-density IT-CCD having, for example, two million pixels can be produced using ordinary fine patterning technique. The increase in the consumption power can be easily suppressed. Occurrence of difference in light collecting efficiency and sensitivity of pixels between two adjacent pixel rows can be easily prevented.

By disposing a light shielding film in the IT-CCD 800, it is possible to prevent unnecessary photoelectric conversion in the vertical transfer CCDs 735 and the output transfer path.

By disposing a microlens array, photoelectric conversion efficiency of the photoelectric converters 720 can be increased. The microlens array can be formed in a procedure similar to, for example, the forming procedure of the microlens array described for the IT-CCD 100 as the first embodiment.

By disposing a color filter array, an IT-CCD for color images can be obtained. The color filter array can be formed in a procedure similar to, for example, the forming procedure of the color filter array described for the IT-CCD 100 as the first embodiment.

The IT-CCD 800 is an IT-CCD for which the interlaced driving is possible. For the interlaced driving of the IT-CCD 800, predetermined vertical pulses are respectively applied to the pulse supply terminals 770a, 770b, 770c and 770d. The horizontal pulse signal Ha is applied to the pulse supply terminal 75a not shown (FIG. 16) and the horizontal pulse signal Hb is supplied to the pulse supply terminal 75b not shown (FIG. 16).

Figure 26:
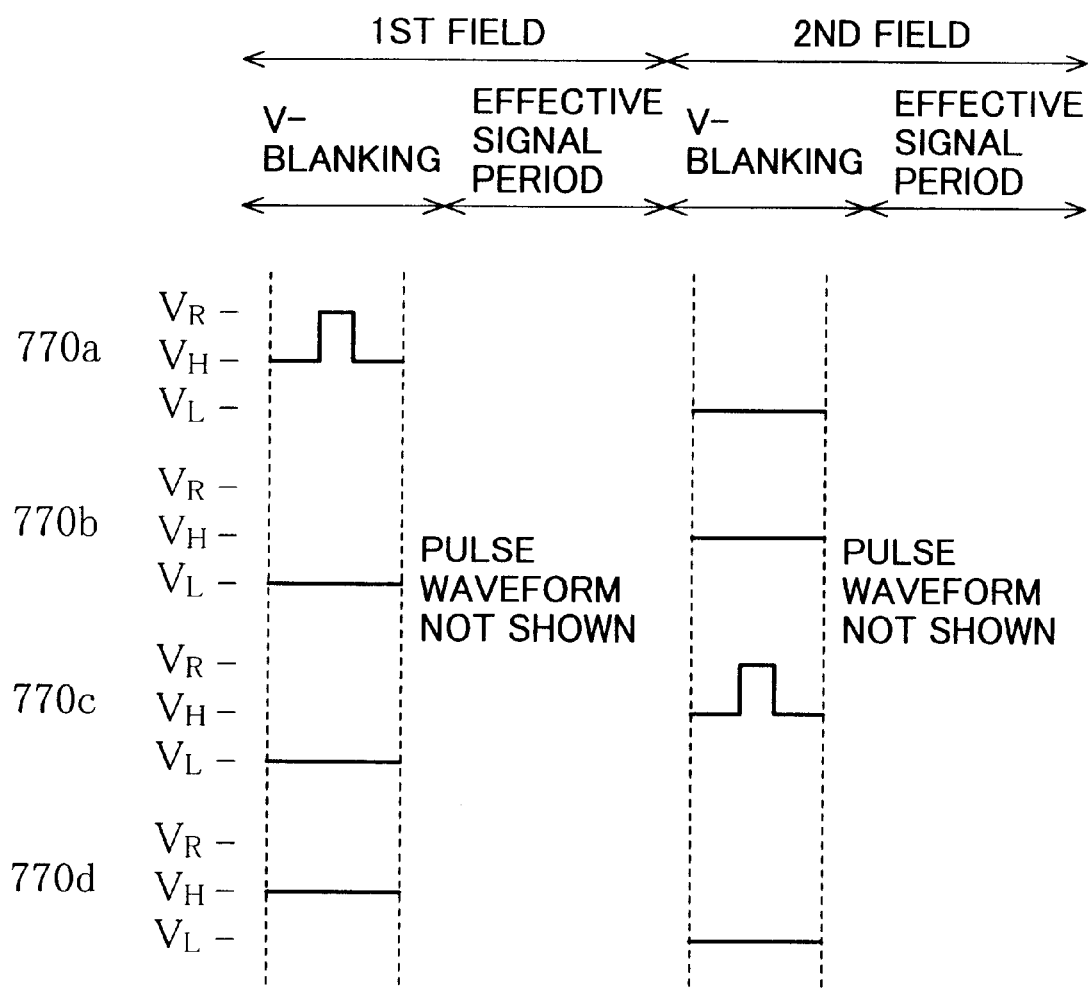
FIG. 26 is a graph showing pulse waveforms of an example of a reading pulse to conduct progressive scanning of the eighth embodiment of an IT-CCD.

FIG. 26 shows an example of reading pulses for an interlaced driving in which one frame is divided into two fields.
(i) First field including each pixel of even rows.
(ii) Second field including each pixel of odd rows.

The driving pulse supply unit for the interlaced driving of the IT-CCD 800 is configured in the same way as for the driving pulse supply unit 110 for the interlaced driving of the IT-CCD 100 (FIG. 7).

At an appropriate point of time during a first V blanking determined by a blanking pulse, a low-level vertical pulse $V_L$ is applied to the pulse supply terminals 770b and 770c and a high-level vertical pulse $V_H$ is applied to the pulse supply terminals 770a and 770d. While the vertical pulses $V_L$ and $V_H$ are being applied thereto, a reading pulse $V_R$ of a higher level is applied to the pulse supply terminal 770a.

By the reading pulse $V_R$, signal charge accumulated in each photoelectric converter 720 of the first field is read out to a vertical transfer CCD 735 associated therewith (signal charge readout process).

The signal charge read from each photoelectric converter 20 of the eighth pixel row is transferred to the output transfer path during a first H blanking subsequent to the first V blanking. The signal charge is sequentially outputted from the output unit during a first horizontal effective signal period following the first H blanking (image signal output process).

Signal processing is thereafter similarly executed in a sequential way. The image signal output process is executed for the signal charge read from each photoelectric converter 720 of the sixth pixel row, for the signal charge read from each photoelectric converter 720 of the fourth pixel row, and for the signal charge read from each photoelectric converter 720 of the second pixel row.

To entirely output the signal charge accumulated in each photoelectric converter 720 of one field from the output unit, four image signal output processes are required. A period of time necessary to conduct the four image signal output processes will be referred to as "effective signal period" herebelow.

After the effective signal period of the first field is completed, at an appropriate point of time during a second V blanking determined by a blanking pulse, a low-level vertical pulse $V_L$ is applied to the pulse supply terminals 770a and 770d and a high-level vertical pulse $V_H$ is applied to the pulse supply terminals 770b and 770c. While the vertical pulses $V_L$ and $V_H$ are being applied thereto, a reading pulse $V_R$ is applied to the pulse supply terminals 770c.

By the reading pulse $V_R$, signal charge accumulated in each photoelectric converter 720 of the second field is read out to a vertical transfer CCD 735 associated therewith (signal charge readout process).

The signal charge read from each photoelectric converter 720 of the seventh pixel row is transferred to the output transfer path during the first H blanking subsequent to the second V blanking. The signal charge is sequentially outputted from the output unit during the first horizontal effective signal period subsequent to the first H blanking (image signal output process).

Similarly, the image signal output process is sequentially executed for the signal charge read from each photoelectric converter 720 of the fifth pixel row, for the signal charge read from each photoelectric converter 720 of the third pixel row, and for the signal charge read from each photoelectric converter 720 of the first pixel row.

By repeating the operation executed from the first V blanking to the effective signal period of the second field, an image output signal of each field is sequentially outputted from the output unit.

Frame image signals can be obtained through an operation similar to the operation to obtain the frame image signals in the IT-CCD 100 of the first embodiment.

Description has been given of the embodiments of the IT-CCD according to the present invention. However, the present invention is not restricted by the embodiments. It will be obvious for those skilled in the art that various changes, modifications, and combinations of the embodiments are possible.

For example, in the IT-CCDs of the embodiments, photoelectric converters (photodiodes), vertical transfer CCDs, an output transfer path, etc. are formed in an n-type semiconductor substrate including p-type wells.

Such an IT-CCD can be obtained also by forming photoelectric converters (photodiodes), vertical transfer CCDs, an output transfer path, etc. in a p-type semiconductor substrate.

The IT-CCD can also be obtained by forming photoelectric converters (photodiodes), vertical transfer CCDs, an output transfer path, etc. in a desired semiconductor layer formed on a surface of a sapphire substrate or the like. In this specification, "a semiconductor substrate" includes also an item obtained by disposing a semiconductor layer on a surface of a substrate made of a material other than semiconductor to form photoelectric converters (photodiodes), vertical transfer CCDs, an output transfer path, etc.

The contour of the photoelectric converter in a plan view may be a rectangle (including a rhombus), a polygon with five or more edges in which each internal angle is an obtuse angle, a polygon with fine or more edges in which acute and obtuse inner angles are present, shapes obtained by rounding corners of the contours above.

The photoelectric converters may be or need not be disposed in the shifted-pixel layout. The contour of the charge transfer channel of the vertical transfer CCD in a plan view can be appropriately selected according to the layout of the photoelectric converters.

When the shifted-pixel layout is employed, each transfer electrode of the vertical transfer CCD favorably has a contour in which the connecting section is linked with the transfer path forming section with an obtuse angle therebetween or the connecting section is smoothly linked with the transfer path forming section.

The method of driving the vertical transfer CCD is not limited to those described in conjunction with the embodiments. Depending on uses of an IT-CCD in consideration, the IT-CCD can be driven using, for example, three or more phases. In association therewith, the number of pulse supply terminals to supply predetermined driving pulses to each transfer electrode and specification of wiring between the pulse supply terminals and the transfer electrodes can also be changed according to the vertical transfer CCD driving method of the IT-CCD. This is also the case with the output transfer path.

In the embodiments, to prevent simultaneous transfer of signal charge from two vertical transfer CCDs to one joining charge transfer stage, associated readout gates are disposed. Basically, the position of the readout gate for each photoelectric converter need only vary between the odd photoelectric converter columns and the even photoelectric converter columns.

Therefore, when three charge transfer stages are formed for each photoelectric converter, the readout gate may be disposed at a position other than those shown in the embodiments. For example, for a photoelectric converter in an odd column, the readout gate may be formed contiguous to the charge transfer stage at the most upstream position among three charge transfer stages. For a photoelectric converter in an even column, the readout gate may be formed contiguous to the charge transfer stage at a middle position among three charge transfer stages.

However, regardless of the number of charge transfer stages for each photoelectric converter, the readout gate is desirably disposed at the same position respectively for all even columns and for all odd columns.

The subordinate charge transfer stage may be omitted at an upstream position of the joining charge transfer stage. The vertical transfer CCD may be connected to the joining charge transfer stage immediately after the light sensing section.

Similarly, the subordinate charge transfer stage may be omitted at a downstream position of the joining charge transfer stage. The joining charge transfer stage may be immediately connected to the output transfer path.

In the IT-CCD of each embodiment, the photoelectric converter photodiode) is formed in a p-type well formed in an n-type semiconductor substrate. A vertical-type overflow drain structure may be therefore additionally disposed in the IT-CCD. In association with the overflow drain, an electronic shutter may be disposed. To dispose the vertical-type overflow drain structure in the IT-CCD, there is additionally disposed structure to apply a reverse bias to the p-type well and a lower section of the n-type semiconductor substrate (a region below the p-type well). Horizontal-type overflow drain structure may be additionally disposed in place of the vertical-type overflow drain structure. By disposing the horizontal-type or vertical-type overflow drain structure, blooming can be easily suppressed.

The IT-CCD driving method can be appropriately selected. In relation to the selection, structure of the driving pulse supply unit to supply predetermined driving pulses respectively to the vertical transfer CCDs (transfer electrodes of the CCDs) and the output transfer path (transfer electrodes of the output transfer path) can also be appropriately selected.

In the IT-CCD of the present invention, even when the pixel density is increased, the width of each transfer electrode in the output transfer path (horizontal transfer CCD) can be relatively increased.

According to the present invention, a high-pixel-density IT-CCD with low consumption power can be provided at a low cost.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. A solid-state image pickup device, comprising:
a semiconductor substrate;
a light sensing section defined on a surface of said semiconductor substrate;
a large number of photoelectric converter elements formed in said light sensing section in a plurality of rows and in a plurality of columns;
a charge transfer channel formed for each said photoelectric converter element column adjacent thereto on the surface of said semiconductor substrate, said charge transfer channel intersecting said light sensing section in a predetermined direction in a plan view;
a plurality of transfer electrodes formed on said light sensing section, each said transfer electrode including a plurality of transfer path forming sections equal in number to said charge transfer channels, each said transfer path forming section intersecting an associated one of said charge transfer channels in a plan view, each intersection thereof constituting one charge transfer stage together with said associated charge transfer channel;
a plurality of joining channels, each said joining channel being formed in the surface of said semiconductor substrate for each set of a plurality of said charge transfer channels, each said joining channel combining the set of said charge transfer channels with each other in a region outside said light sensing section; and a joining channel transfer electrode formed on the surface of said semiconductor substrate in the region outside said light sensing section, said joining channel transfer electrode intersecting each said joining channel in a plan view, each said intersection thereof constituting one joining charge transfer stage together with said each joining channel.

2. A solid-state image pickup device according to claim 1, wherein:

each said photoelectric converter element column includes a plurality of photoelectric converter elements;

each said photoelectric converter element row includes a plurality of photoelectric converter elements;

each said photoelectric converter element of an even column being shifted in a column direction by about a half of the pitch between adjacent photoelectric converter elements in each photoelectric converter element column, from a plurality of photoelectric converter elements of an odd column, and each said photoelectric converter elements of an even row being shifted in a row direction by about a half of the pitch between adjacent photoelectric converter elements in each photoelectric converter element row, from a plurality of photoelectric converter elements of an odd row.

3. A solid-state image pickup device according to claim 2, wherein four said charge transfer stages are formed for each said photoelectric converter element.

4. A solid-state image pickup device according to claim 3, further including a plurality of readout gates for controlling operation to read signal charge from said photoelectric converter elements, wherein:

each said readout gate includes, for each said photoelectric converter element in the odd photoelectric converter element columns, a readout gate region and a readout gate electrode disposed on said readout gate region, said readout gate region being formed in the surface of said semiconductor substrate contiguous to one of said four charge transfer stages associated with said photoelectric converter element; and each said readout gate includes, for each said photoelectric converter element in the even photoelectric converter element columns, a readout gate region and a readout gate electrode disposed on said readout gate region, said readout gate region being formed in the surface of said semiconductor substrate contiguous to one of said four charge transfer stages, said one charge transfer stage being shifted upstream or downstream by one said charge transfer stage or two said charge transfer stages relative to said readout gate for said photoelectric converter element in the odd photoelectric converter element column.

5. A solid-state image pickup device according to claim 1, wherein two said charge transfer stages are formed for each said photoelectric converter element.

6. A solid-state image pickup device according to claim 5, further comprising a plurality of readout gates for controlling operation to read signal charge from said photoelectric converter elements, wherein:

each said readout gate includes, for each said photoelectric converter element in the odd photoelectric converter element columns, a readout gate region and a readout gate electrode disposed on said readout gate region, said readout gate region being formed in the surface of said semiconductor substrate contiguous to one of said two charge transfer stages associated with said photoelectric converter element; and each said readout gate includes, for each said photoelectric converter element in the even photoelectric converter element columns, a readout gate region and a readout gate electrode disposed on said readout gate region, said readout gate region being formed in the surface of said semiconductor substrate contiguous to one of said charge transfer stages, said one charge transfer stage being shifted upstream or downstream by one said charge transfer stage relative to said readout gate for said photoelectric converter element in the odd photoelectric converter element column.

7. A solid-state image pickup device according to claim 1, wherein three said charge transfer stages are formed for each said photoelectric converter element.

8. A solid-state image pickup device according to claim 7, further including a plurality of readout gates for controlling operation to read signal charge from said photoelectric converter elements, wherein:

each said readout gate includes, for each said photoelectric converter element in the odd photoelectric converter element columns, a readout gate region and a readout gate electrode disposed on said readout gate region, said readout gate region being formed in the surface of said semiconductor substrate contiguous to one of said three charge transfer stages associated with said photoelectric converter element; and each said readout gate includes, for each said photoelectric converter element in the even photoelectric converter element columns, a readout gate region and a readout gate electrode disposed on said readout gate region, said readout gate region being formed in the surface of said semiconductor substrate contiguous to one of said charge transfer stages, said one charge transfer stage being shifted upstream or downstream by one said charge transfer stage or two said charge transfer stages relative to said readout gate for said photoelectric converter element in the odd photoelectric converter element column.

9. A solid-state image pickup device according to claim 8, wherein:

each said readout gate includes, for each said photoelectric converter element in the odd photoelectric converter element columns, a readout gate region and a readout gate electrode disposed on said readout gate region, said readout gate region being formed in the surface of said semiconductor substrate contiguous to one of said three charge transfer stages associated with said each photoelectric converter element, said one charge transfer stage being at a most upstream or downstream position among said three charge transfer stages; and each said readout gate includes, for each said photoelectric converter element in the even photoelectric converter element columns, a readout gate region and a readout gate electrode disposed on said readout gate region, said readout gate region being formed in the surface of said semiconductor substrate contiguous to one of said three charge transfer stages associated with said each photoelectric converter element, said one charge transfer stage being at a most downstream or upstream position among said three charge transfer stages.

10. A solid-state image pickup device according to claim 1, further comprising an output transfer path being composed of a two-phase drive CCD of two-layer or three-layer electrode structure, wherein said output transfer path receives, via said joining charge transfer stages, signal charge accumulated in said photoelectric converter elements through photoelectric conversion conducted by each said photoelectric converter element, and transfers the signal charge in a predetermined direction.

11. A solid-state image pickup device according to claim 1, further including:
   a subordinate transfer electrode formed between one of said transfer electrodes at a most downstream position and said joining channel transfer electrode;
   said subordinate transfer electrode including a plurality of subordinate transfer path forming sections intersecting said charge transfer channels in a plan view, each intersection thereof constituting one subordinate charge transfer stage together with said charge transfer channel;
   one drain region or two drain regions formed in the surface of said semiconductor substrate for each set of two said subordinate charge transfer stages adjacent thereto; and
   an exhaust gate provided for each said subordinate charge transfer stage and adjacent to said subordinate transfer path forming section of said subordinate charge transfer stage, said exhaust gate including one said drain region and an exhaust gate electrode covering a gap between the drain region and the subordinate transfer path forming section adjacent to the drain region in a plan view.

12. A driving method of a solid-state image pickup device comprising: a semiconductor substrate; a light sensing section defined on a surface of said semiconductor substrate; a large number of photoelectric converter elements formed in said light sensing section in a plurality of rows and in a plurality of columns; a charge transfer channel formed for each said photoelectric converter element column adjacent thereto on the surface of said semiconductor substrate, said charge transfer channel intersecting said light sensing section in a predetermined direction in a plan view; a plurality of transfer electrodes formed on said light sensing section, each said transfer electrode including a plurality of transfer path forming sections equal in number to said charge transfer channels, each said transfer path forming section intersecting an associated one of said charge transfer channels in a plan view, each intersection thereof constituting one charge transfer stage together with said associated charge transfer channel; a plurality of joining channels, each said joining channel being formed in the surface of said semiconductor substrate for each set of a plurality of said charge transfer channels, each said joining channel combining the set of said charge transfer channels with each other in a region outside said light sensing section; and a joining channel transfer electrode formed on the surface of said semiconductor substrate in the region outside said light sensing section, said joining channel transfer electrode intersecting each said joining channel in a plan view, each said intersection thereof constituting one joining charge transfer stage together with said each joining channel, the driving method comprising the steps of:
   a signal charge readout step of reading out, during one vertical blanking period, signal charge accumulated in each photoelectric converter element constituting a predetermined photoelectric converter element row or column, via said readout gate contiguous to said photoelectric converter element and feeding the signal charge to said charge transfer channel contiguous to said readout gate; and
   an image signal output step of converting, during a period from said one vertical blanking period to a one vertical blanking period subsequent thereto, each said signal charge read out to said charge transfer channel into an image signal and outputting the image signal.

13. A driving method of a solid-state image pickup device comprising: a semiconductor substrate; a light sensing section defined on a surface of said semiconductor substrate; a large number of photoelectric converter elements formed in said light sensing section in a plurality of rows and in a plurality of columns; a charge transfer channel formed for each said photoelectric converter element column adjacent thereto on the surface of said semiconductor substrate, said charge transfer channel intersecting said light sensing section in a predetermined direction in a plan view; a plurality of transfer electrodes formed on said light sensing section, each said transfer electrode including a plurality of transfer path forming sections equal in number to said charge transfer channels, each said transfer path forming section intersecting an associated one of said charge transfer channels in a plan view, each intersection thereof constituting one charge transfer stage together with said associated charge transfer channel; a plurality of joining channels, each said joining channel being formed in the surface of said semiconductor substrate for each set of a plurality of said charge transfer channels, each said joining channel combining the set of said charge transfer channels with each other in a region outside said light sensing section; a joining channel transfer electrode formed on the surface of said semiconductor substrate in the region outside said light sensing section, said joining channel transfer electrode intersecting each said joining channel in a plan view, each said intersection thereof constituting one joining charge transfer stage together with said each joining channel; a subordinate transfer electrode formed between one of said transfer electrodes at a most downstream position and said joining channel transfer electrode, said subordinate transfer electrode including a plurality of subordinate transfer path forming sections intersecting said charge transfer channels in a plan view, each intersection thereof constituting one subordinate charge transfer stage together with said charge transfer channel; one drain region or two drain regions formed in the surface of said semiconductor substrate for each set of two said subordinate charge transfer stages adjacent thereto; and an exhaust gate provided for each said subordinate charge transfer stage and adjacent to said subordinate transfer path forming section of said subordinate charge transfer stage, said exhaust gate including one said drain region and an exhaust gate electrode covering a gap between the drain region and the subordinate transfer path forming section adjacent to the drain region in a plan view, the driving method comprising the steps of:
   a signal charge readout step of reading out, during one vertical blanking period, signal charge accumulated in each photoelectric converter element constituting a predetermined photoelectric converter element row or column, via said readout gate contiguous to said photoelectric converter element and feeding the signal charge to said charge transfer channel contiguous to said readout gate; and
   an image signal output step of converting, during a period from said one vertical blanking period to a one vertical blanking period subsequent thereto, each said signal charge read out to said charge transfer channel into an image signal and outputting the image signal; wherein
   the image signal output step further includes a noise reduction sub-step of opening said exhaust gate adjacent to said subordinate charge transfer stage during noise signal charge is transferred through said charge transfer channel associated therewith and closing said exhaust gate adjacent to said subordinate charge transfer stage during signal charge is transferred through said charge transfer channel associated therewith.

* * * * *